United States Patent [19]

Komura et al.

[11] 4,341,947

[45] Jul. 27, 1982

[54] GLOW DISCHARGE HEATING APPARATUS

[75] Inventors: Hirotsugu Komura; Shigeo Ueguri; Youichiro Tabata, all of Hyogo, Japan

[73] Assignee: Mitsubishi Denki Kabushiki Kaisha, Japan

[21] Appl. No.: 152,507

[22] Filed: May 22, 1980

Related U.S. Application Data

[62] Division of Ser. No. 6,780, Jan. 26, 1979.

[30] Foreign Application Priority Data

Feb. 7, 1978 [JP] Japan .................................. 53-13090

[51] Int. Cl.³ .......................... B23K 9/32; H05B 7/18
[52] U.S. Cl. ............................ 219/383; 219/121 PR; 219/121 PN; 219/121 P; 219/292; 313/32; 313/46; 313/210; 315/111.21; 174/15 BH; 422/186.18; 422/186.19
[58] Field of Search ...... 219/121 P, 121 PR, 121 PN, 219/291, 292, 383, 290; 250/530, 531, 540, 541; 313/30, 32, 46, 231.4, 210; 315/111.1, 111.2; 174/15 R, 15 BH

[56] References Cited

U.S. PATENT DOCUMENTS

| | | | |
|---|---|---|---|
| 2,101,143 | 12/1937 | Laidig | 313/32 X |
| 2,103,362 | 12/1937 | Hansell | 313/32 X |
| 3,412,274 | 11/1968 | Wolf | 313/32 |
| 3,521,703 | 7/1970 | Koziara | 174/15 R |
| 4,179,582 | 12/1979 | Garcia | 174/15 BH |
| 4,234,800 | 11/1980 | Kenly, V et al. | 250/540 |

FOREIGN PATENT DOCUMENTS

| | | | |
|---|---|---|---|
| 50-17230 | 7/1975 | Japan | 219/121 P |
| 52-97443 | 8/1977 | Japan | 219/121 P |

*Primary Examiner*—B. A. Reynolds
*Assistant Examiner*—M. H. Paschall
*Attorney, Agent, or Firm*—Robert E. Burns; Emmanuel J. Lobato; Bruce L. Adams

[57] ABSTRACT

Typically, a bottom of a cup-shaped electrode opposes to that of a similar electrode through a predetermined gap and in a mixture of helium and hydrogen. A step-up transformer connected across an AC source through a resistor applies a voltage in excess of a discharge breakdown voltage for the gap across the electrodes to cause a pilot glow discharge between them before the source voltage reaches a glow hold minimum voltage for the electrodes. A rectified voltage resulting from a transformer connected across the resistor turns a bidirectional triode thyristor on to apply the source voltage across the electrodes through the conducting thyristor. This smoothly transits the pilot glow discharge to a glow discharge between the electrodes. The latter discharge heats a liquid forcedly flowing along inner surfaces of the electrodes. Also an auxiliary electrode can be operatively coupled to the electrodes to cause similarly a pilot glow discharge between it and either one of the electrodes. For a DC source a tubular anode surrounds a middle portion of a tubular cathode though which a liquid flows.

15 Claims, 86 Drawing Figures

$$\frac{\text{ACTUAL DISCHARGE CURRENT}}{\text{RATED DISCHARGE CURRENT}} \times 100 \text{ IN \%}$$

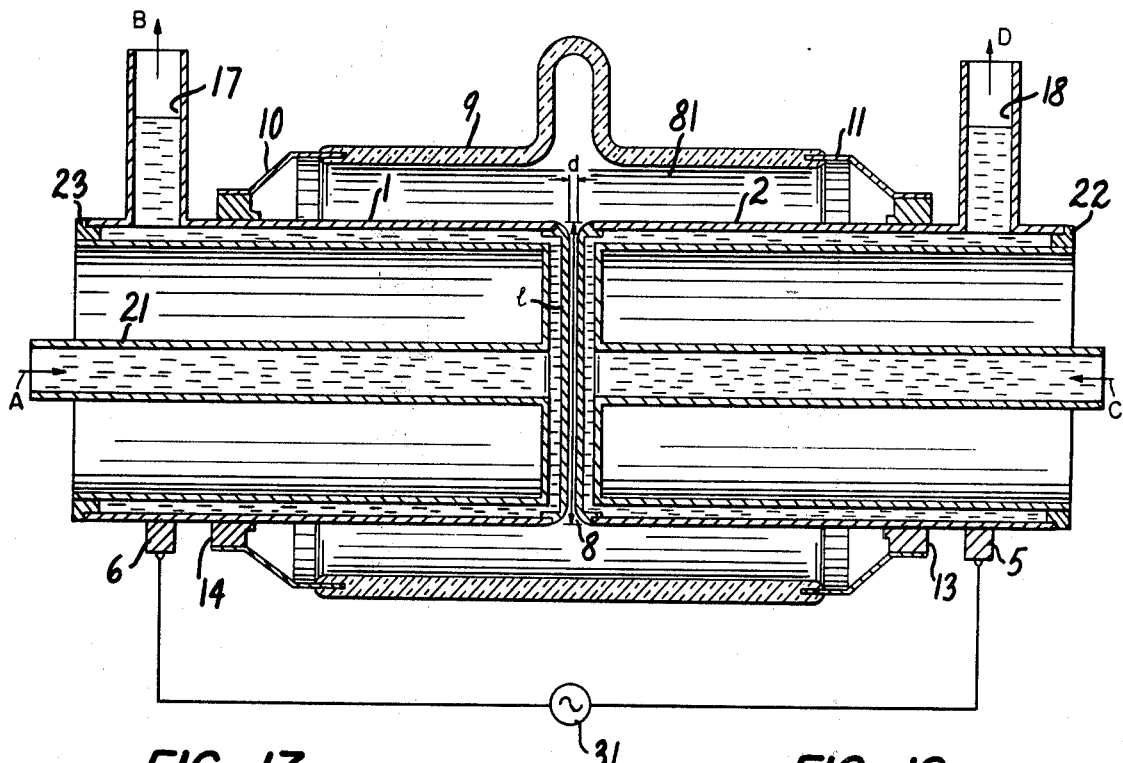
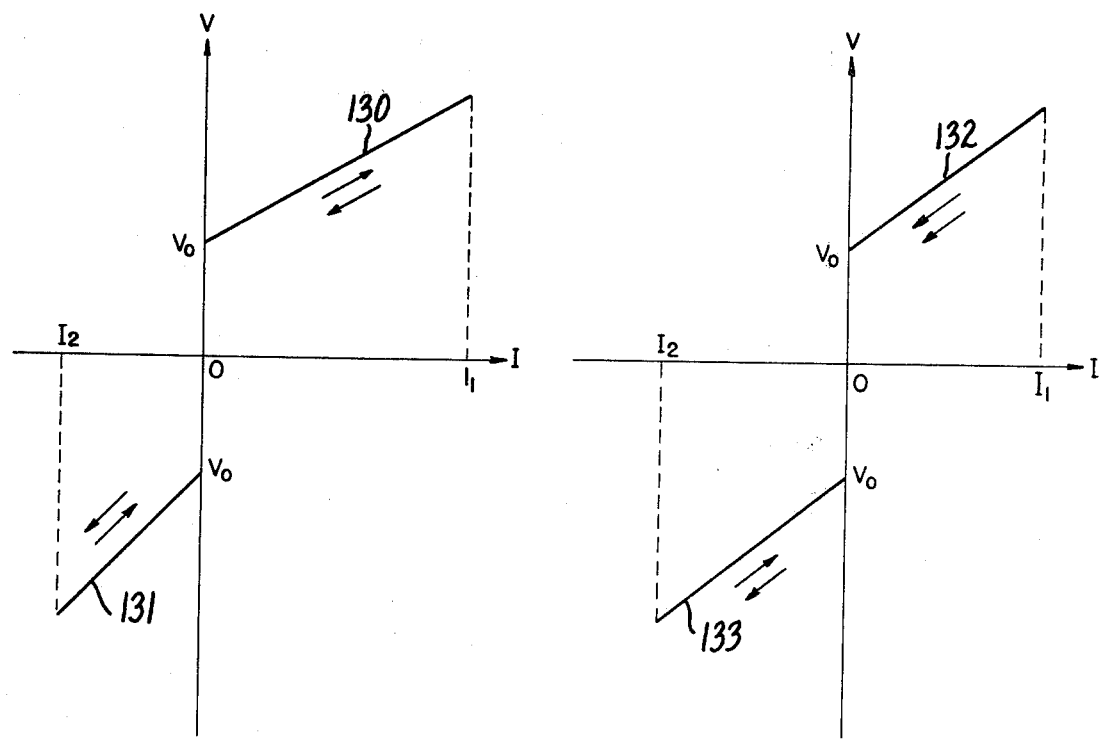

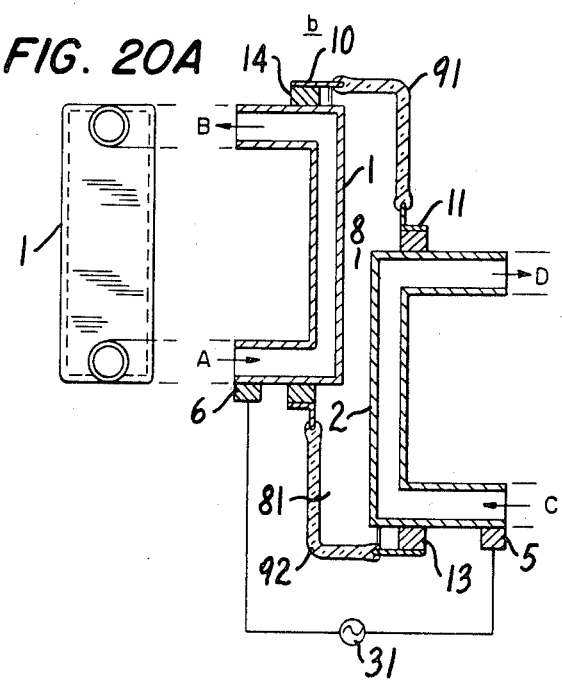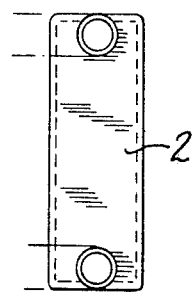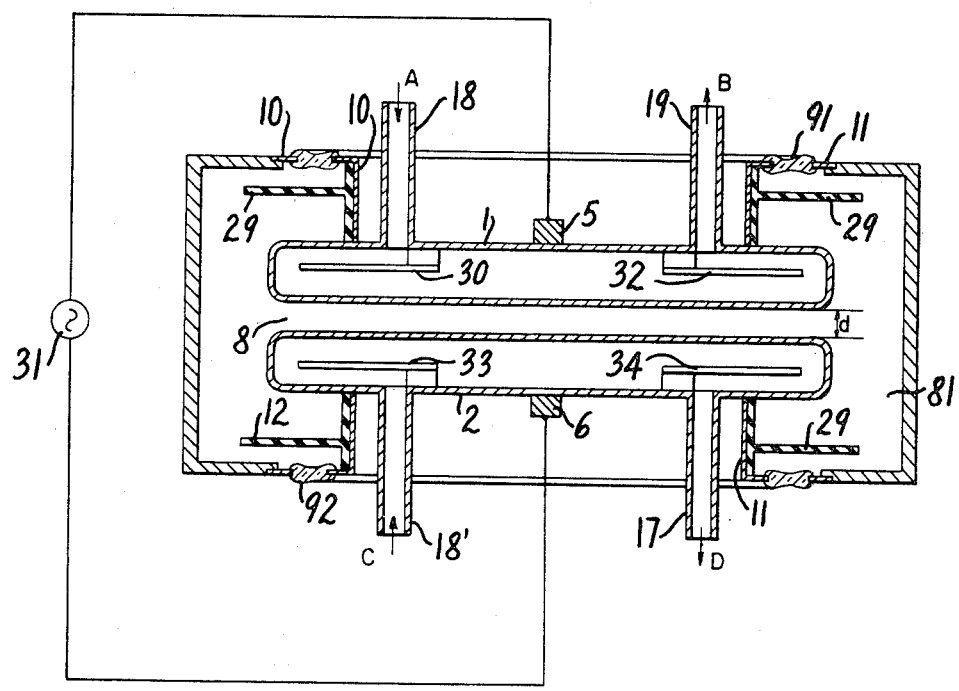

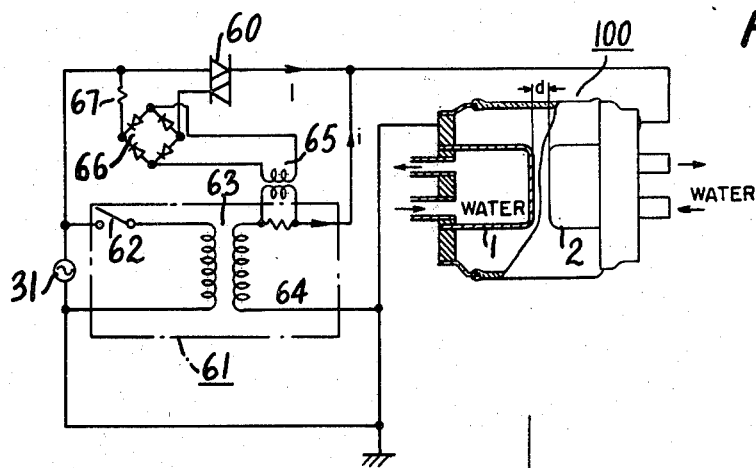
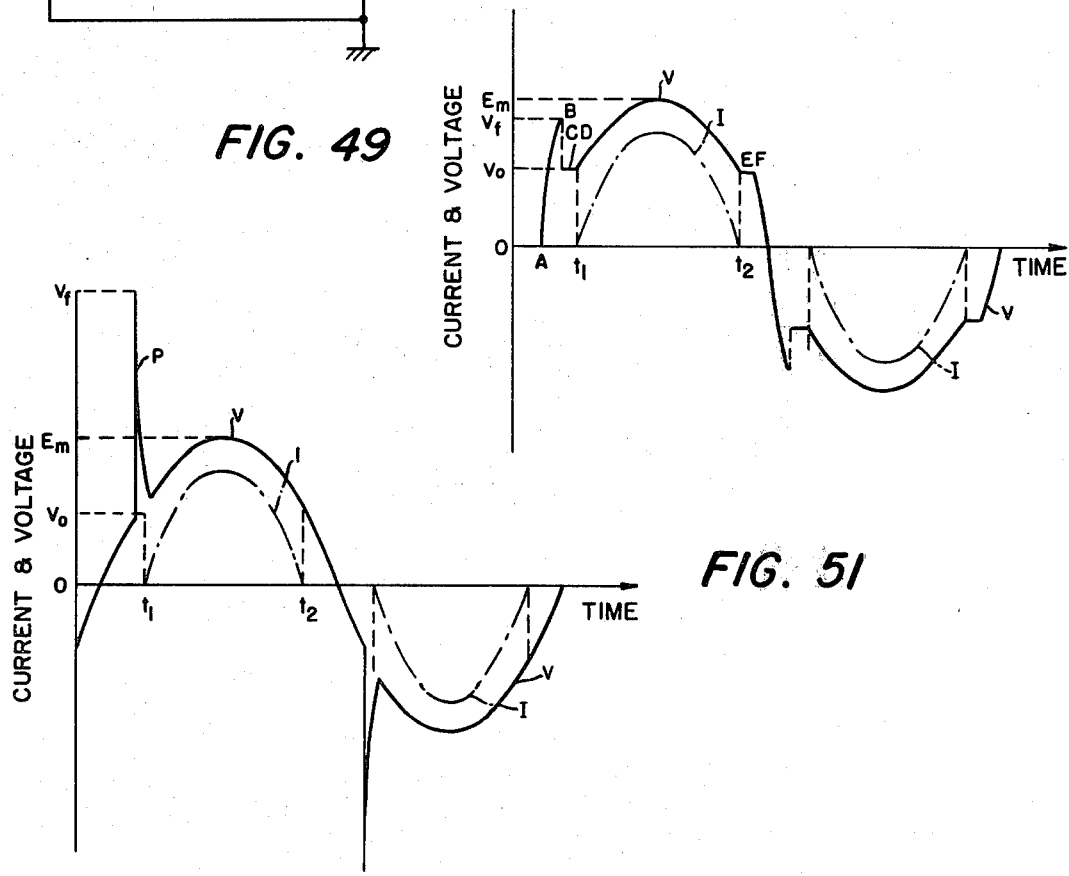
FIG. 48
FIG. 49
FIG. 51
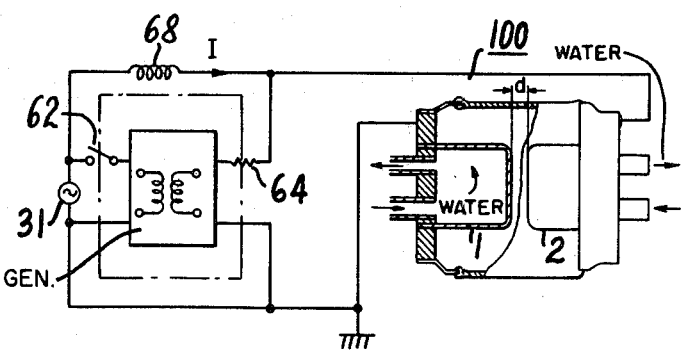
FIG. 50

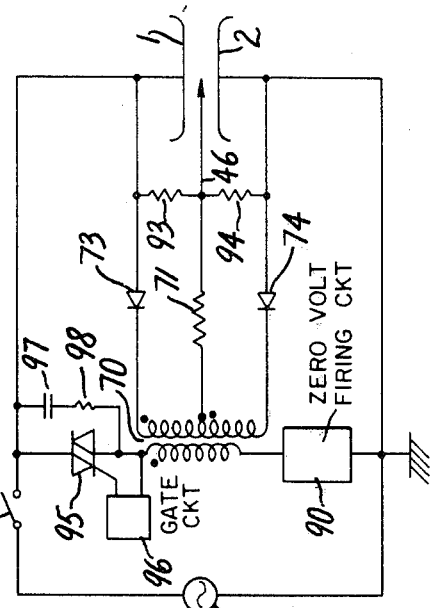
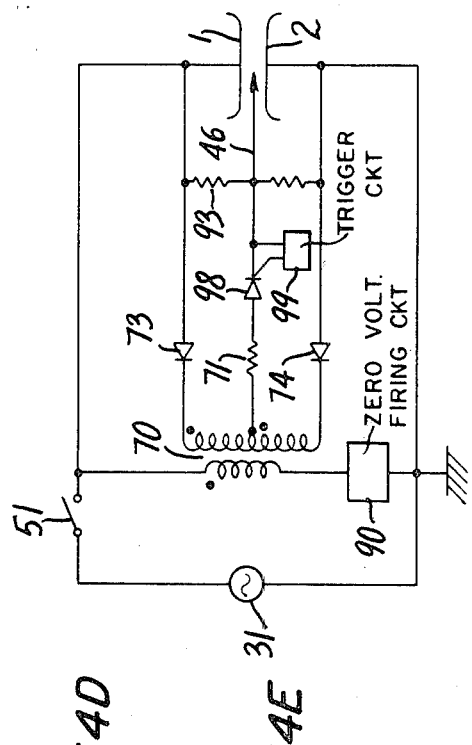
FIG. 56
FIG. 57
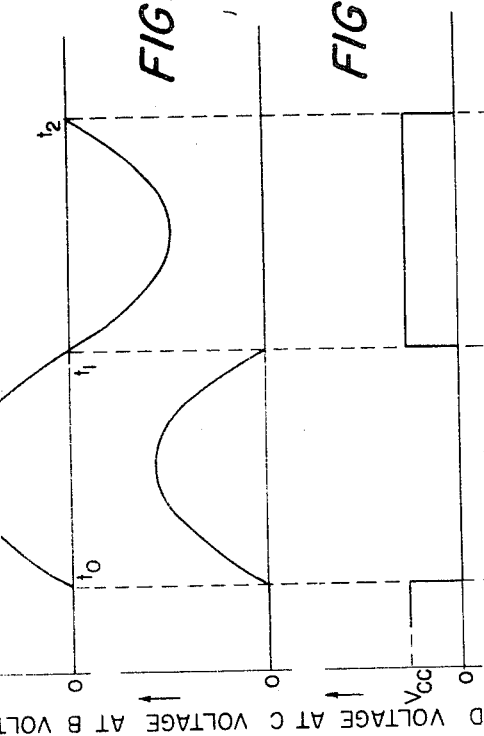
FIG. 54A
FIG. 54B
FIG. 54C
FIG. 54D
FIG. 54E

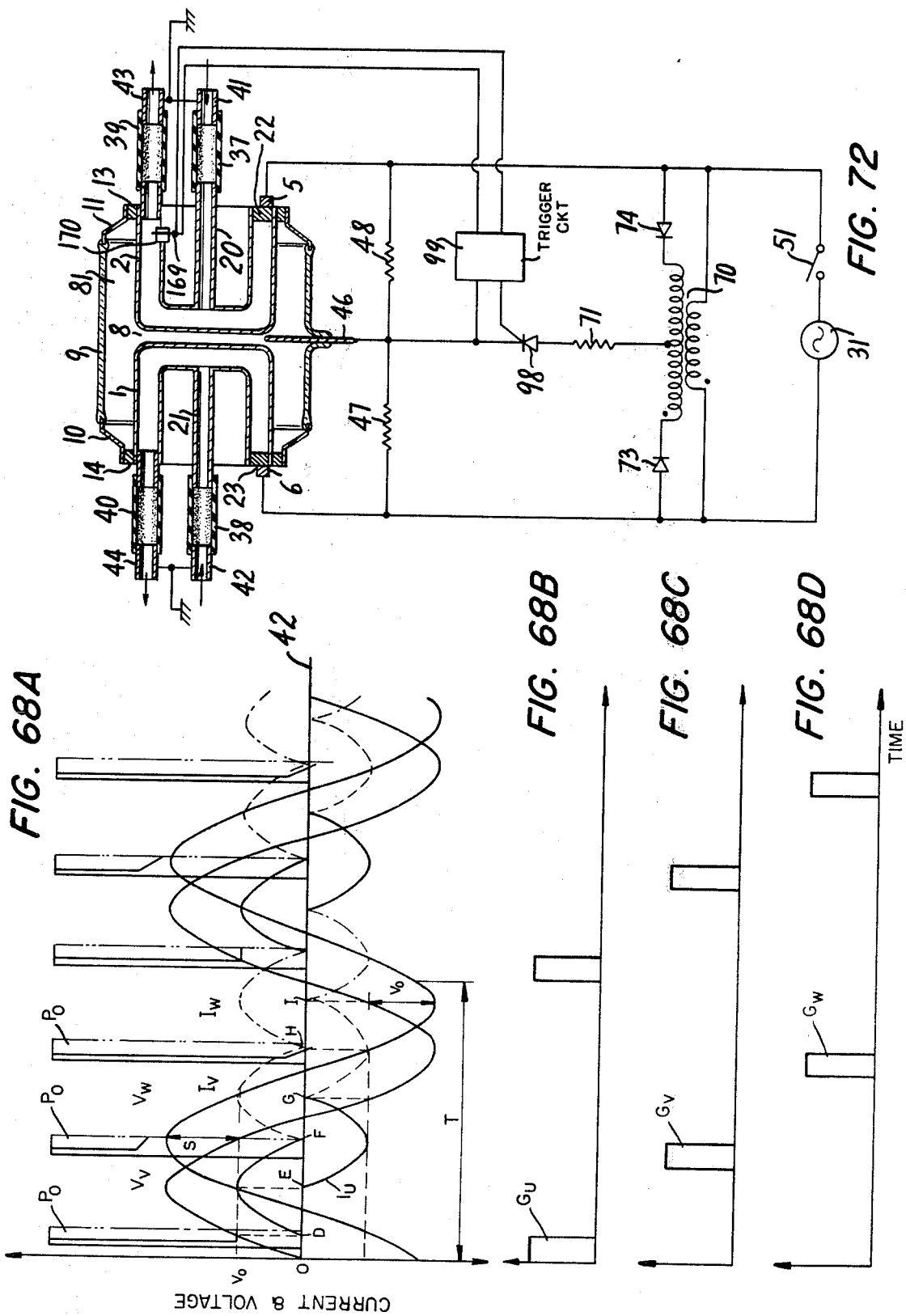

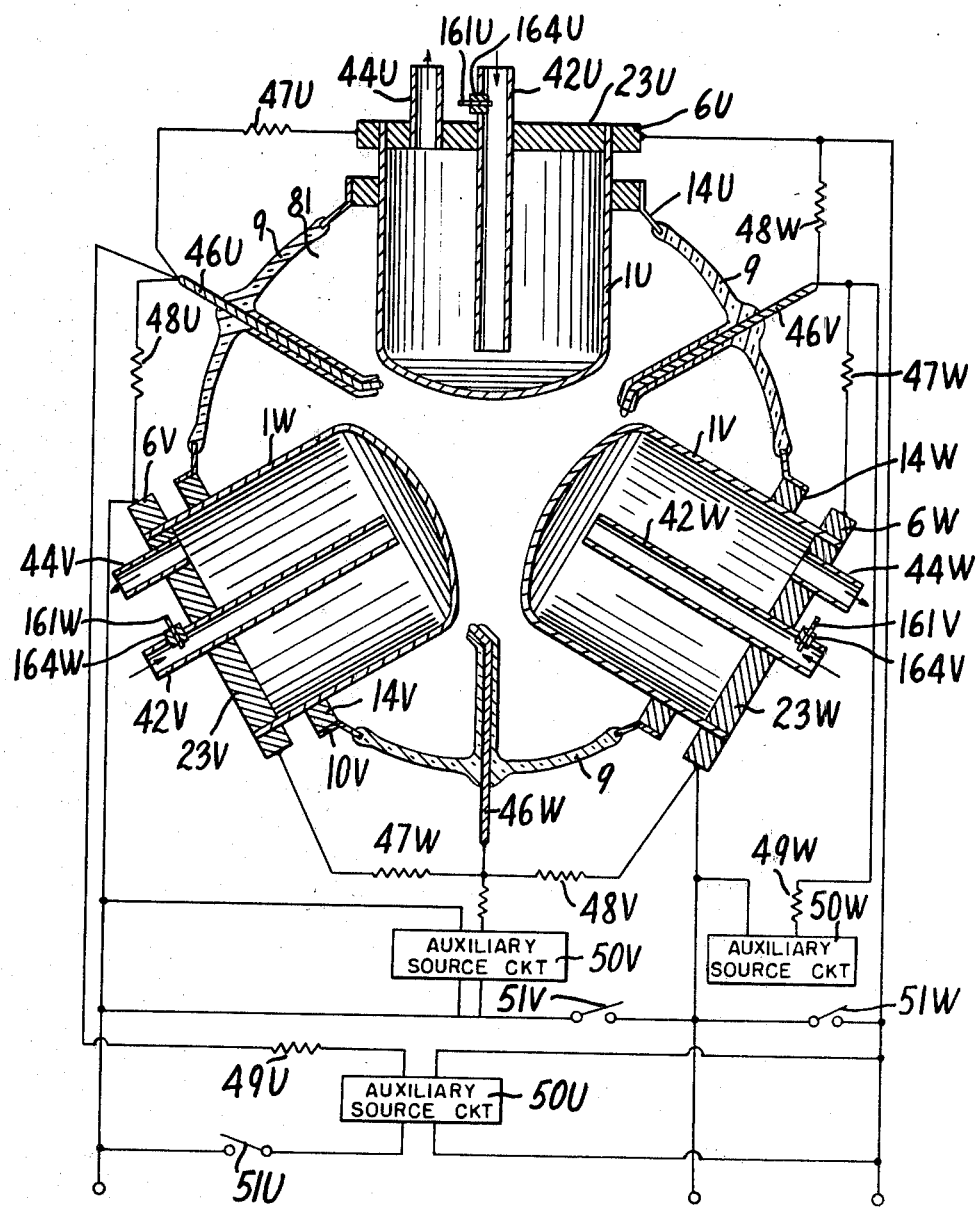

GLOW DISCHARGE HEATING APPARATUS

This is a divisional, of application Ser. No. 006,780, filed Jan. 26, 1979.

BACKGROUND OF THE INVENTION

This invention relates to a glow discharge heating apparatus for heating a liquid through the utilization of a glow discharge established between a pair of electrodes involved.

Japanese laid-open patent application No. 6252/1976 describes and claims a glow discharge heating apparatus for heating a liquid by utilizing a phenomenon that a glow discharge occurring between a pair of cathode and anode electrodes heats the cathode electrode to an elevated temperature. The glow discharge heating apparatus disclosed in the cited patent application comprises a hollow cylindrical enclosure, a tubular cathode electrode coaxially entended and sealed through the enclosure, and having both ends open, a hollow cylindrical anode electrode disposed in the enclosure to surround the cathode electrode substantially throughour the length thereof to form an annular discharge gap therebetween, a source of DC voltage connected across the cathode and anode electrodes to cause a glow discharge therebetween. The cathode electrode is heated with the glow discharge to directly heat a liquid flowing therethrough.

Heating apparatus of this type referred to have instantaneously heated the liquid with the simple construction and still with the high efficiency. However, where high currents are required to establish the glow discharge between the electrodes, it has been difficult to sustain the stabilized glow discharge therebetween. There have been a fear that the glow discharge will transit to an arc discharge as the case may be. Also the electrodes have been heated to be axially expanded. This might result in a fear that the apparatus is broken.

Further it has been difficult to reliably control the glow discharge because of the absence of a control circuit for starting and extinguishing the glow discharge.

Accordingly it is an object of the present invention to eliminate the disadvantages of the prior art practice as above described by the provision of a new and improved glow discharge heating apparatus capable of always sustaining a stabilized glow discharge.

It is another object of the present invention to provide a new and improved glow discharge heating apparatus including means for absorbing thermal strains developed in electrodes thereby to provide a construction difficult to be broken.

It is still another object of the present invention provide a new and improved glow discharge heating apparatus including a control circuit for easily controlling a glow discharge occurring across a pair of electrodes involbed.

SUMMARY OF THE INVENTION

The present invention provides a glow discharge heating apparatus comprising at least one pair of discharge electrodes disposed in opposite relationship to form a predetermined gap therebetween, a source of voltage connected across the discharge electrodes to cause a glow discharge therebetween, the glow discharge supplying electrical energy to at least one of the electrodes to heat the latter to an elevated temperature, and means for passing a liquid through the heated electrode to heat the liquid wherein each of respective portions of the electrodes opposing to each other is less in surface area than a portion of each electrode having the glow discharge caused thereon to impart a positive resistance to the current-to-voltage characteristic of the glow discharge.

In a preferred embodiment of the present invention the source of voltage may comprise a source of DC voltage and a hollow anode electrode surrounds the middle portion of a hollow cathode electrode to form the predetermined discharge gap therebetween, the cathode electrode forming a flow path for the heated liquid.

In another preferred embodiment of the present invention the source of voltage may comprise a source of AC voltage and the pair of electrodes are in the form of hollow cylinders having one end closed and substantially identical in shape to each other, the closed ends of the cylindrical electrodes abutting against each other to form the predetermined gap therebetween while flow confining means is disposed within each electrode to flow the liquid in contact with and along the internal surface thereof.

In order to ensure that the glow discharge is prevented form transiting to an arc discharge, the glow discharge heating apparatus may advantageously include an auxiliary source of voltage for applying across the electrodes a high voltage in excess of a discharge breakdown voltage across the electrodes upon a discharge voltage across the electrodes approaching a glow discharge-hold minimum voltage, to cause a pilot glow discharge therebetween to induce the principal glow discharge.

BRIEF DESCRIPTION OF THE DRAWINGS

The present invention will become more readily apparent from the following detailed description taken in conjunction with the accompanying drawings in which:

FIGS. 16 and 17 are graphs illustrating the characteristics of the arrangement shown in FIG. 15;

FIG. 18 is a longitudinal sectional view of another modification of the present invention;

FIG. 19 is a graph illustrating the characteristic of the arrangement shown in FIG. 18;

FIG. 20 shows a modification of the arrangement shown in FIG. 18 wherein FIG. 20A is a cross sectional view and FIGS. 20B and 20C are side elevational views of the lefthand and righthand sides respectively;

FIG. 23 is a view similar to FIG. 18 but illustrating another modification of the arrangement shown in FIG. 21;

FIG. 48 is a diagram of a control circuit constructed in accordance with the principles of the present invention for driving the glow discharge heating apparatus thereof;

FIG. 49 is a graph illustrating a voltage and a current waveform developed in the arrangement shown in FIG. 48;

FIG. 50 is a diagram similar to FIG. 48 but illustrating a modification of the arrangement shown in FIG. 48;

FIG. 51 is a graph similar to FIG. 49 but illustrating the arrangement shown in FIG. 50;

FIG. 54 is a graph illustrating voltage waveforms developed at various points in the arrangement shown in FIG. 52;

FIGS. 55 through 58 are circuit diagrams similar to FIG. 52 but illustrating different modifications of the arrangement shown in FIG. 52;

FIG. 68 is a graph similar to FIG. 65 but illustrating the arrangement shown in FIG. 67;

FIG. 71 is a view similar to FIG. 64 but illustrating a modification of the arrangement shown in FIG. 64;

FIG. 72 is a view similar to FIG. 70 but illustrating a modification of the arrangement shown in FIG. 69.

Throughout the Figures like reference numerals designate the identical or corresponding components.

DESCRIPTION OF THE PREFERRED EMBODIMENTS

Figure 1:
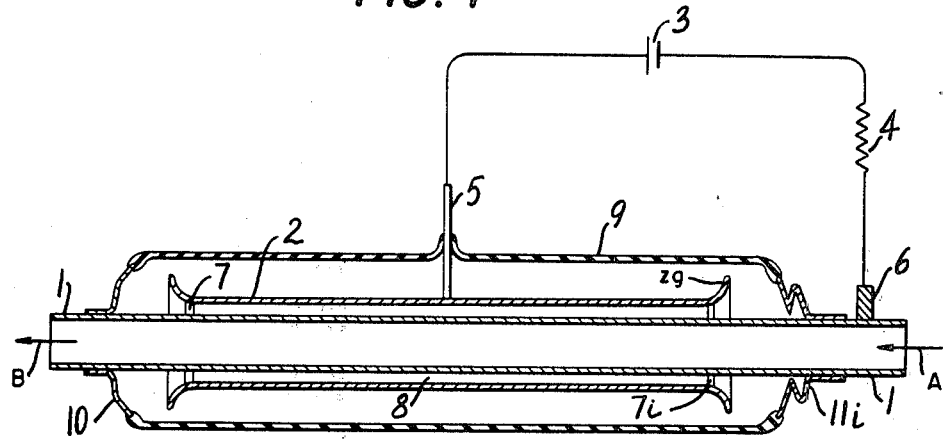
FIG. 1 is a longitudinal sectional view of a glow discharge heating apparatus constructed in accordance with the principles of the prior art.

Referring now to FIG. 1 of the drawings, there is illustrated a conventional glow discharge-heating apparatus. The arrangement illustrated comprises a hollow cylindrical cathode electrode 1, a hollow cylindrical anode electrode 2 surrounding coaxially the cathode electrode 1 to form an annular discharge gap 8 therebetween with the aid of two electrically insulating spacers 7 in the form of annuli fixedly disposed between both electrodes 1 and 2 adjacent to both end portions of the anode electrode 2, and a cylindrical enclosure 9 formed of any suitable electrically insulating material such as glass and coaxially housing the electrodes 1 and 2 with the cathode electrode 1 hermetically extending through both ends thereof. A seal fitting 10 is sealed at the outer periphery to one end, in this case, the lefthand end as viewed in FIG. 1 of the enclosure 9 and at the inner periphery to the adjacent portion of the cathode electrode 1 while a corrugated seal fitting 11 is sealed at the outer periphery to the other end of the envelope 9 and at the inner periphery to the adjacent portion of the cathode electrode 1. The corrugated seal fitting 11 is permitted to be axially contracted and expanded enough to prevent the cathode electrode 1 from damaging due to an axial thermal strains thereof. Thus the envelope 9 and the seal fittings 10 and 11 maintain the discharge gap 8 hermetic.

As shown in FIG. 1, the anode electrode 2 includes flared end portions 2 g in order to prevent an electric discharge from concentrating on the end portions of the anode electrode 2.

A positive terminal 5 connected to the central portion of the anode electrode 2 is extended and sealed through the central portion of the cylindrical peripheral wall of the enclosure 9 until it is connected to a positive side of a source of DC voltage 3 having a negative side connected through a stabilizing resistor 4 to a negative terminal 6 that is, in turn, connected to one end portion, in this case, the righthand end portion as viewed in FIG. 1 of the cathode electrode 1.

In the arrangement of FIG. 1, a DC voltage is applied across the anode and cathode electrodes 1 and 2 respectively to establish a glow discharge across the discharge gap 8 thereby to heat the cathode electrode 1. Under these circumstances, a liquid to be heated such as water is caused to flow through the interior of the cathode electrode 1 to be directly heated by the heated cathode electrode 1.

Conventional glow discharge heating apparatus such as shown in FIG. 1 have been enabled to instantaneously heat liquids to be heated, for example, water resulting in heating apparatus simple in construction and still high in efficiency. However, since the apparatus have required the high current, it has been extremely difficult to stably sustain the glow discharge across the anode and cathode electrodes. According to circumstances, there has been a fear that the glow discharge transits to an arc discharge. Further there has been a fear that, as a result of their heating, the electrodes are axially expanded leading to the destruction of the heating apparatus. In addition, conventional glow discharge heating apparatus have not been provided with suitable control circuit means for starting and ceasing the glow discharge with the result that it has been difficult to reliably control the glow discharge.

The present invention contemplates to eliminate the disadvantages of and objections to the prior art practice as above described and characterized by unique means for imparting a positive resistance to the current-to-voltage characteristic of the glow discharge. It has been found that such characteristic is effective for preventing the transit of the glow discharge to an arc discharge.

For a better understanding of the principles of the present invention, description will now be made of the glow discharge, the principles that it heats an associated cathode electrode and the current-to-voltage characteristic thereof.

Figure 2A:
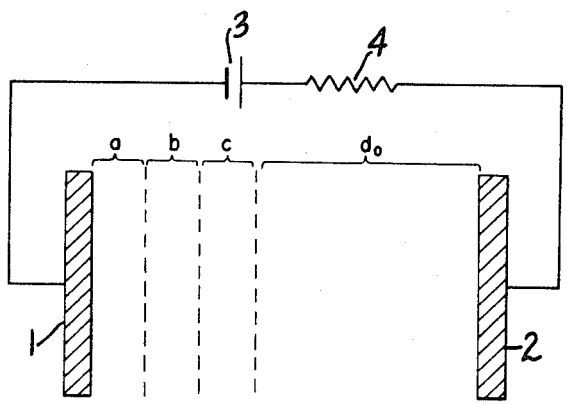
FIG. 2A is a schematic sectional view of a pair of opposite electrode useful in explaining the glow discharge.

FIG. 2A shows a pair of cathode and anode electrodes 1 and 2 respectively disposed in spaced opposite relationship and a source of DC voltage 3 including a negative side connected to the cathode electrode 1 and a positive side connected to the anode electrode 2 through a stabilizing resistor 4 whereby a glow discharge occurs within a discharge space formed between both electrodes 1 and 2. It is well known that the discharge space having the glow discharge established therein is divided into a region of cathode fall a in which positive ions are enriched, a region of negative glow b forming a thin luminescent layer, a Faraday dark space c in which no light is emitted, and a positive column $d_o$ consisting of a plasma including electrons and ions, starting with the side of the cathode electrode 1.

Figure 2B:
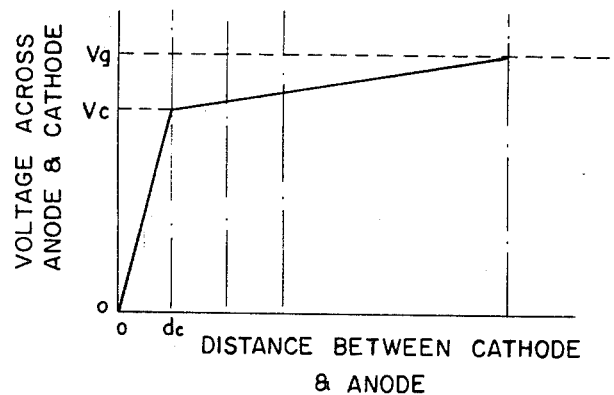
FIG. 2B is a graph illustrating a spatial voltage profile exhibited by the arrangement shown in FIG. 2A.

FIG. 2B shows a spatial voltage profile in the discharge space with the glow discharge established therein. In FIG. 2B, a voltage V is plotted in ordinate against a distance d in abscissa measured from the cathode electrode 1. From FIG. 2B it is seen that the region of cathode fall a has a very large potential-gradient because of the presence of a space charge until a cathode fall of potential $V_c$ is reached at the end of the region a spaced from the surface of the cathode electrode 1 by a distance of dc. The voltage reaches a glow voltage $V_g$ on the surface of the anode electrode 2.

By visually observing the glow discharge, it is seen that a boundary between the region of cathode fall a and the region of negative glow b are very distinct but a boundary between the region of negative glow b and the Faraday dark space c or between the Faraday dark space c and the positive column $d_o$ is not so distinct.

Also the Faraday dark space c and the positive column $d_o$ are in the so-called plasma state and relatively small in potential gradient. On the other hand, the region of cathode fall a includes positive ions in the form of a beam. As far as the discharge current is concerned, it consists essentially of an electron current in each of the Faraday dark space c and positive column $d_o$ which are in the plasma state and of an ion current in the region of cathode fall a. The region of negative glow b forms a region of the transition of one to the other of both currents.

Two phenomena developed in the region of cathode fall a, that is, (1) the mechanism by which the glow discharge is sustained and (2) a phenomenon that the cathode electrode is heated with the glow discharge as well as (3) the current-to-voltage characteristic of the glow discharge are pertinent to the principles of the present invention and therefore will now be described.

(1) Mechanism of Sustaining Glow Discharge

Positive ions present in the region of cathode fall a collide against the surface of the cathode electrode whereupon the cathode electrode 1 emits electrons by means of the action of emitting secondary electrons called the $\gamma_i$ action. The electrons emitted from the cathode electrode (1) collide against neutral atoms or molecules during their movement toward the anode electrode which is accompanied by an ionizing action called the $\alpha$ action with some probability. Electrons and positive ions caused by the ionization and collision are accelerated toward the anode and cathode electrodes respectively by means of the action of an electric field involved. It is noted that the positive ions accelerated with the electric field contributes to the $\gamma_i$ action.

Here the mechanism by which of the glow discharge is sustained will be somewhat quantitatively described. For example, it is said that, with the cathode electrode 1 formed of nickel, the $\gamma_i$ is approximately equal to 0.01 for slow helium ions having 1 Kev or less. That is, about 100 ions collide against the cathode electrode 1 to emit a single electron therefrom.

Also a degree of ionization $\alpha$ is a function of the type and pressure of a gas confined in the discharge space and a potential gradient developed therein. Electron-ion pairs formed at a distance x from the cathode electrode 1 are proportional to $e^{\alpha x}$ where e designates the base of Napierian logarithms and therefore increase exponentially with the distance x. Accordingly, the glow discharge is sustained with a distance and a voltage required for about 100 electron-ion pairs to be formed in the course of movement of a single electrode toward the anode electrode 2. This distance is designated by the distance dc shown in FIG. 2B and this voltage substantially corresponds to the voltage $V_c$. In other words, the glow discharge can be sustained even when the anode electrode 2 has been displaced to its position substantially shown by dc in FIG. 2A.

This is substantially applicable to electrodes formed of nickel, copper, iron, stainless steel or the like and operatively associated with a gas selected from the group consisting of helium, neon, argon, hydrogen, nitrogen etc.

A more detailed analysis of the phenomena developed in the vicinity of the cathode electrode 1 teaches that a current density J on the surface of the cathode electrode 1 is expressed by $$J = j_+ + j_- = j_+ = K_1 P^2 \qquad (1)$$

where $j_+$ and $j_-$ designate densities of positive ions and electrons respectively, P a pressure of a discharge gas, and $K_1$ designates a constant determined by both the type of a cathode material and that of the discharge gas.

Also the region of cathode fall a has a thickness dc as defined by $$d_c P = K_2 \qquad (2)$$

where $K_2$ designates a constant dependent upon both the type of the cathode material and that of the discharge gas. Within the region of normal glow, the cathode fall of potential $V_c$ is determined by both the type of the cathode material and that of the discharge gas but scarcely depends upon both a discharge current and the pressure of the discharge gas.

The following Table I lists values of the constants $K_1$ and $K_2$ and the cathode fall of potential $V_c$ measured within the region of normal glow with different combinations of cathode materials and discharge gases with a glow current not higher than 1 amperes and with the discharge gases maintained under the pressure of 50 Torrs or more. The measured $K_1$ and $K_2$ values are expressed in $10^{-6}$ ampere per $cm^2 Torr^2$ and in cm.Torr and the voltage $V_c$ is expressed in volts. Also the current density on the surface of the cathode electrode has been determined by measuring an area of a negative glow b. Probably, the negative glow is very thin so that it is observed like a luminescent film attached to the cathode electrode.

TABLE I
MEASURED VALUES OF $K_1$, $K_2$ and $V_c$

| Cathode | | He | Ne | Ar | $H_2$ |
|---|---|---|---|---|---|
| CU | $K_1$ | 6.0 | 8.3 | 27 | 24 |
| | $K_2$ | 3.0 | 3.0 | 0.8 | 2.0 |
| | $V_c$ | 150 | 150 | 180 | 290 |
| Ni | $K_1$ | 8.0 | 20 | 32 | 32 |
| | $K_2$ | 3.0 | 4.0 | 1.5 | 3.0 |
| | $V_c$ | 101 | 140 | 185 | 254 |
| Mo | $K_1$ | 4.4 | 4.7 | 17 | 30 |
| | $K_2$ | 4.0 | 3.0 | 0.8 | 3.0 |
| | $V_c$ | 180 | 175 | 190 | 290 |
| SUS | $K_1$ | 7.6 | 8.0 | 22 | 30 |
| | $K_2$ | 5 ~ 7 | 2.5 | 0.8 | 1.5 |
| | $V_c$ | 119 | 150 | 180 | 232 |

(2) Heating of Cathode Electrode

As above described, positive ions present in the region of cathode fall a collide against the cathode electrode to cause the $\gamma_i$ action. At that time, the positive ions have surplus kinetic energy that is, in turn spent to heat the cathode electrode 1. Regarding quantities of input and output heat of the cathode electrodes, there are, in addition to collision with the positive ions, heat conduction from the plasma portions, exothermic and endothermic effects caused from chemical reactions effected on the surface of the cathode electrode 1 due to the glow discharge, cooling effects caused from the sputtering on the cathode electrode and the evaporation of the cathode material etc. However, an extent to which a quantity of heat enters the cathode electrode has not been elucidated until the present.

Figure 3:
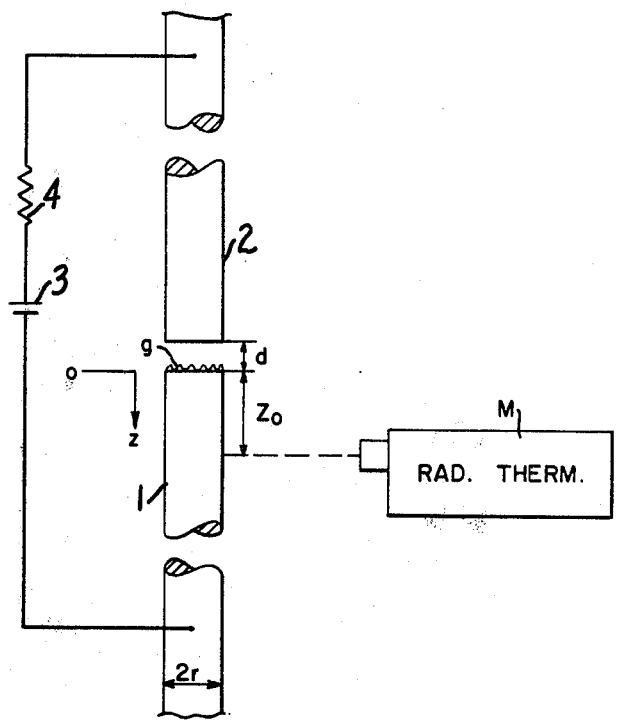
FIG. 3 is a fragmental schematic plan view illustrating how a quantity of input heat to a cathode electrode during a glow discharge is measured.

In order to determine a quantity of input heat to the cathode electrode due to the glow discharge formed between that electrode and an anode electrode, experiments were conducted with a test device schematically shown in FIG. 3. As shown in FIG. 3, a cathode electrode 1 in the form of a very long circular rod having a radius r of 1.8 mm was disposed to be thermally isolated from the surrounding and opposite to a similar anode electrode 2 to form therebetween a gap having a length d of 4 mm. Both electrodes were formed of copper and connected across a DC source 3 through a stabilizing resistor 4. Thus a glow discharge g is established across both electrodes 1 and 2 in the atmosphere. Under these circumstance, a radiation thermometer M was used to continuously measure a temperature at a point on the outer surface of the cathode electrode 1 spaced way from the discharge surface thereof by a distance $z_o$ of 3 mm.

Figure 4:
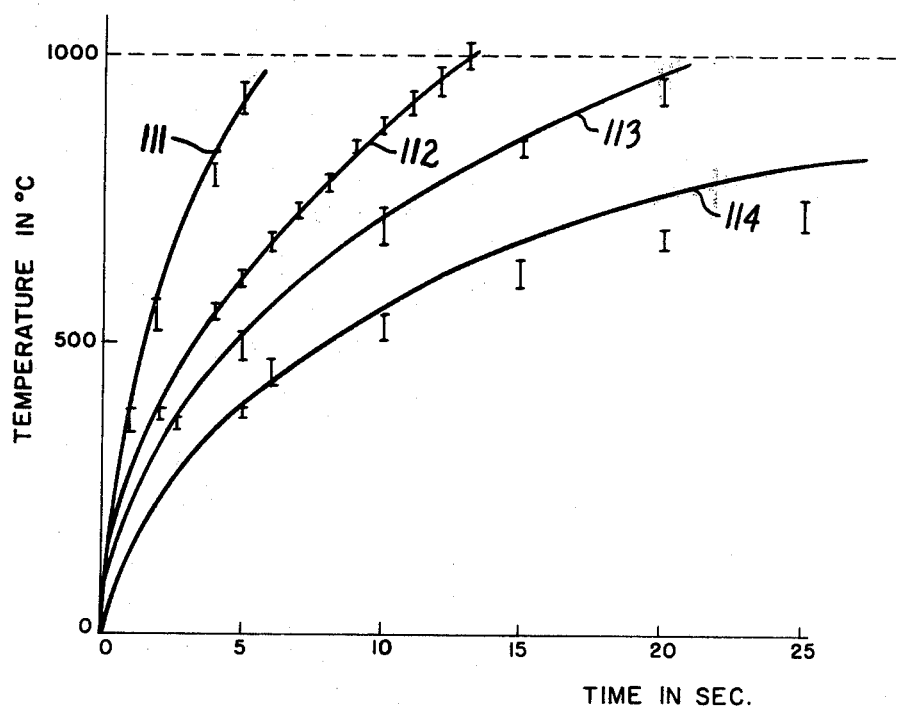
FIG. 4 is a graph illustrating the results of the measurement shown in FIG. 3 with the results of a corresponding theoretical calculation.

The results of the experiments are shown in FIG. 4 wherein the temperature in Centigrade is in ordinate against time in seconds in abscissa with a glow current taken as the parameter. In FIG. 4, each vertical segment designates a range in which measured values of the temperature are dispersed and solid curves represent calculated values of the temperature as will be described hereinafter. The reference numerals 111, 112, 113 and 114 mean the temperatures measured and calculated with glow currents of 400, 250, 200 and 150 milliamperes respectively.

From FIG. 4 it has been confirmed that the glow discharge transites or changes to an arc discharge upon the measured temperature approaching 1000° C. This will be because an oxide film is formed on the surface of the cathode electrode at such a temperature.

It is now assumed that in FIG. 3, the cathode electrode 1 with a radium r has the longitudinal axis lying on a z axis and the discharge surface passing through the origin for the z axis and that a quantity of input heat to the cathode electrode 1 is constant per unit area and per unit time. Under the assumed condition, by solving a partial differential equation for conduction of heat referred to the z axis alone and taking account of a radiation loss may be expressed by $$\frac{\partial T}{\partial t} = \kappa^2 \frac{\partial^2 T}{\partial Z^2} - \alpha(T - T_o)$$

where $\kappa$ designates a thermal diffusibility defined by the square root of the quotient of a thermal conductivity k of the cathode electrode divided by the product of a density $\rho$ and a heat capacity thereof and $\alpha$ is a constant on the assumption that the radiation loss is a linear function of a temperature T. By solving the partial equation under the boundary conditions $$\left.\frac{\partial T}{\partial Z}\right|_{z=o} = -\xi \frac{IV_c}{\pi r^2 k} = -\xi \frac{jV_c}{k}$$

and $$\left.\frac{\partial T}{\partial Z}\right|_{z=\infty} = 0$$

where $\xi$ designates a coefficient of heat input and the initial condition $$T(z,o) = T_o$$

where $T_o$ designates room temperature, a solution results in $$T(z,t) = T_o + \frac{\xi IV_c}{\pi r^2 k} \frac{\kappa}{\sqrt{\alpha}} \left[ e^{-\frac{\sqrt{\alpha}}{\kappa}z}(1 - F(\gamma_1)) - e^{\frac{\sqrt{\alpha}}{\kappa}z} F(\gamma_2) \right] \quad (3)$$

where I: glow current.

In the expression (3) $F(\gamma_1)$ and $F(\gamma_2)$ are error functions expressed by $$F(\gamma_1) = \frac{1}{\sqrt{2\pi}} \int_{\gamma_1}^{\infty} e^{-\frac{\gamma^2}{2}} d\gamma$$

and $$F(\gamma_2) = \frac{1}{\sqrt{2\pi}} \int_{\gamma_2}^{\infty} e^{-\frac{\gamma^2}{2}} d\gamma$$

respectively where $\gamma_1$ and $\gamma_2$ are expressed by $$\gamma_1 = \frac{2\kappa\sqrt{\alpha t} - z}{\kappa\sqrt{2t}} \text{ and } \gamma_2 = \frac{2\kappa\sqrt{\alpha t} + z}{\kappa\sqrt{2t}}$$

respectively. Also $\alpha$ is defined by $$\alpha = \frac{2\epsilon\sigma(Ta^3 + T_oTa^2 + T_o^2Ta + T_o^3)}{\rho c a}$$

where $\epsilon$ designates an emissivity, $\sigma$ a Stefan-Boltzmann constant and Ta designates the mean value of room temperature and a temperature of the cathode electrode.

The expression (3) was used to calculate the time dependency of the temperature rise on the measured point as shown in FIG. 3. The results of the calculations are indicated by the solid curves shown in FIG. 4.

From FIG. 4 it is seen that the measured values of the temperature fairly well coincide with the calculated values thereof.

Figures 5, 6:
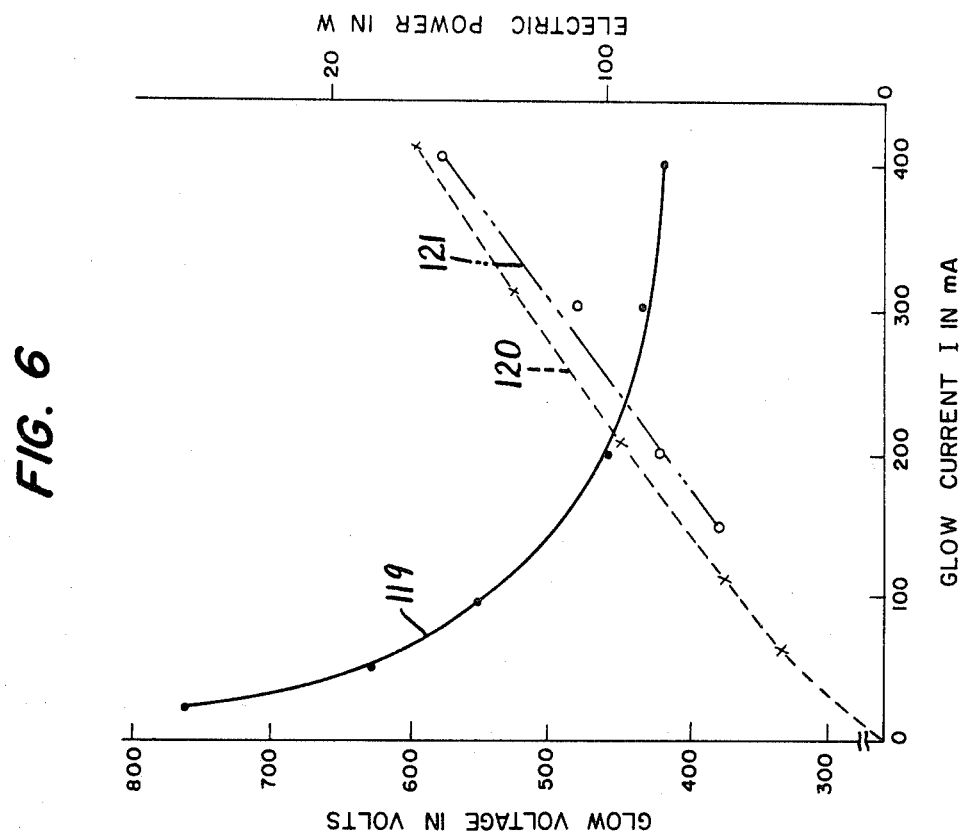
FIG. 5 is a graph illustrating the relationship between a glow discharge voltage and a gap length through which a glow discharge is caused.
FIG. 6 is a graph illustrating the relationship between a voltage and a current for the glow discharge.

FIG. 5 illustrates a glow discharge voltage V in volts plotted in ordinate against a length of a discharge gap in millimeters in abscissa. The voltage V was measured with the electrodes formed of copper and disposed in the atmosphere. Curves labelled 115, 116, 117 and 118 depict glow currents of 10, 50, 100 and 400 milliamperes respectively.

In FIG. 4 it is to be noted that the curves have been drawn by equalling the cathode drop of potential Vc in the atmosphere to a voltage of 285 volts estimated with a null gap length from curves shown in FIG. 5.

Also the coefficient of heat input $\xi$ has been determined to cause the calculated values of the temperature to coincide with the measured values thereof shown in FIG. 4. The coefficient $\xi$ has been of 1.4.

Further it is considered that a quantity of heat corresponding to 0.4 $jV_c$ per unit area per unit time will result from one portion of heat generated in that portion of the glow discharge formed of both the Faraday dark space c and the positive column d except for the region of cathode fall a having a thickness dc approximately equal to $2\times10^{-3}$ centimeter.

FIG. 6 illustrates a glow voltage $V_g$ in volts plotted in ordinate against a glow current I in milliamperes in abscissa. Curve labelled 119 describes the glow current-to-voltage characteristic exhibited by the arrangement of FIG. 2. Dotted curve 120 shows the total power consumed by the glow discharge and expressed by $IV_g$ while broken curve 121 illustrates an electric power entering the cathode electrode and calculated as 1.4 $IV_g$. Both the glow voltage and powers in watts are plotted in ordinate against the same glow current in absussa.

From FIG. 6 it is seen that at least 80% of the total consumed power enters the cathode electrode and that the higher the glow current I the greater the proportion of the power entering the cathode electrode to the total consumed power will be.

Also it is seen that a quantity of input heat q to the cathode electrode 1 per unit area per unit time is give by $$q = jV_c = jV_g$$

provided that the spacing d between the cathode and anode electrodes 1 and 2 respectively substantially approximates the thickness of the region of cathode fall a (see FIG. 2), that is to say, the glow discharge includes no plasma portion. From this it is seen that the smaller the spacing d between the cathode and anode electrodes the larger the proportion of the power entering the cathode electrode to the total consumed power will be.

Figure 7:
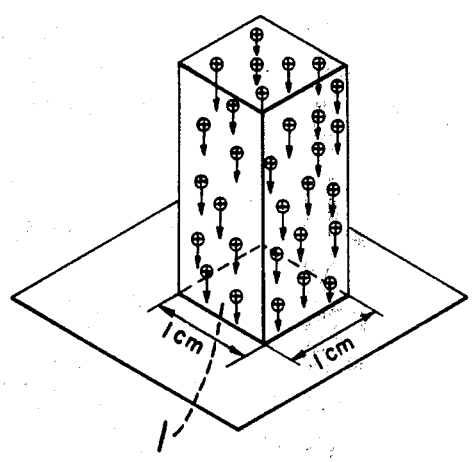
FIG. 7 is a perspective view of a modeled ion flux useful in explaining a quantity of input heat to a cathode electrode resulting from a glow discharge.

FIG. 7 shows a model for a positive ion flux striking against the unit area of the surface of the cathode electrode per unit time. In FIG. 7, a square prism has a square bottom including each side of 1 centimeter and contacting the surface of the cathode electrode 1 and a height corresponding to the velocity $V_i$ cm/sec of ions multiplied by one second. Within the prism, positive ions designated by the symbol "cross in circle" are moved as shown at the arrow to strike or collide with the cathode electrode 1. Thus the square prism designates a positive ion flux colliding against the cathode electrode per unit area per unit time and electrical energy of the ion flux results in the quantity of input heat q to the cathode electrode. Since the number of the positive ions is expressed by j/e where e designates the elementary electric charge and since each ion has electrical energy of $eV_c$, the quantity of input heat q is expressed by $$q = eV_c \frac{j}{e} = jV_c \text{ in watts/cm}^2.$$

Thus the model for the positive ion flux also explains that the quantity of input heat to the cathode electrode is expressed by $jV_c$ per unit area per unit time.

From the foregoing it will be understood that the glow discharge established across the cathode and anode electrodes causes the quantity of heat expressed by $\xi jV_c$ to enter the cathode electrode per unit area per unit time. Also by decreasing the spacing between both electrodes to increase the glow current through the spacing, the quantity of input heat to the cathode electrode per unit area per unit time can approximate the product of the current density on the surface of the cathode electrode multiplied by the glow voltage or $J \cdot V_g$.

Therefore the glow discharge without the positive column can be utilized as a heat source having a high efficiency because almost all heat due to the glow discharge enters the cathode electrode and also as a heat source having a power density variable at will by changing a gas pressure within the spacing between both electrodes because the current density on the surface of the cathode electrode is proportional to the square of the gas pressure.

(3) Current-to-Voltage Characteristic of Glow Discharge

The current-to-voltage characteristic of the glow discharge will now be described and then the principles of the present invention will be described in detail.

Figure 8:
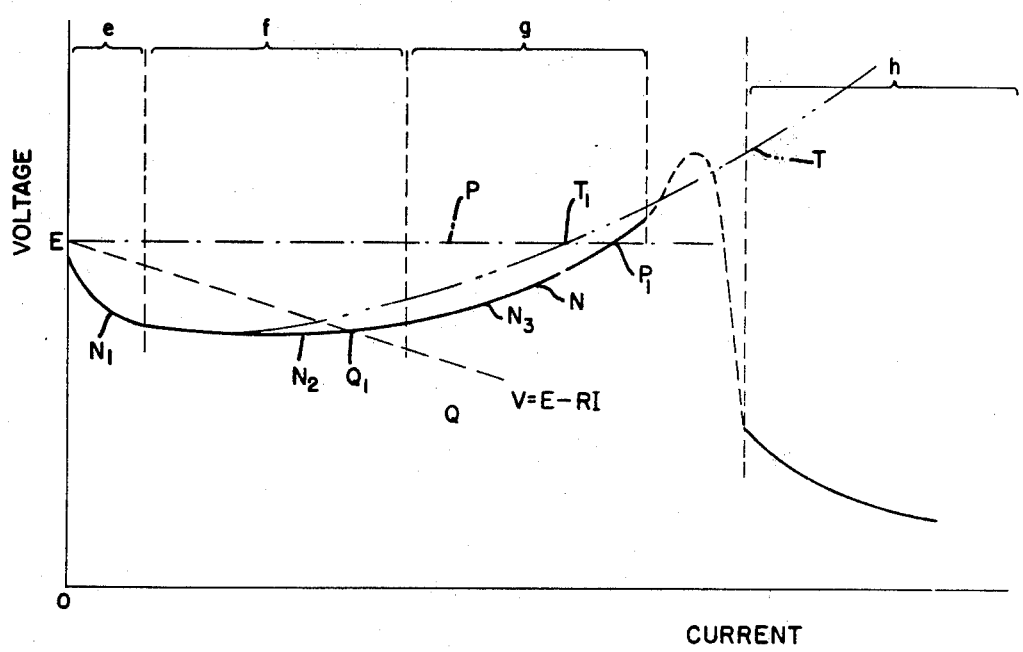
FIG. 8 is a graph illustrating the current-to-voltage characteristics of the glow discharge.

FIG. 8 shows the relationship between a current and a voltage for the glow discharge. In FIG. 8 the axis of abscissas represents a current and the axis of ordinates represents a voltage.

A DC voltage is applied across a cathode and an anode electrode 1 and 2 respectively (see FIG. 9A) to render the anode electrode 2 positive with respect to the cathode electrode 1 thereby to cause a glow discharge thereacross. When a current flowing through both electrodes is increased, a negative glow region b included in the glow discharge spreads in area on the surface of the cathode electrode 1 (see FIGS. 9A and 9B). This results in a change in current-to-voltage characteristic as shown at solid line N in FIG. 8.

However, when the current is quite low, the current-to-voltage characteristic droops as shown by a characteristic portion $N_1$ in FIG. 8. A region in which the drooping characteristic $N_1$ appears is called a region of subnormal glow e.

Figure 9A:
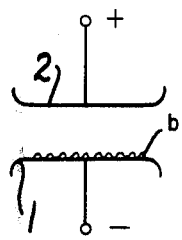
FIGS. 9A and 9B are fragmental schematic plan views of a pair of opposite electrodes useful on explaining the principles of the present inventions.

In a region following the region of subnormal glow e an increase in current causes the voltage to be kept substantially constant as shown by a characteristic portion $N_2$ in FIG. 8 as long as that the surface of the cathode electrode 1 having the negative glow b caused thereon is smaller in area than the entire surface thereof opposite to the anode electrode 2 as shown in FIG. 9A. A region in which the characteristic portion $N_2$ is developed is called a region of normal glow f.

Figure 9B:
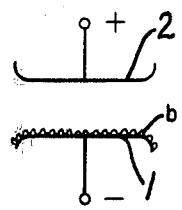

A further increase in current causes an increase in voltage because the negative glow b has covered the entire area of the surface of the cathode electrode 1 opposite to the anode electrode 2 as shown in FIG. 9B whereby the negative glow increases in current density. The resulting I−V characteristic is upturned with an increase in current as shown by a characteristic portion $N_3$ in FIG. 8. The characteristic portion $N_3$ is called a positive resistance characteristic and a region in which the positive resistance characteristic $N_3$ appers is called a region of abnormal glow. In that region of abnormal glow g the entire area of the surface of the cathode electrode 1 is covered with the negative glow b (see FIG. 9B) with the result that the current is apt to concentrate at the edge portion or the like of the cathode electrode 1 and therefore the glow discharge is easily changed to an arc discharge. As a result, it is difficult to maintain the glow discharge in its stable state. The arc discharge appears in a region h as shown in FIG. 8.

With no impedance connected between the cathode and anode electrodes 1 and 2 respectively and an electric source for supplying an electric power across both electrodes, the source side has the current-to-voltage characteristic of the constant current type such as shown at horizontal broken line P in FIG. 8. This is because even an increase in current does not cause a voltage drop across an impedance.

Under these circumstance, the glow discharge has its operating point coinciding with a point $P_1$ where the characteristic P of the source side intersects the characteristic N of the glow discharge. However, this operating point $P_1$ is located in the region of abnormal glow g, which is apt to transit to a region of arc discharge h, as above described. Accordingly it is difficult to maintain the glow discharge stable in the region of abnormal glow g.

Further it is to be noted that the flat characteristic P of the source side can not stably cross the flat characteristic portion $N_2$ of the glow discharge in the region of normal glow f.

On the other hand, with a resistance R as the impedance connected to the source, an increase in current I causes an increase in voltage drop IR across the resistance. Thus the source side has the current-to-voltage characteristic such as shown at dotted straight line Q in FIG. 8 and the glow discharge has its operating point designated by an intersection $Q_1$ of the characteristics Q and N. This operating point is located in the region of normal glow f resulting in the stable glow discharge.

Where electrical energy participating in the glow discharge is converted to thermal energy with a very high efficiency, the connection of an impedance to the source as above described is one factor that contributes to decreased efficiency in utilization of electrical energy. For example, the use of a resistor causes a Joule heating loss and the use of a reactor causes a Joule heating loss in a winding of the reactor and an eddy current loss and a hystersis loss in an iron core of the reactor. Since such energy losses scatter as thermal energy, it is possible to recover the thermal energy. This, of course, deprives the resulting heating device of its convenience and compactness.

From the foregoing it is seen that whether or not an impedance is connected to an electric source, the abovementioned disadvantages remain as long as the glow discharge has the current-to-voltage characteristic in the form of a curve such as shown at N in FIG. 8.

In order that the glow discharge can be maintained stable even with the flat current-to-voltage characteristic of an associated source such as shown by straight line P in FIG. 8 and without an impedance connected to the source, the present invention includes unique means for imparting a positive resistance to the current-to-voltage characteristic of the glow discharge in a different manner as compared with conventional abnormal glows.

Figure 10A:
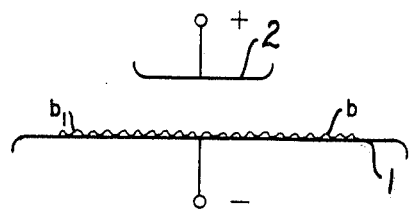
FIG. 10A, 10B and 10C are views similar to FIG. 9A or 9B but illustrating typically electrode configurations embodying the principles of the present invention.

First it is seen in FIG. 10A that a surface of a cathode electrode 1 opposite to an anode electrode 2 has an area made sufficiently larger than that of the anode electrode 2 so as not to impede the spread of a negative glow A b. In other words, the opposite surface area of the anode electrode 2 is limited to a small magnitude with respect to the cathode electrode. Thus a peripheral edge root $b_1$ of the negative glow b lying on the opposite surface of the cathode electrode 1 has a distance to the anode electrode 2 that is gradually increased as the negative glow b spreads due to an increase in glow discharge current and therefore a voltage across both electrodes 1 and 2 is gradually raised. Under these circumstances, the glow discharge has the current-to-voltage characteristic such that the voltage increases with the current as shown at broken curve T in FIG. 8. That is, the characteristic is of the positive resistance type.

In this connection, it is to be noted that the positive resistance characteristic developed in the region of abnormal glow g in the prior art practice as shown at curve $N_3$ in FIG. 8 is cause from the fact that the negative glow b has spread over the surface of the cathode electrode and can not spread any more (see FIG. 9B). Accordingly, such positive resistance characteristic is quite different from that according to the principles of the present invention. As above described, the negative glow of the present invention is permitted to sufficiently spread in response to an increase in current because the active surface area of the cathode electrode 1 opposite to the anode electrode 2 is sufficiently larger than that of the anode electrode with the result that there is no problem that the glow discharge transits to an arc discharge due to the impossibility of spreading the negative glow.

From the foregoing it is seen that the characteristic T of the present invention as shown in FIG. 8 is developed in the region of normal glow but not in the region of abnormal glow although it has a positive resistance.

In the present invention, even with an associated electric source having no impedance connected thereto, therefore the characteristic T thereof intersects the characteristic of an associated source at a point $T_1$ (see FIG. 8) where the glow discharge is stablized. It is to be noted that the point $L_1$ lies in the region of the normal glow unlike the characteristic $N_3$ of the prior art so that the present invention does not encounter the problems that the glow discharge transits to an arc discharge and so on.

Figure 10B:
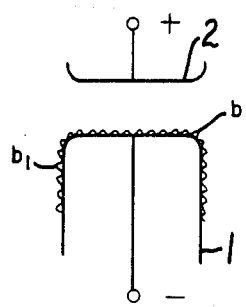

In order to impart a positive resistance to the current-to-voltage characteristic of the glow discharge by further increasing the distance between the peripheral edge $b_1$ of the negative glow b on a cathode electrode 1 and an associated anode electrode 2, the cathode electrode 1 can be made cylindrical and opposite to the anode electrode 2 as shown in FIG. 10B. In the arrangement of FIG. 10B, the peripheral glow edge $b_1$ is located on the peripheral wall surface of the cylindrical cathode electrode 1 at some distance from the end surface thereof. Thus, the glow edge $b_1$ is spaced far away from the anode electrode 2 as compared with the arrangement of FIG. 10A, resulting in a satisfactory positive resistance characteristic.

Figure 10C:
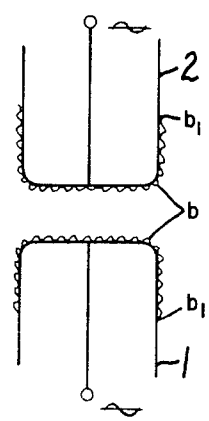

When an AC voltage is applied across the cathode and anode electrodes, either electrode becomes alternately a positive electrode so that a glow discharge is caused on the opposite surface of both electrodes. With an AC voltage used, it is desirable that the cathode and anode electrodes are in the form of identical cylinders and oppose to each other as shown in FIG. 10C. From FIG. 10C it is seen that the peripheral edge $b_1$ of the negative glow b on either electrode 1 or 2 is spaced far away from the other electrode 2 or 1 as in the arrangement of FIG. 10B.

From the foregoing the following can be summarized that the principles of the present invention are to make an electrode area with which a pair of cathode and anode electrodes are opposite to or confront each other to be smaller than that area of the electrode on which a negative glow is caused.

Figure 11:
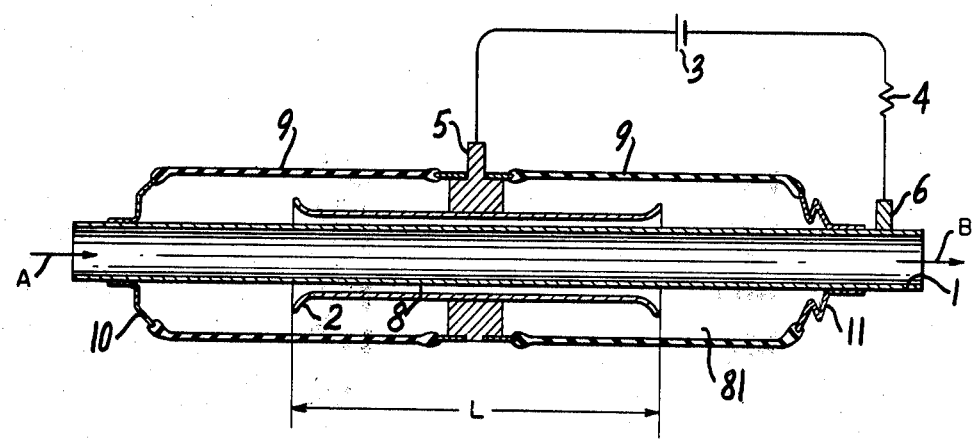
FIG. 11 is a longitudinal sectional view of one embodiment according to the glow discharge heating apparatus of the present invention.

Referring now to FIG. 11, there is illustrated one embodiment according to the glow discharge heating apparatus embodying the principles of the present invention as above described. The arrangement illustrated comprises an electrically insulating enclosure 9 in the form of a hollow cylinder formed of glass, a cathode electrode 1 in the form of a hollow cylinder with both open ends coaxially extending through the enclosure 9 and an anode electrode 2 in the form of a hollow cylinder with both open flare ends disposed coaxially with the cathode electrode 1 withing the enclosure 9 to form an annular glow discharge gap 8 therebetween. The cathode electrode 1 is extended and sealed through both ends of the enclosure 9 by means of seal fittings 10 and 11 respectively. Thus the enclosure 9 along with the cathode electrode 1 defines an annular space 81 which includes the glow discharge gap 8 and is filled with an electrically dischargeable gas selected from the group consisting of rare gases such as helium, mixtures thereof, for example, a mixture of neon and argon, a mixture of helium and hydrogen etc.

An annular anode terminal 5 is fixedly secured at the inner periphery to the central portion of the outer cylindrical surface of the anode electrode 2 and has a protrusion extended and sealed through the enclosure 9 by having the outer periphery fixed to a seal fitting sealed to adjacent ends of two similar enclosure portions forming the enclosure 9. The anode terminal 5 is connected to a positive side of a source of DC voltage 3 including a negative side connected by a stabilizer 4 to a cathode terminal 6 that is connected to that portion of the cathode electrode 1 disposed outside of the enclosure 9, in this case, adjacent to the seal fitting 11. The stabilizer 4 may be a small capacity reactor or a resistor. If desired, the stabilizer may be omitted.

In order to facilitate the description of the present invention, the symbol "S−" designates the entire area of that portion of the cathode electrode 1 on which a glow discharge can be caused while the symbol "S+" designates an area of that portion of the anode electrode 2 opposing the cathode electrode 1 and actually used for the glow discharge. Therefore an area labelled S+ is called an "anode area effective for discharge" or an "effective anode area".

According to the principles of the present invention as above described, the anode area S+ effective for discharge is made smaller than the cathode discharge area S−.

The operation of the arrangement as shown in FIG. 11 will now be described. A DC voltage from the source 3 is applied across the anode and cathode electrodes 2 and 1 respectively through the stabilizer 4 to establish a stable glow discharge in the annular discharge gas 8 thereby to heat the cathode electrode 1. Under these circumstances, a fluid to be heated, for example, water flows into the interior of the cathode electrode 1 as shown at the arrow A in FIG. 11 to absorb heat from the cathode electrode 1 to be heated. Then the heated fluid flows out from the cathode electrode 1 as shown at the arrow B in FIG. 1.

Figure 12:
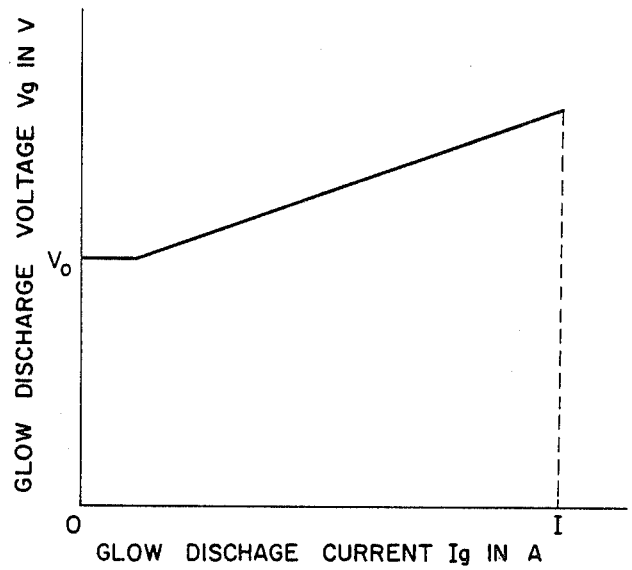
FIG. 12 is a current-to-voltage characteristic curve for a glow discharge caused by the arrangement shown in FIG. 12.

During the glow discharge, a current and a voltage thereof is illustrated by a characteristic curve shown in FIG. 12 wherein the glow discharge current $I_g$ in amperes is plotted in abscissa against the glow discharge voltage $V_g$ in volts in ordinate. The glow discharge voltage $V_g$ may be approximately expressed by $$V_g = V_o + I_g R$$

where $V_o$ designates a glow discharge-hold minimum voltage as will be described hereinafter and R designates a slope of the characteristic curve. The slope of the characteristic curve as shown in FIG. 12 is called a "positive resistance R".

Figure 13:
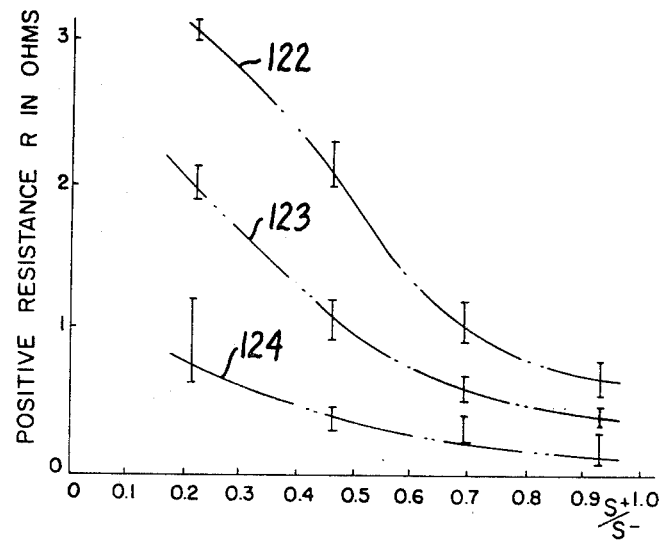
FIGS. 13 and 14 are graphs useful in explaining the principles of the present invention.

Referring back to FIG. 11, L designates an axial length of the anode electrode 12 and has been changed to vary the effective anode area S+ thereby to obtain the relationship between a ratio of the effective anode area S+ to the cathode discharge area S− and the positive resistance R as shown in FIG. 13.

In FIG. 13, the positive resistance R in ohms is plotted in ordinate against the ratio between both area S+/S− in abscissa. Curves labelled 122, 123 and 124 have been plotted with data measured by filling the interior of the enclosure 9 or the annular space 81 with a gaseous mixture including 70% by volume of helium and 30% by volume of hydrogen under pressures of 100, 150 and 200 Torrs respectively. The gap between both electrodes 1 and 2 was maintained at a magnitude of 1 mm. Also the vertical segment has the same meaning as that shown in FIG. 4.

From FIG. 13 it is seen that the positive resistance R at the ratio of S+/S− of 0.2 increases to four or five times that at the ratio of 1.

The tendency of the positive resistance characteristic as shown in FIG. 13 can be observed with the spacing of 5 mm between the electrodes 1 and 2 filled with the dischargeable gas including neon, helium, a mixture of neon and argon, or a mixture of helium and at most 30% by volume of hydrogen under a pressure of 200 Torrs or less.

Also experiments have been conducted with the DC source 3 having varied regulations of the source voltage.

Figure 14:
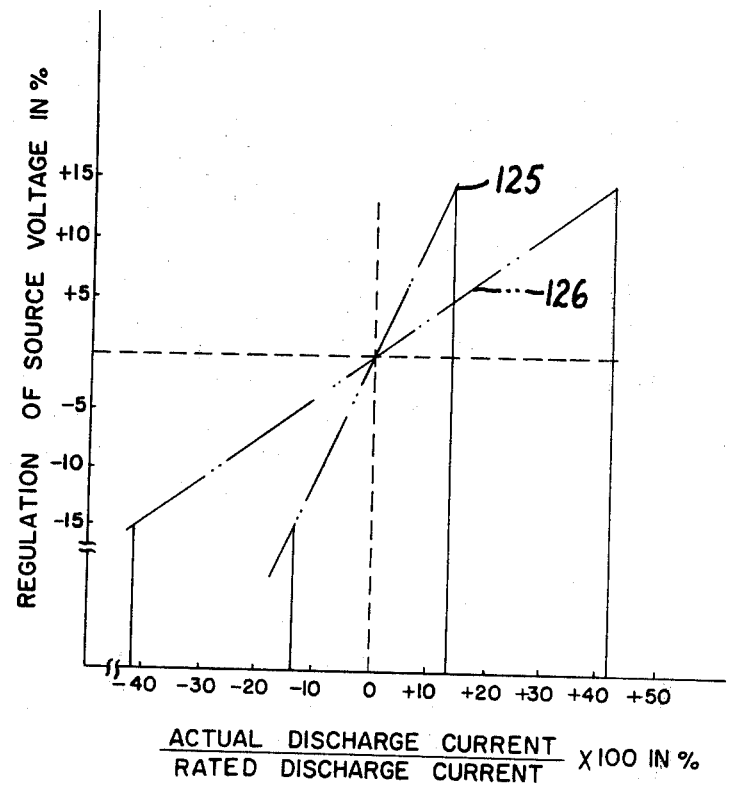

The results of the experiments are shown in FIG. 14 wherein the axis of ordinates represents a regulation of source voltage in percent and the axis of abscissas represents a ratio of the actual discharge current I to a rated discharge current $I_o$ in percent. Straight lines labelled 125 and 126 describe the regulations of source voltage with the positive resistance R having values of 1 and 3 ohms respectively.

From FIG. 14 it is seen that a variation of 15% in source voltage gives a current regulation or a ratio of the actual current I to the rated discharge current $I_o$ multiplied by one hundred in percent ±42% and ±14% with positive resistance R of 1 and 3 ohms respectively. Thus the positive resistance R of 3 ohms renders the glow discharge relatively stable.

Further by rendering the positive value R higher, it is possible to control a maximum current for supplying a predetermined electric power to a small magnitude which is, in turn, advantageous in that the glow discharge apparatus is made compact.

The measure as above described is also applied to constructions in which AC voltage is applied across the electrodes 1 and 2 to cause the glow discharge thereacross only when the electrode 1 acts as a cathode electrode.

From the foregoing it is seen that the arrangement of FIG. 11 eliminates the disadvantages of conventional glow discharge heating apparatus that the positive resistance for the glow discharge is low, the glow discharge is moved about on the electrode, the discharge current greatly changes with a variation in source voltage resulting in the necessity of connecting a stabilizer or the like to the source and so on. Those disadvantages have been caused from the cathode area being substantially equal to the anode area.

Figure 15:
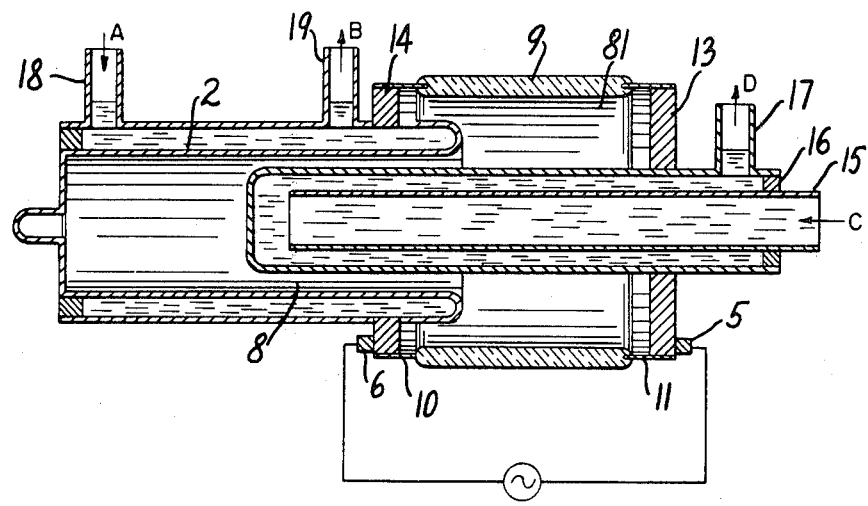
FIG. 15 is a longitudinal sectional view of a modification of the arrangement shown in FIG. 11.

FIG. 15 shows a modification of the present invention operatively associated with an AC source. The arrangement illustrated comprises an inner electrode 1 in the form of a hollow cylinder having one end closed, an outer electrode 2 in the form of a hollow cylinder having one end open and disposed coaxially with the inner electrode 1 so that the closed end portion of the inner electrode 1 is inserted into the opened end portion of the outer electrode 2 to form an annular discharge gap 8 therebetween.

The inner electrode 1 is coaxially disposed within a tubular glass enclosure 9 to extend beyond both open ends thereof and the open end portion of the electrode 1 is rigidly fitted into an annular supporting disc 13 of any suitable metallic material including an outer periphery connected to the adjacent end of the enclosure 9 through the seal fitting 11. The outer electrode 2 has the open end portion extending into the enclosure 9 and supported by another annular supporting disc 14 of the same material as the disc 13 similarly connected to the other end of the enclosure 9 through another seal fitting 10. In this way the enclosure 9 defines a hermetic space 81 with the supporting discs 13 and 14, the seal fittings 10 and 11, the inner electrode 1 and the outer electrode 2 having the other end closed.

Then a pair of terminals 5 and 6 is attached to the supporting discs 13 and 14 to connect both electrodes 1 and 2 to an AC source 31 therethrough.

An inflow tube 15 is coaxially disposed within the inner hollow electrode 1 to form an annular passageway therebetween. The tube 15 is maintained in place through a closing member 16 rigidly fitted into the open end of the inner electrode 1 and having the tube 15 extending therethrough. The inner electrode 1 is provided on the open end portion with an outlet duct 17.

On the other hand, the outer electrode 2 is double walled and provided on the closed end portion of the outer wall with an inlet duct 18 and that portion thereof adjacent to the supporting disc 14 with an outlet duct 19 communicating with the inlet duct 18 through an annular space defined by the inner and outer walls of the electrode 2. A liquid to be heated, for example, water enters the inlet duct 18 as shown at the arrow A in FIG. 15 and thence to the annular space due to the double-walled structure of the outer electrode 2 after which it leave the outlet duct 19. Also water enters the inflow tube 15 as shown at the arrow C in FIG. 15 and thence the annular space between the inflow tube 15 and the inner electrode 1. Then the water flows out from the outlet duct 17 as shown at the arrow D in FIG. 15.

It will readily be understood that the space 81 is filled with an easy dischargeable gas as above described in conjunction with FIG. 11.

In operation an AC voltage across the source 31 is applied across both electrodes 1 and 2 to cause a glow discharge mainly in the annular discharge gap 8.

As above described, the inner electrode 1 is inserted into the outer electrode 2 to overlap the latter. This ensures that an area of that portion of one of the electrodes opposite to the other electrode is smaller than an electrode area with which a glow discharge can occur between the electrodes 1 and 2. This means that an anode area on the side of that electrode acting as an anode for the glow discharge is always limited. For example, with the dischargeable gas maintained under a pressure of about 200 Torrs and with the gap between both electrodes having a length not exceeding 5 millimeters, the limitation of the anode area results in an indirect limitation of an associated negative glow region and therefore an increase in positive resistance for the glow discharge. That is, the current-to-voltage characteristic of the glow discharge such as shown at curve $T_1$ in FIG. 8 has a larger slope whereby the AC glow discharge can be maintained stable. Accordingly, a stable glow discharge can be sustained even with a high current under a high pressure without the glow discharge being changed to an arc discharge.

Under these circumstances, either of the inner and outer electrodes 1 and 2 respectively is heated when it acts as the cathode electrode resulting in heating of both electrodes. Thus the fluid such as water flowing in contact with the electrodes is instantaneously heated and the heated fluid leaves the outlet ducts 17 and 19.

Figure 16:
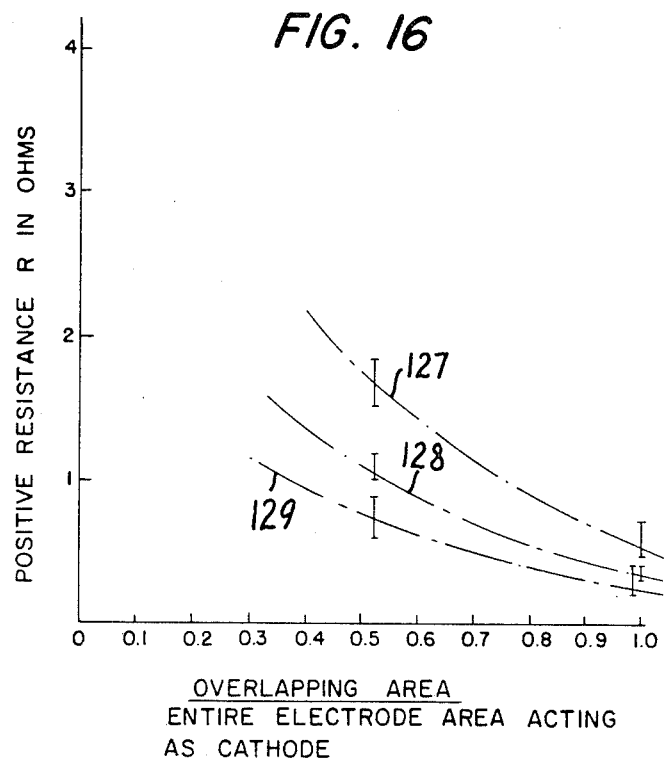

FIG. 16 is a characteristic curve illustrating the relationship between the area of one of the electrodes overlapping the other electrode and the positive resistance exhibited by the glow discharge. In FIG. 16 the positive resistance R in ohms is plotted in ordinate against a ratio of the overlapping area to the entire area of the electrode acting as the cathode in abscessa. Curves labelled 127, 128 and 129 have been plotted with the discharge gap 8 having a length not exceeding 5 mm and filled with a mixture of helium and hydrogen under pressures of 100, 150 and 200 Torrs respectively. The vertical segment has the same meaning as that shown in FIG. 4.

From FIG. 16 it is seen that the smaller the overlapping area for both electrodes 1 and 2 the higher the positive resistance will be.

In the arrangement of FIG. 15, the inner and outer electrodes 1 and 2 respectively are disposed in coaxial relationship but different in shape from each other. Therefore the current-to-voltage characteristic of the glow discharge is different between the half-cycle of the source 31 having the inner electrode 1 acting as a cathode and that having the outer electrode acting as an anode as shown in FIG. 17. In FIG. 17, the axis of ordinates represents a discharge voltage V and the axis of abscissas represents a discharge current I. When the inner electrode 1 acts as the cathode, the discharge current I is forwardly and rearwardly changed along a straight line 130 shown in FIG. 17 and has a maximum value of $I_1$. In the next succeeding half-cycle the outer electrode 2 takes over the cathode and the current is forwardly and rearwardly changed along a straight line 131 shown in FIG. 17. In the latter case, the current has the absolute maximum value $I_2$ different from that of the current $I_1$ flowing in the just preceding half cycle of the source 31. Both straight lines have the same absolute values of a voltage $V_o$ at a null current. Thus the resulting characteristic becomes unsymmetric to permit a zero-phase sequence component of a current to flow through the AC source 31. This is objectionable to the source 31. Further the inner electrode 1 is free at one end but the outer electrode 2 includes no free end. This results in the occurrence of thermal strains in the outer electrode 2 during the glow discharge.

These objections can be eliminated by still another modification of the present invention shown in FIG. 18. In the arrangement illustrated, a first electrode 1 in the form of a hollow cylinder having one end closed with a flat disc opposes a second electrode 2 identical to the first electrode to form a discharge gap 8 having a predetermined spacing or gap length of d between the opposite closed end surfaces.

A flow confining tube 20 or 21 of the double wall type inserted into the second or first electrode 2 or 1 respectively includes a central tubular portion extending on the longitudinal axis of the corresponding electrode, a radially extended end wall to form a predetermined gap between the same and the internal closed end surface of the electrode and a peripheral wall extending in parallel to the internal peripheral surface of the latter to form also a predetermined annular gap therebetween. Each electrode 1 or 2 is provided on the open end portion with an outlet duct 18 or 17 communicating with the flow path formed therein while annular blind cover disc 23 or 22 is rigidly inserted into the annular gap between the peripheral surface of the electrode 1 or 2 and the outerwall of the tube 21 or 20 at the open end. The purpose of the flow confining tubes 20 or 21 is to cause a fluid to be heated to enter first the central tubular portion as shown at the arrow A or C in FIG. 18 and flow along the internal surface of the corresponding electrodes at an increased speed to enhance the heat transfer between the fluid and the electrode and also to enable the fluid to be instantaneously heated. The heated fluid then flows out from the outlet duct 18 or 17 as shown at the arrow B or D in FIG. 18.

Then the first and second electrodes 1 and 2 respectively are snugly fitted into individual supporting rings 14 and 13 which are hermetically connected to both ends of circular enclosure 9 through annular seal fittings 10 and 11. In this way both electrodes 1 and 2 are supported in a cantilever manner to the supporting members 14 and 13 and the substantiall portions thereof are coaxially disposed within the enclosure 9 to form the space 81 that is then filled with a dischargeable gas such as previously described.

As in the arrangement shown in FIG. 11 or 15, the AC source 31 is connected across the electrodes 1 and 2 through the terminals 6 and 5 connected thereto respectively.

In the arrangement of FIG. 18 it is noted that those portions of both electrodes 1 and 2 superposing each other as designated by the reference character 1 is made smaller in area than that portion of each electrode on which the glow discharge occurs. In the example illustrated the glow discharge occurs on each of the electrodes 1 and 2 throughout the surface.

The arrangement of FIG. 18 is characterized in that the electrodes 1 and 2 formed to be symmetric face each other with the predetermined gap 8 formed therebetween. This results in a symmetric glow discharge characteristic as shown in FIG. 19. In FIG. 19 similar to FIG. 17, the characteristics 132 and 133 are substantially symmetric and have respective discharge currents $I_1$ and $I_2$ equal in absolute value to each other.

Also, as the electrodes 1 and 2 are supported in a cantilever manner to the annular supporting discs 14 and 13 respectively, the electrodes are prevented from breaking due to thermal stains.

It will readily be understood that the gap 8 between both electrodes 1 and 2 should be dimensioned so that the electrodes are prevented from contacting each other due to thermal expansions thereof in operation.

As in the arrangement of FIG. 15, an AC voltage across the source 31 is applied across the electrodes 1 and 2 to cause a glow discharge between the opposite surfaces thereof while a fluid to be heated enters the interiors of the electrodes 1 and 2 as shown at the arrows A and C in FIG. 18. Then the fluid flows through spacing formed between each electrode and the flow confining tube 21 or 22 to be heated with heat generated on the electrode 1 or 2 due to the glow discharge. Thereafter the heated fluid flows out from each outlet duct 19 or 17.

FIG. 20 illustrates a modification of the arrangement shown in FIG. 18. As shown in vertical section in FIG. 20A, the electrodes 1 and 2 have identical structure and are opposed somewhat offset from each other to form a predetermined discharge gap 8 therebetween. As seen in side elevational views of FIGS. 20B and 20C, the electrodes 1 and 2 are in the form of rectangular boxes and therefore discharge surfaces thereof are rectangular and flat. Then each electrode is provided on the rear surface with a pair of inlet and outlet tubes.

In other respects, the arrangement is substantially identical to that shown in FIG. 18. The electrodes 1 and 2 include the discharge surfaces identical in shape to each other and are of the cantilever type so that the arrangement exhibits the same results as that shown in FIG. 18.

In the arrangements of the present invention shown in FIGS. 15, 18 and 20 the electrode material and impurities such as metallic oxides included in the electrodes might be scattered in the discharge gap during the glow discharge and stick to that surface portions of the enclosure 9 facing the electrodes 1 and 2. This sticking of such metallic materials to the enclosure might lead to not only a danger that the seal fitting 10 and 11 are short-circuit with each other through the stuck electrode materials and impurities but also to a fear that, if the scattered impurities again adhere to the electrodes that the glow discharge will have transited to an arc discharge.

Figure 21:
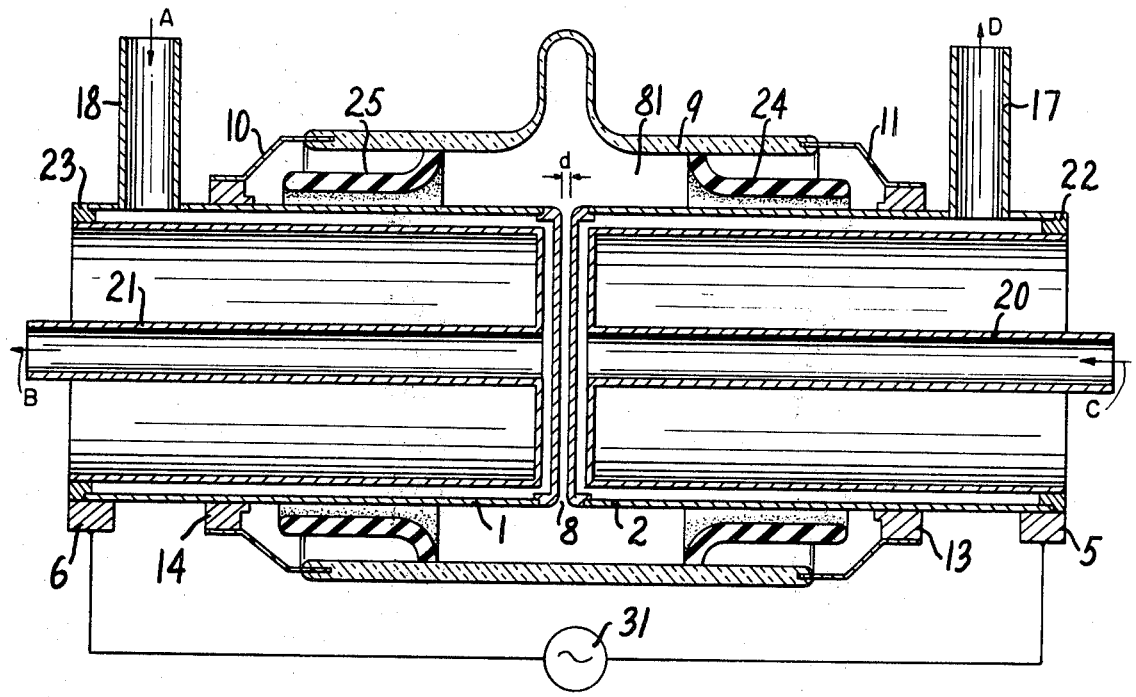
FIG. 21 is a view similar to FIG. 18 but illustrating still another modification of the present invention.

The present invention also contemplates to eliminate the danger and fear as above described, by the provision of the arrangement shown in FIG. 21. The arrangement illustrated is different from that shown in FIG. 18 only in that in FIG. 21 a pair of annular shields 24 and 25 one for each electrode, are disposed to surround the corresponding electrodes and face at least the internal surface portions of the enclosure 9 by having flare ends thereof fixedly secured to the internal surface portions of the enclosure 9 respectively. Each shield 24 or 25 includes a substantial portion parallel to the associated electrode and ending short of the adjacent annular supporting disc 13 or 14. The shields 24 and 25 may be of an electrically insulating or conductive material.

In operation when the electrode material and the impurities are emitted from the electrode 1 or 2 and scattered in the discharge gap, they stick to that surface of each shield 24 or 25 facing the associated electrode and are prevented from adhering to that inner surface portion of the enclosure 9 covered with the shield 24 or 25. Also the shield is effective for preventing the scattered electrode material and impurities from again adhering to the associated electrode.

Figure 22:
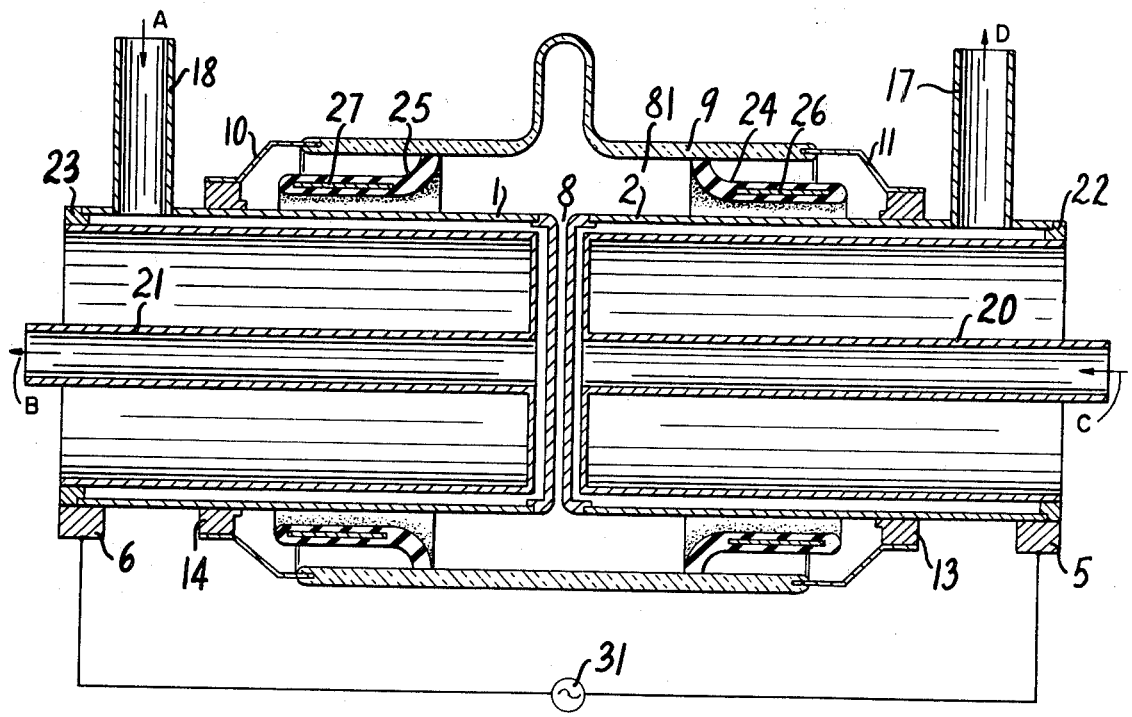
FIG. 22 is a view similar to FIG. 18 but illustrating a modification of the arrangement shown in FIG. 21.

The arrangement illustrated in FIG. 22 is different from that shown in FIG. 21 only in that in FIG. 22 a pair of annular electrodes 26 and 27 are buried in the annular shields 24 and 25 formed of an electrically insulating material respectively. Then a suitable voltage is applied to the annular electrode 26 and 27 whereby the scattered metallic materials are apt to adhere to the shields 24 and 25.

FIG. 23 shows another modification of the arrangement illustrated in FIG. 21. In FIG. 23 the electrodes 1 and 2 are in the form of hollow flat discs and disposed in opposite relationship to form the discharge gap 8 having a predetermined gap length of d therebetween.

The seal fitting 10 in the form of a short hollow cylinder has one end fixedly secured to the peripheral portion of that surface of the electrode 1 remote from the electrode 2 and the other end in the form of a flange to an enclosure portion 91 in the form of an annulus. Then an annular shield disc 28 of electrically insulating material is located between the annular enclosure portion 91 and the peripheral portion of the electrode 1 by having a fitting perpendicular to the same and connected to the outer peripheral surface of the seal fitting 10. The sealing fitting 11, an enclosure portion 92 and a shield 29 identical to the components 10, 91 and 28 respectively are operatively coupled in the same manner to the electrode 2.

A toroidal metallic enclosure portion 93 of double L-shaped cross section is hermetically connected to the annular enclosure portions 91 and 92 to form a hermetically closed space 81 in the form of a toroid.

As shown in FIG. 23, a feed water tube 18 and a drain tube 19 project in spaced relationship from that surface of the electrode 1 remote from the electrode 2 and a pair of deflector or baffle plates 30 and 32 are disposed in the interior of the electrode 1 so as to direct a liquid to be heated toward the peripheral portion thereof and enter the fluid into the drain tube 19 after it has flowed along the heated surface of the electrode 1 to be heated. Also a feed water tube 18' and a drain tube 17 similarly project from the electrode 2 and a pair of baffle plates 33 and 34 are similarly disposed within the hollow electrode 2.

If desired, the shield 28 and 29 may be formed of any suitable metallic material. In the latter case, the shields 28 and 29 are suitably insulated from the associated electrodes 1 and 2 respectively.

Further the present invention contemplates to prevent the occurrence of electric shock-accidents through the heated liquid such as water.

Figure 24:
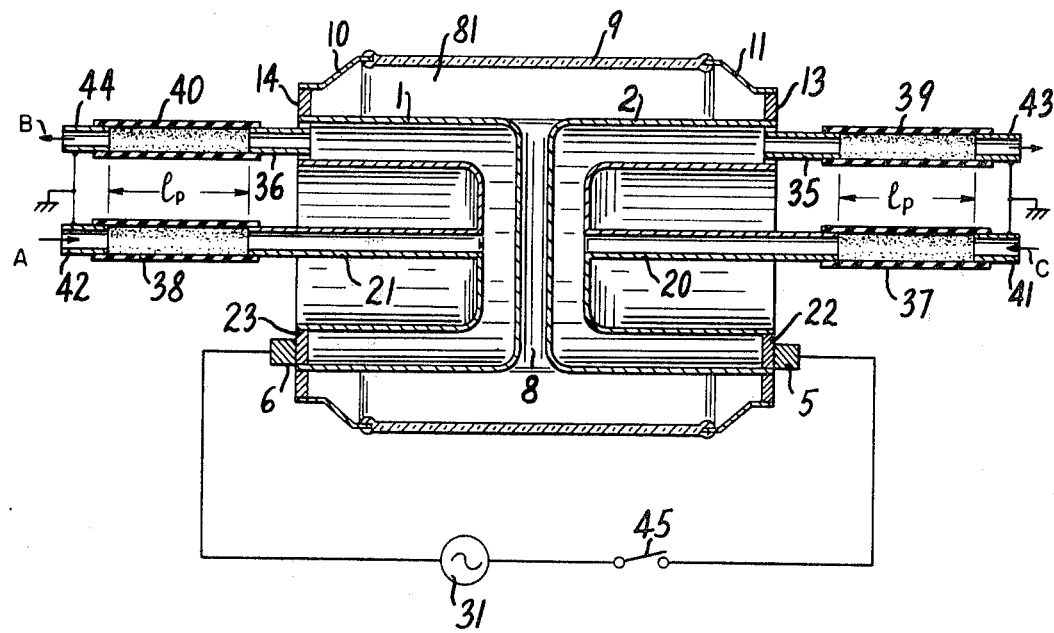
FIG. 24 is a view similar to FIG. 18 but illustrating still another modification of the arrangement shown in FIG. 21.

The arrangement illustrated in FIG. 24 is substantially similar to that shown in FIG. 22 except for the provision of means for preventing the user from receiving electric shocks. As shown in FIG. 24, the control tubular portion of the flow confining tube 20 or 21 is connected to an electrically insulating tube 37 or 38 that is, in turn, connected to metallic inflow tube 41 or 42.

The outlet of the flow confining tube 20 or 21 is connected to connecting tube 35 or 36 subsequently connected to an electrically insulating tube 39 or 40 that is, in turn, connected to a metallic outflow tube 43 or 44.

The metallic tubes 41 and 43 are electrically connected together to ground as do the metallic tube 42 and 44.

It has been found that an end-to-end distance $l_p$ between the central tubular portion of the flow confining tube and the inflow tube or between the connecting tube and the outflow tube, that is to say, a length of the insulating portion should be equal to or less than a predetermined magnitude dependent upon a voltage applied across the electrodes, a resistivity of the particular liquid to be heated, a cross sectional area of the tube etc.

The arrangement of FIG. 24 is operated as follows: A switch 45 is closed to apply an AC voltage from the source 31 across the electrodes 1 and 2. This causes the flow confining tubes 20 and 21, and the connecting tubes 35 and 36 to be put at a certain potential relative to the ground potential. For example, in glow discharge heating apparatus having a discharge input of about 8 kilowatts, the AC source 31 is required to supply to the heating apparatus an AC voltage having the effective value of 200 volts so that the tubes 20, 21, 35 and 36 are put at a voltage having the effective value of 200 volts.

On the other hand, the metallic inflow tubes 41 and 42 and the metallic outflow tubes 43 and 44 are connected to ground so that the particular liquid flowing into or out from the extremities thereof is put at a null potential. This ensures that electric shock accidents are prevented from occurring through the liquid.

More specifically, the source voltage is applied across the electrodes 1 and 2 to cause a glow discharge therebetween. Heat generated during the glow discharge heats the liquid. When the heated liquid flows within the apparatus, the same reaches any of the tubes 41, 42, 43 and 44 where it is put at the ground potential. This ensures that the user is maintained safe.

Under these circumstances the electrodes 1 and 2 rapidly transfers heat to the liquid flowing within the interiors thereof to prevent the electrodes 1 and 2 from effecting an abnormal temperature rise whereby the stable glow discharge is sustained.

However, as a potential difference having the effective value of 200 volts occurs between the inflow and outflow tubes 41, 42 and 43, 44 and the confining and connecting tubes 20, 21 and 35, 36, the insulating tubes 37, 38, 39 and 40 must have a dielectric strength for withstanding a voltage having the effective evalue of 200 volts. In this connection, it is required to consider a leakage current flowing to ground through the liquid, in addition to the surface status of the insulating tubes.

In the arrangement of FIG. 24 applied to a water warmer operated with the source voltage of 200 volts, the same is obligated to be provided with a leakage breaker. Leakage breakers are responsive to the leakage current in excess of the predetermined magnitude flowing through the inflow and outflow tubes 41, 42 and 43, 44 to ground to be continuously operated to prevent the source voltage from being applied across the electrodes 1 and 2. Accordingly, it is required to impart to the length $l_p$ of the insulating portion a value sufficient to limit the leakage current to a certain value or less.

Assuming that each of the insulating tubes 37, 38, 39 and 40 has a cross sectional area of flow path designated by S and a liquid to be heated such as water has a resistivity designated by $\rho$, the insulating portion presents a resistance $R_l$ before the liquid expressed by $$R_l = \rho \frac{l_p}{S} \tag{4}$$

Also assuming that each of the insulating tubes 37, 38, 39 and 40 has a surface resistance sufficiently large as compared with the resistance of the liquid, the leakage current $I_l$ may be expressed by $$I_l = \frac{V_l}{R_l} = V_l \frac{S}{\rho l_p} = \frac{V_l S}{\rho} \frac{1}{l_p} \tag{5}$$

where $V_l$ designates a voltage across the liquid located in the insulating portion having the length of $l_p$. Accordingly, the leakage current $I_l$ is inversely proportional to the length $l_p$ with the voltage $V_l$, the cross sectional area S and the resistivity $\rho$ remaining unchanged.

Figure 25:
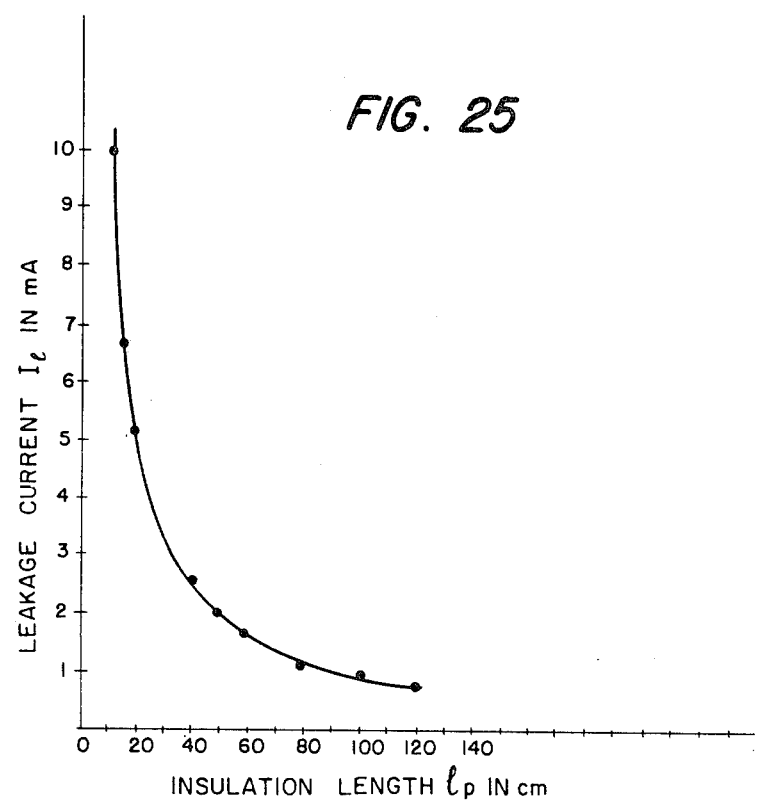
FIG. 25 is a graph illustrating a leakage current calculated with the arrangement shown in FIG. 24.

FIG. 25 a graph illustrating the relationship between the length $l_p$ of the insulating portion and the leakage current $I_l$ on the basis of the above two expressions (4) and (5) and with $V_l=200$ volts, $S=0.636$ square centimeters (which results from the insulating tubes 37, 38, 39 and 40 having the inside diameter of 9 millimeters) and $\rho=1300$ ohms-centimeter. The resistivity of 1300 ohms-centimeter is a minimum value of a resistivity of usable water as determined by the IEC standards. In FIG. 25 the leakage current $I_l$ in milliamperes is plotted in ordinate against the length $l_p$ of the insulating portion in centimeters in abscissa.

Assuming that the particular water warmer is provided with a highly sensitive leakage breaker having a rated sensible current of 15 milliamperes, the breaker has a rated inoperative current of 7.5 milliamperes. In order to prevent this leakage breaker from being continuously operated due to a leakage current flowing through the insulating portion, the length $l_p$ of the latter is necessarily of at least 13 centimeters with used water having a resistivity of 1,300 ohms centimeter as will be seen from the curve of FIG. 25. The expression (5)

indicates that the length $l_p$ changes with the leakage current, voltage, the cross sectional area of the flow path and resistivity of the liquid. However, a length of the particular insulating portion can be estimated as above described and in accordance with the rating of a given leakage breaker, the source voltage, a resistivity of the particular liquid and the cross sectional area of the flow path.

In the arrangement of FIG. 24, the flow path of the heated liquid has been provided with the insulating tubes having the required length while each of the insulating tubes has been connected at the extremity to the metallic inflow or outflow tube that is connected to ground. Accordingly, it is ensured that any electric shock accident can be prevented from occurring through a liquid involved and still one can eliminate the insulating treatment in which electrode components are coated with an electrically insulating material. This results in simplified inexpensive apparatus and also the heat transfer from the electrode components to the liquid being rapidly effected. Therefore the arrangement of FIG. 24 is extremely advantageous in both the heat efficiency and the stability of operation.

Also glow discharge heating apparatus such as shown in FIG. 24 can be utilized to instantaneously heat a liquid, for example, water by flowing the water in a flow rate of from 1 to 10 liters per minute through the interior of the electrodes thereby to transfer thermal energy injected into the electrodes to the water. Under these circumstances, water at room temperature must be heated to a temperature of about 80° C. This results in the necessity of injecting thermal energy of at least 5 kilowatts into the electrodes. This means that, with a power source of AC 200 volts used, the effective current of at least 25 amperes must flow through the electrodes. If a discharge current becomes high and also if the discharge gap is filled with a gas under an increasing pressure then it is difficult to sustain the flow discharge. For example, the glow discharge transits to an arc discharge.

It has been found that the stable maintenance of the glow discharge is affected by the type of gas filling the discharge space. Also it has been experimentally confirmed that, by filling the discharge space with a mixture of at least helium and hydrogen, the glow discharge can be sustained without the transit to an arc discharge, even with an electric power required for heating the particular liquid, that is to say, a discharge current as high as possible.

This will now be described in conjunction with FIG. 24. Various experiments were conducted with the discharge space 81 filled with an inert gas heavier than argon under a pressure ranging from 50 to 200 Torrs. The result of experiments indicates that the glow discharge is difficult to spread and that an increase in glow current causes a contraction of a positive column included in the glow discharge to move the glow discharge about on the electrodes 1 and 2. Thus the glow discharge is put in its unstable state so that it is apt to transit to an arc discharge. The mean value of the glow current in excess of 5 amperes has caused the glow discharge to transit to an arc discharge.

With neon used, relatively stable glow discharge has occurred under a gas pressure not higher than 70 Torrs. Under a gas pressure of 100 Torrs, however, the glow discharge has been relatively stable at an effective current up to about 20 amperes. Upon the effective current exceeding 20 ampere, the positive column has been contracted. This might cause the glow discharge to transit to an arc discharge.

Further, when an inert gas used has been heavier than neon, the scatter from the electrodes 1 and 2 has increased in amounts with the result that the electrodes 1 and 2 are violently consumed while insulating materials such as glass forming the enclosure 9 is sharply deteriorated in electrical insulation qualities because metallic materials scattered from the electrodes 1 and 2 stick thereto. As a result, the useful life of the glow discharge heating apparatus has been greatly reduced.

From the foregoing it is summerized that, with the arrangement of FIG. 24 used as a heating apparatus for instantaneously heating water, it is required to sustain stably the glow discharge under a relatively high pressure of 50 Torrs or more and still at a high current exceding 25 amperes at an AC voltage of 200 volts.

Also from the foregoing it has been found that it is desirable to fill the discharge space 81 with a chemically stable, light inert gas and suitable examples of the inert gas involve helium and hydrogen.

In the arrangement of FIG. 24, however, it has been seen that, with helium filling the discharge space 81, the flow discharge spreads throughout the surface of the electrodes 1 and 2 at low current because of a small current density and that electrical energy of the glow discharge entering the electrodes 1 and 2 amounts only to about 2 Killowatts. Also in a glow discharge caused in an atmosphere of helium, its positive column has been contracted upon a pressure of helium increasing to 150 Torrs to increase a current density for the glow discharge. Thus the glow discharge has been moved about on the electrodes and become unstable. The glow discharge will often transit to an arc discharge.

Figure 30:
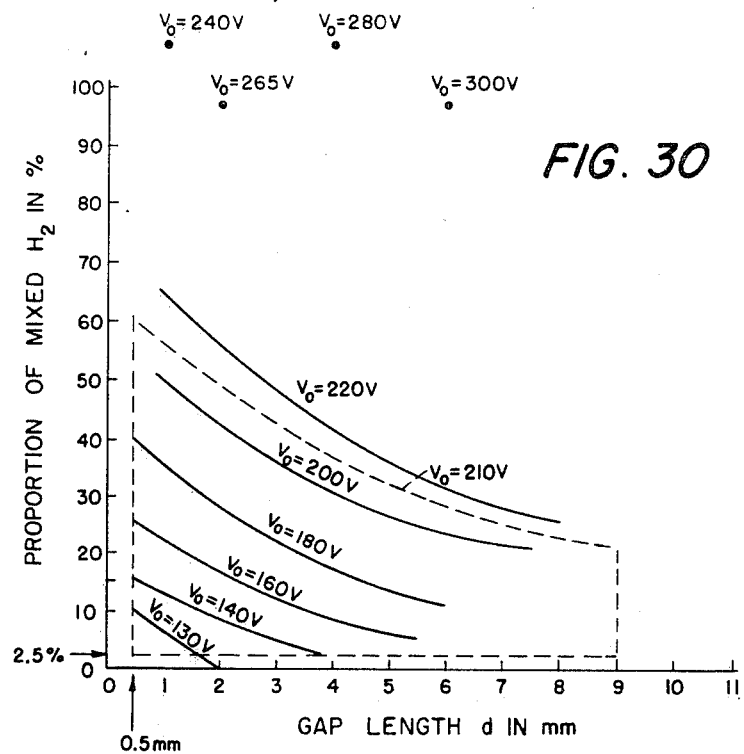
FIG. 30, 31 and 32 is graphs illustrating how the glow hold minimum voltage is changed with a proportion of mixed gases and a discharge gap-length.
Figure 31:
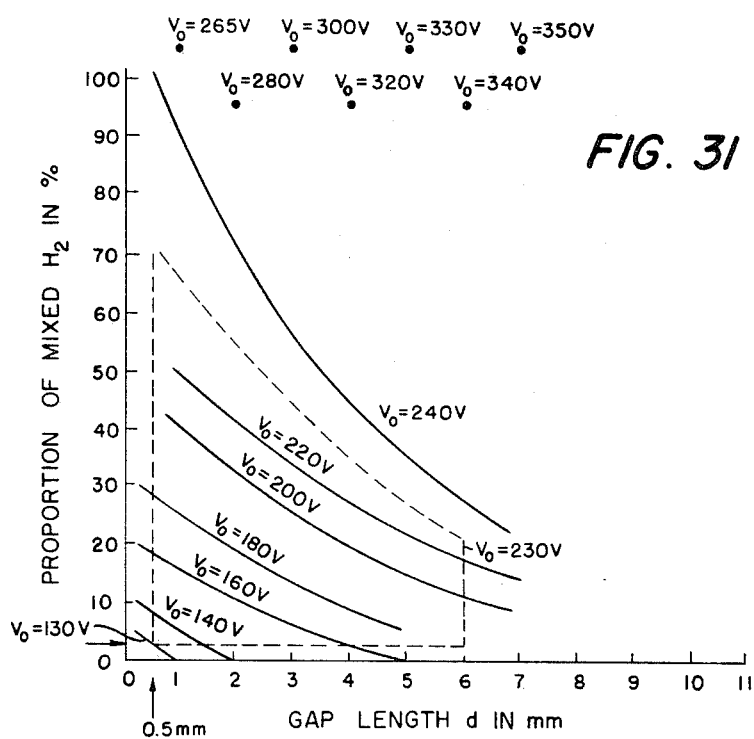
Figure 32:
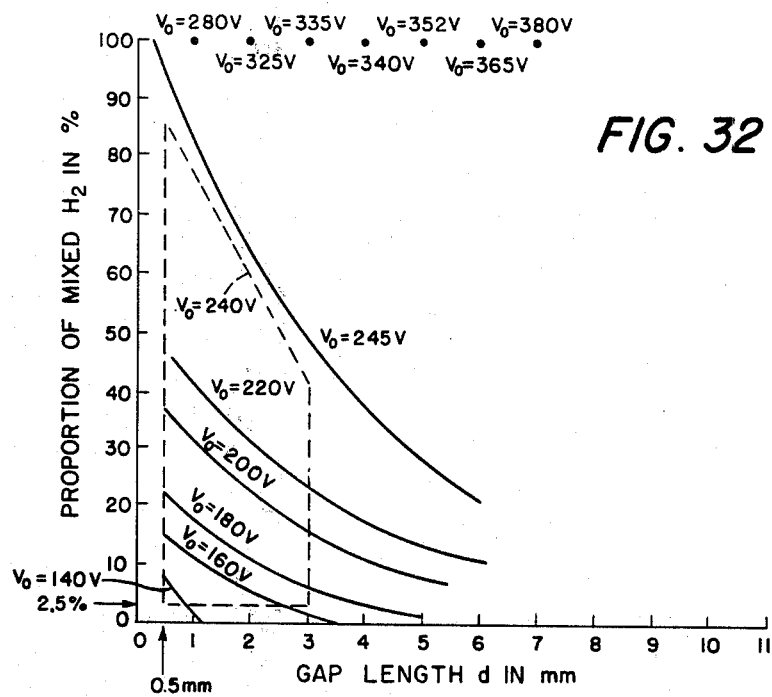

On the other hand, a glow discharge in an atmosphere of hydrogen has made a discharge hold minimum voltage Vo equal to at least 240 volts as shown in FIGS. 30, 31 and 32 which will be described hereinafter. Therefore, it has been difficult to cause a glow discharge having an electric power of 5 kilowatts or more by using an AC source with 200 volts.

It has been found that, in order to manufacture glow discharge heating apparatus requiring at least 5 kilowatts with an AC voltage of 200 volts, it is optimum to employ a mixture of helium (He) and hydrogen ($H_2$) as a filling gas.

Figure 26:
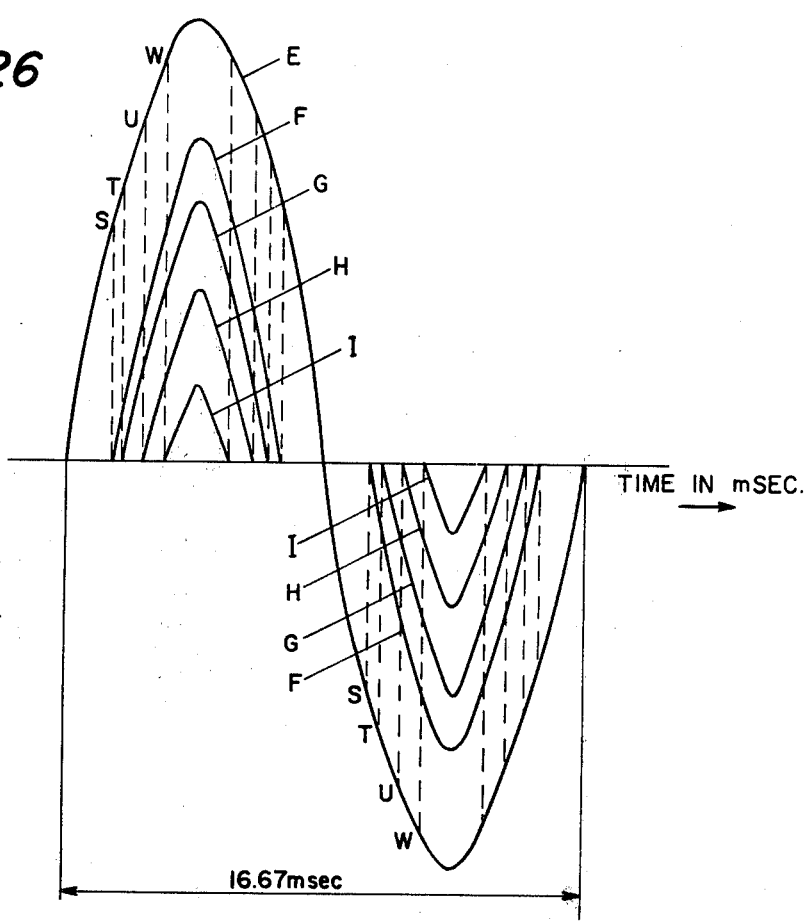
FIG. 26 is a graphical representation of voltage and current waveforms developed in the arrangement of FIG. 24 filled with a mixture of helium and hydrogen.

When the arrangement of FIG. 24 is filled with a mixture of helium and hydrogen under a pressure of 100 Torrs, and applied with an AC voltage of 60 Hertz having a waveform E shown in FIG. 26, a glow current flowing therethrough is changed in accordance with a proportion of hydrogen to helium as shown at current waveforms F, G, H and I in FIG. 26. FIG. 26 shows the voltage and current waveforms in one cycle of the source voltage. The current waveforms F, G, H and I have been plotted for a gaseous mixture including 5, 10, 30 and 50% by volume of hydrogen and the balance, helium respectively.

Figure 27:
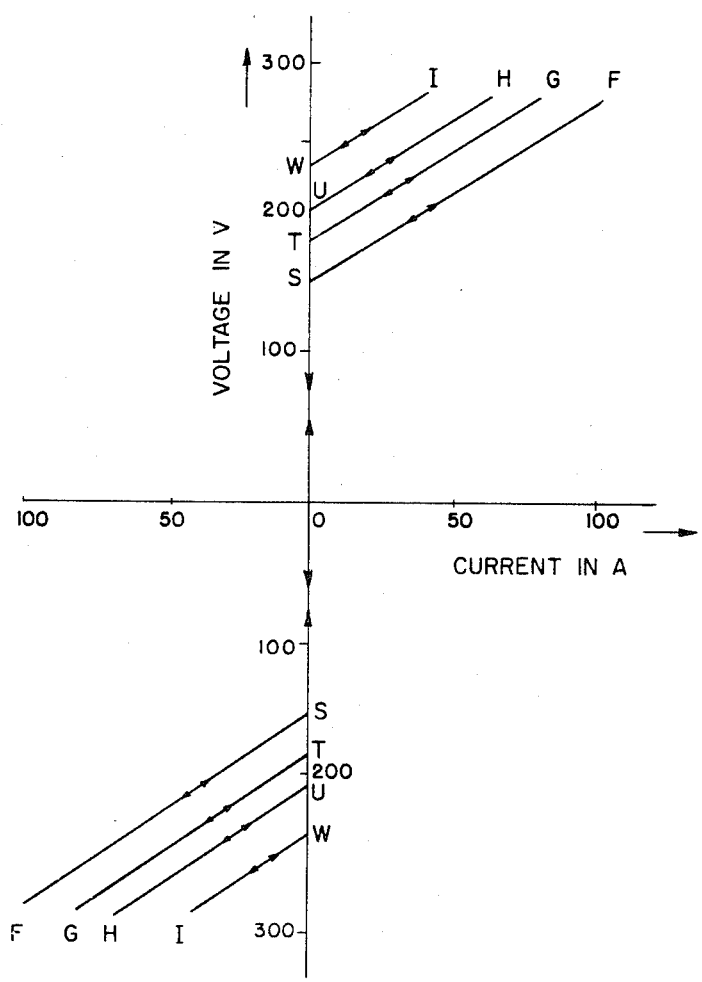
FIG. 27 is graph illustrating the current-to-voltage characteristics of glow discharges occurring in the arrangement of FIG. 24 filled with mixtures of helium and hydrogen having different proportions thereof.

Also the glow discharge exhibits the current-to-voltage characteristic dependent upon the proportion of the hydrogen to the helium as shown in FIG. 27 wherein a voltage in volts is plotted in ordinate against a current I in amperes in abscissa and like reference characters have been employed to identify the helium-hydrogen mixtures identical to those designated in FIG. 26. As shown in FIG. 27, each of the current-to-voltage characteristics is substantially rectilinear. By calculating both values of glow voltages S, T, U and W through the extrapolation and slopes of respective characteristic curves, the glow voltage Vg may be approximately expressed by $$Vg = V_o + RI$$

where $V_o$ designates a glow discharge hold minimum voltage designated by S, T, U or W, and R designates the slope of the characteristic called the positive characteristic R. As is well known, the voltage $V_o$ is expressed by $V_o = Em \sin \omega t$ where Em designates the peak value thereof and $\omega$ designates an angular frequency of the source voltage. To calculate a discharge power P from the above expression for $V_o$ referring to FIG. 26 gives $$P = \frac{2}{TR} \int_t^{\frac{T}{2}-t} (Em \sin wt - V_o) Em \sin wt \, dt =$$

$$\frac{2Em}{TR}\left\{ \tfrac{1}{4}TEm - \frac{Em}{w}\sin^{-1}\frac{V_o}{Em} - \frac{V_o}{w}\cos\left(\sin^{-1}\frac{V_o}{Em}\right)\right\}$$

where T designates a period of the source voltage. The discharge voltage is thermal energy entering the electrodes 1 and 2 due to the glow discharge.

Assuming that the source voltage has its frequency of 60 hertzs and 200 volts or the peak value of $Em = \sqrt{2}\,200 \simeq 280$ volts, its period is of 16.67 milliseconds and its angular frequency is of 377 radius per second. By using those figures in the expression for the discharge power, the glow discharge hold minimum voltage $V_o$ relates to the positive characteristic R as shown in FIG. 28 wherein the positive resistance R in ohms is plotted in ordinate against the glow hold minimum voltage $V_o$ in volts in abscissa with the parameter being the discharge power or thermal energy P.

Figure 28:
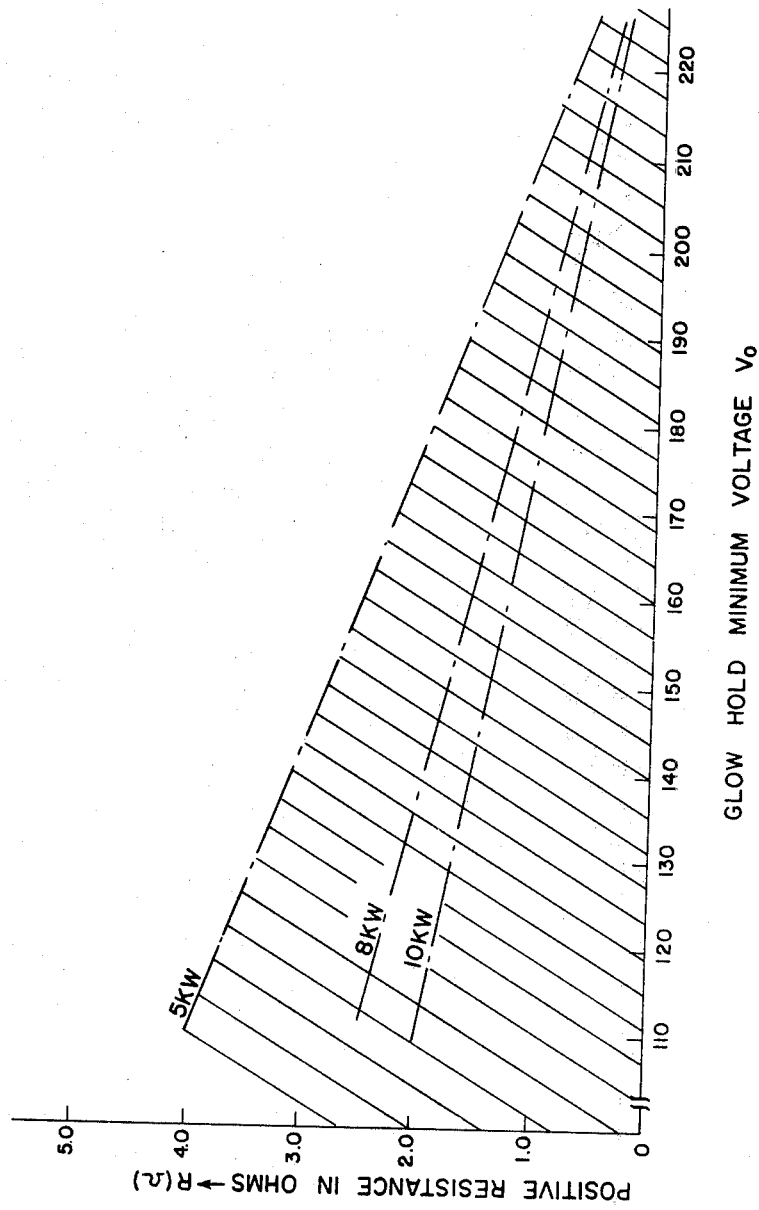
FIG. 28 is a graph illustrating the theoretical relationship between a glow hold minimum voltage and quantity of input heat to an associated electrode resulting from the glow discharge.

From the FIG. 28 it is seen that, in order to provide the thermal energy not less than 5 kilowatts, the $V_o$ and R may lie in a hatched region as shown in FIG. 28 defined by a line for the power of 5 kilowatts, and both coordinate axes.

Also the glow hold minimum voltage $V_o$ is determined by a pressure of a filling gas and the gap length d between the electrodes 1 and 2 while the positive characteristic R is determined by the configuration of the electrodes of the overlapping area $S_o$ for both electrodes 1 and 2 and the pressure of the filling gas.

Figure 29:
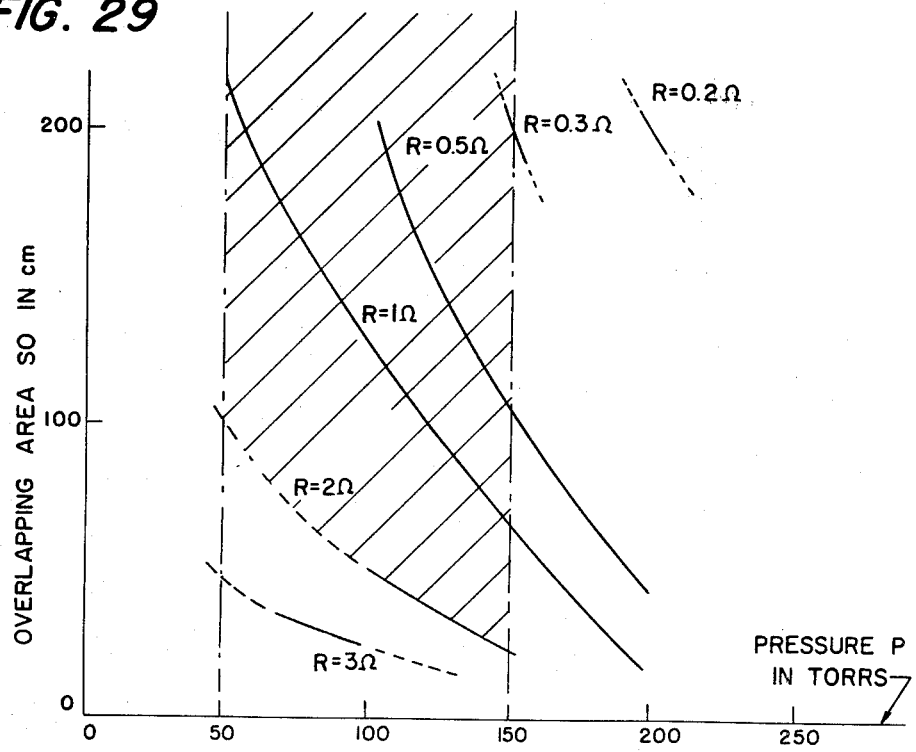
FIG. 29 is a graph illustrating the relationship between an overlapping area for both electrodes and a pressure of a filling gas.

By changing a relative diameter M of one to the other of the electrodes 1 and 2 to vary the overlapping area $S_o$ therefor and also by changing the pressure of the filling gas, the positive characteristic R is varied as shown in FIG. 29 wherein the overlapping area $S_o$ in square centimaters is plotted in ordinate against the pressure of the filling gas in Torrs in abscissa with the positive characteristic R variously changed. In FIG. 29 solid line indicates measured values and dotted line indicates values estimated from the associated measured values.

From FIG. 29 it is seen that, under a gas pressure less than 50 Torrs, a current density for the glow discharge is low and the supply of a discharge power or a heat input in excess of 5 kilowatts to the electrodes requires an increase in overlapping area S. This has encountered a problem with apparatus portability because the electrode area must increase.

On the other hand, a gas pressure in excess of 150 Torrs causes the discharge input to the electrodes to increase to at least 5 kilowatts, resulting in a glow current of at least 25 amperes. Under these circumstances a positive column involved is contracted and the particular glow discharge is moved about on the electrodes. This might sometimes cause the glow discharge to transit to an arc discharge.

With the gas pressure further increased to 200 Torrs or higher, a positive column involved is contracted at a glow current of at least 5 amperes until the transit to an arc discharge occurs.

As an example, it is assumed that it is impossible to decrease the glow hold minimum voltage $V_o$ to 176 volts or less. Under the assumed condition, it is seen from FIG. 28 that, in order to manufacture glow discharge heating apparatus having a discharge input of at least 5 kilowatts, the pressure of the particular filling gas, the overlapping area $S_o$ and the positive characteristic R must lie in the hatched portion shown in FIG. 29 as being defined by a pair of vertical broken lines passing through the abscissas of 50 and 150 Torrs respectively and curve labelled $R = 2\Omega$.

In addition, by changing both the proportion of hydrogen to helium and the gap length d between the electrodes 1 and 2, the glow hold minimum voltage $V_o$ is varied as shown in FIGS. 30, 31 and 32 wherein the axis of ordinates represents the proportion of hydrogen to helium in percent and the axis of abscissas represents the gap length d in millimeters. The helium-hydrogen mixture is maintained under pressures of 50, 100 and 150 Torrs in FIGS. 30, 31 and 32 respectively. In these Figures the curves are labelled with the measured values of the glow hold minimum voltage $V_o$ and for pure hydrogen the measured voltages $V_o$ are denoted aside corresponding dots.

Also the gap length d less than about 0.5 millimeter between both electrodes 1 and (2) has resulted in a danger that both electrodes may contact and shortcircuit due to a pressure difference between a pressure of the particular heated liquid within either of the electrodes and that of a filling gas involved. On the other hand, an excessively large gap length d between both electrodes cause a positive column to constract to move the resulting discharge about on the electrodes until the discharge sometimes transits to an arc discharge. This might result in damage to the electrodes 1 and 2. It has been seen that the contraction of the positive column occurs with the gap length d of at least 9, 6 and 3 millimeters under the gas pressures of 50, 100 and 150 Torrs respectively.

Figure 33:
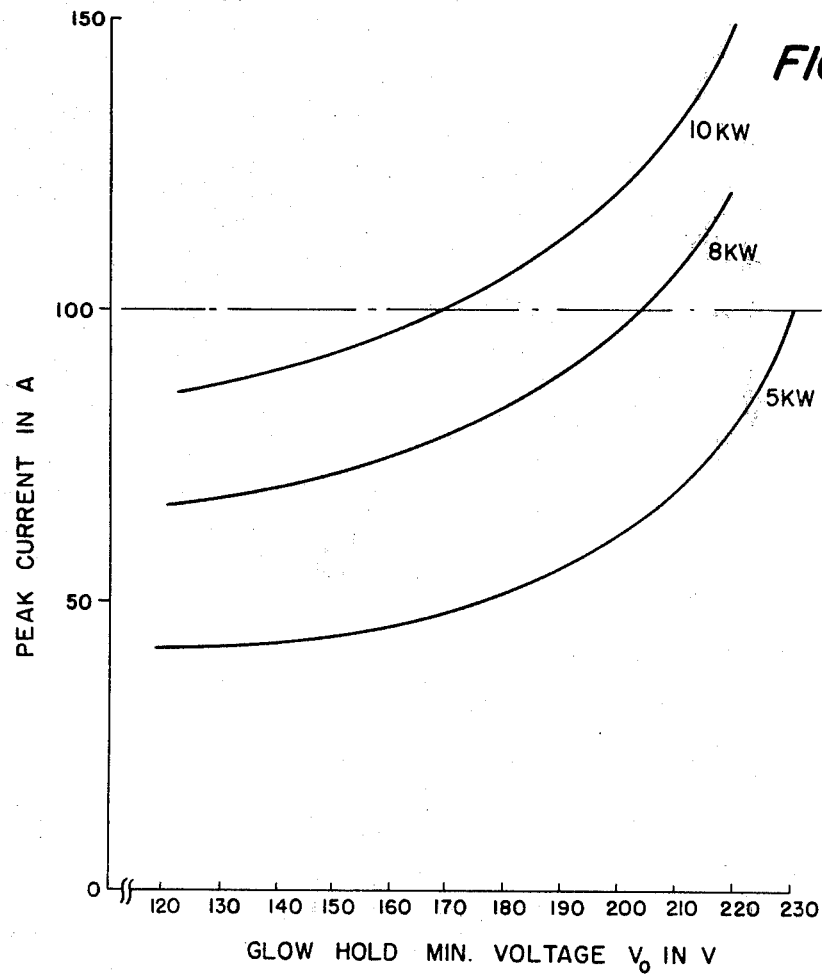
FIG. 33 is a graph illustrating the relationship between the glow hold minimum voltage and a peak discharge current.

With the proportion of hydrogen to helium decreased to 2.5% or less, the resulting glow discharge resembles that occurring in an atmosphere of pure helium. This has made it difficult to increase the discharge input to at least 5 kilowatts. Also as FIG. 29 illustrates it is difficult to decrease the positive characteristic R to at most 1, 0.5 and 0.3 ohms under gas pressures of 50, 100 and 150 Torrs respectively, and it has been difficult to increase the discharge input to at least 5 kilowatts at the glow hold minimum voltages $V_o$ of at least 210, 230 and 240 volts under the gas pressures of 50, 100 and 150 Torrs respectively as will readily be understood from the graph shown in FIG. 28. Further an increase in glow hold minimum voltage $V_o$ causes an increase in peak value of the glow current as shown in FIG. 33 wherein the peak current for the glow discharge in amperes is plotted in ordinate against the glow hold minimum voltage $V_o$ in volts in abscissa. This has resulted in the disadvantage that the resulting apparatus should be made larger.

From the foregoing it will readily be understood that the proportion of hydrogen to helium and gap length d between the electrodes 1 and 2 are desirably located in the dotted closed areas shown in FIGS. 30, 31 and 32. More specifically, the proportion of hydrogen is not less than 2.5% and the gap length d is not less than 0.5 millimeter while the voltage $V_o$ has values of 210, 230 and 240 volts dependent upon the pressure of the filling gas.

While the present invention has been described in conjunction with an AC source having a voltage of 200 volts it is to be understood that it is equally applicable to AC sources having the voltage higher than that of 200 volts, for example, the voltage of 400 volts. In the latter case, the glow current may be low by using a helium-hydrogen mixture including not less than 50% by volume of hydrogen which is effective for increasing the glow hold minimum voltage $V_o$ shown at any of the points, S, T, U and W illustrated in FIG. 27. This provides a stable glow discharge while being able to decrease the surface area of the electrodes 1 and 2. In addition, wiring leads may be fine. Therefore the resulting apparatus can be made compact.

Examples of the electrode material may involve copper, aluminum, nickel, pure ion, molybdenum, stainless steel, Kovar (Trade mark) etc. used with vacuum tubes or voltage regulator tubes. However, copper is not suitable for use in the present invention because the copper has a high current density for the glow discharge to enhance the sputtering thereby severely deteriorating the insulation of associated insulators. Also aluminum is not suitable for used in the present invention because a glow discharge involved transits to an arc discharge with a current as low as one ampere. Therefore suitable examples of the electrode material involve nickel, pure iron, molybdenum, stainless steel and Kovar (Trade mark). The electrode used with the present invention has been formed of sheet nickel or stainless steel one millimeter thick.

From the foregoing it is seen that the filling of the discharge space 8 with a mixture including at least helium and hydrogen can eliminate the transit of the glow to an arc discharge and the sputtering with a high discharge current. This gives the result that a stable glow discharge can be sustained. The reason for which the glow discharge can be prevented from transiting to an arc discharge is to remove oxides on the surface of the electrodes by the hydrogen included in the filling gaseous mixture.

The use of the helium-hydrogen mixture is also advantageous in that, only by changing the proportion of the hydrogen to the helium, the glow hold minimum voltage can be selected at will to control the discharge input to both electrodes involved as desired.

Figure 34:
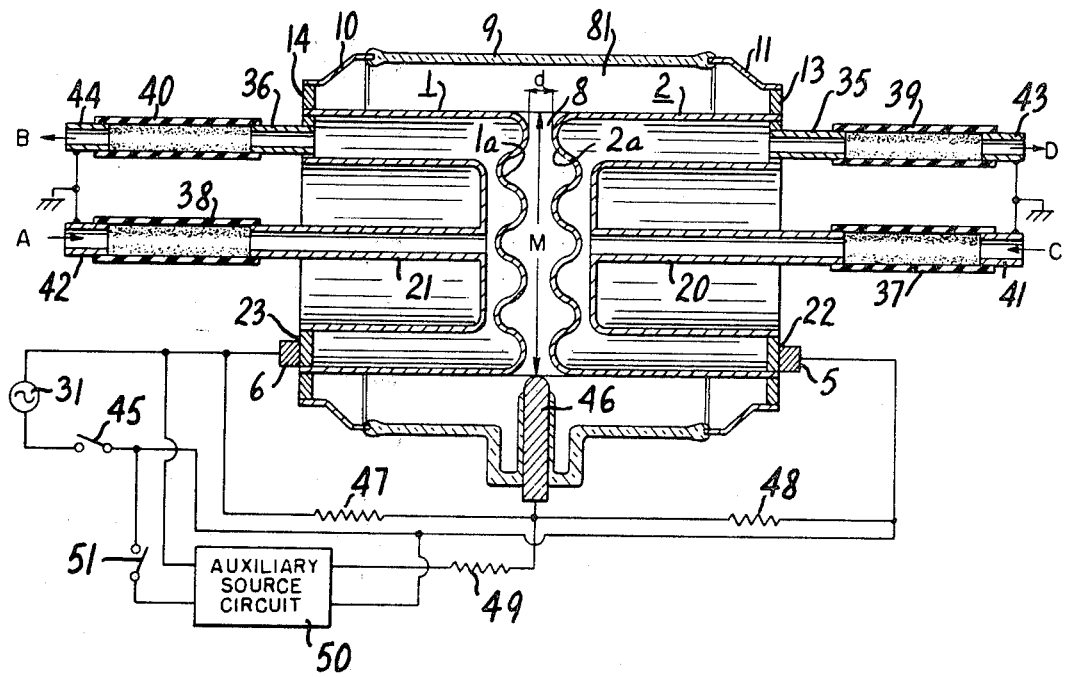
FIG. 34 is a longitudinal sectional view of a different modification of the present invention including an auxiliary electrode.

FIG. 34 shows still another modification of the present invention. The arrangement illustrated is different from that shown in FIG. 24 only in that in FIG. 34 the opposite surfaces of the electrodes 1 and 2 are corrugated to increase the surface areas of the electrodes and an auxiliary electrode 46 is operatively associated with the gap 8 formed between the electrodes 1 and 2 as will be subsequently described.

In glow discharge heating apparatus having the discharge input of 5 kilowatts, for example, the diameter M of the electrodes 1 and 2 is required to be of at least 80 millimeters and also that of the insulating enclosure 9 is necessarily of at least 100 millimeters. In other words, the larger the diameter of the electrodes the larger the enclosure 9 and therefore the seal fittings 10 and 11 will be larger. This is attended with the disadvantages that the components become excessively expensive and also a manufacturing cost is increased.

In addition, the opposite surfaces of the electrodes 1 and 2 can be forced toward each other to be crowned in response to a difference between a pressure within discharge space 81 and a pressure of a heated liquid within each electrode so that the bending of the electrodes increases proportional to the fourth power of the radium M/2 thereof. Accordingly, an increase in diameter of the electrodes may causes the electrodes 1 and 2 to contact and short circuit each other due to the crowning thereof.

To avoid this objection, the opposite surfaces of the electrodes 1 and 2 have a diametric section of corrugated shape to increase areas of the opposite electrode surfaces with the diameter of the electrodes remaining unchanged. In the arrangement of FIG. 34 each electrode 1 or 2 has the diameter M of 52 millimeters and the area of 80 square centimeters of that surface thereof opposite to the other electrode 2 or 1.

As shown in FIG. 34, the auxiliary electrode 46 is extended and sealed through the insulating enclosure 9 so as to center the gap 8 formed between the opposite corrugated surfaces of the electrodes 1 and 2 and to be substantially contacted at the free end by the adjacent portion of the edge of the gap 8.

Then the AC source 31 is connected at one end to the electrode terminal 5 through a normally open switch 45 and at the other end directly to the electrode terminal 6. The auxiliary electrode 46 is connected to the electrode terminals 6 and 5 through respective resistors 47 and 48 and also by a resistor 49 to one output of an auxiliary source circuit 50. The auxiliary source circuit 50 includes the other output connected to the electrode terminal 5 and therefore the switch 45 and is also connected to the switch 45 through another normally open switch 51 and to the other end of the AC source 31. The operation of the abovementioned circuit configuration will be described hereinafter.

With the auxiliary electrode 46 operatively associated with the discharge gap 8 as in the arrangement of FIG. 34, the electrodes 1 and 2 are called hereinafter the "main electrodes" to be distinguished from the auxiliary electrode 46.

In the arrangement of FIG. 34 a glow discharge is fired between the main electrodes 1 and 2 after which the glow discharge is smoothly spread on the corrugated surfaces 1a and 1b respectively of the main electrodes 1 and 2. Under these circumstances, a high current can enter the opposite corrugated surfaces of the main electrodes 1 and 2 as compared with pairs of discharge electrodes including the previously illustrated opposite flat surfaces. Therefore, the discharge input to the electrodes can be increased while the voltage across the main electrodes remains unchanged.

As a result, the corrugated surface of the main electrodes permits a decrease in diameter thereof attended with a reduction in diameter of each of the insulating enclosure 9 and the seal fittings 10 and 11. Accordingly a manufacturing cost can be decreased. Also the corrugated surface of the main electrode is effective for preventing main electrode contact and the crowning of the opposite surfaces thereof.

Figure 35:
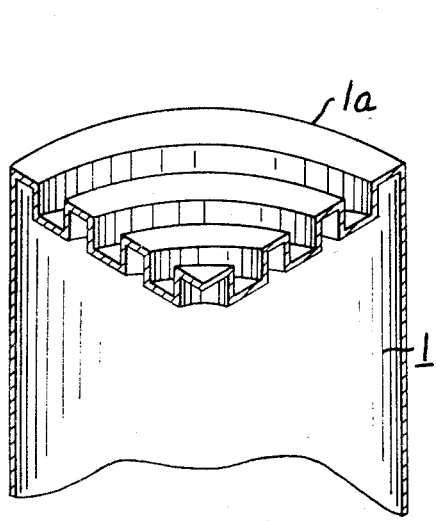
FIGS. 35, 36 and 37 are fragmental perspective views of different modifications of one of the electrodes shown in FIG. 34.

The opposite surface 1a of the main electrode 1 shown in FIG. 35 includes a plurality of grooves of rectangular cross section concentrically disposed at substantially equal intervals thereon.

Figure 36:
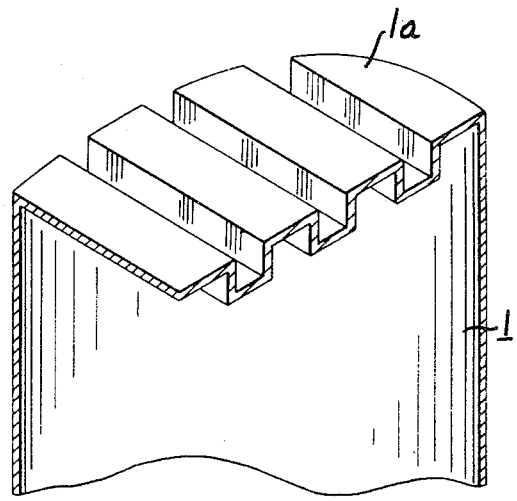

FIG. 36 shows a plurality of parallel grooves disposed at predetermined intervals on the discharge surface 1a of the main electrode 1.

Figure 37:
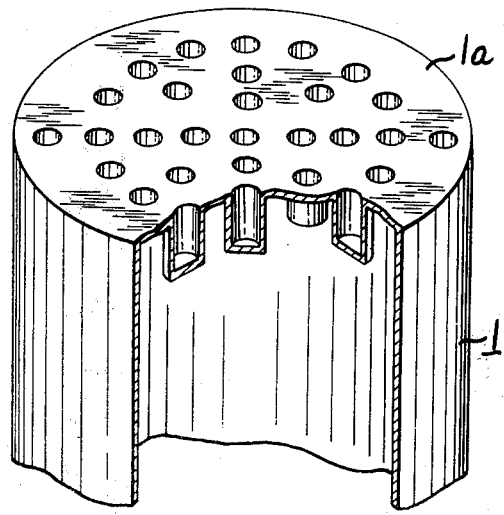

The discharge surface 1a of the main electrode 1 shown in FIG. 37 includes a plurality of cylindrical depressions disposed in a predetermined pattern thereon.

Figure 38:
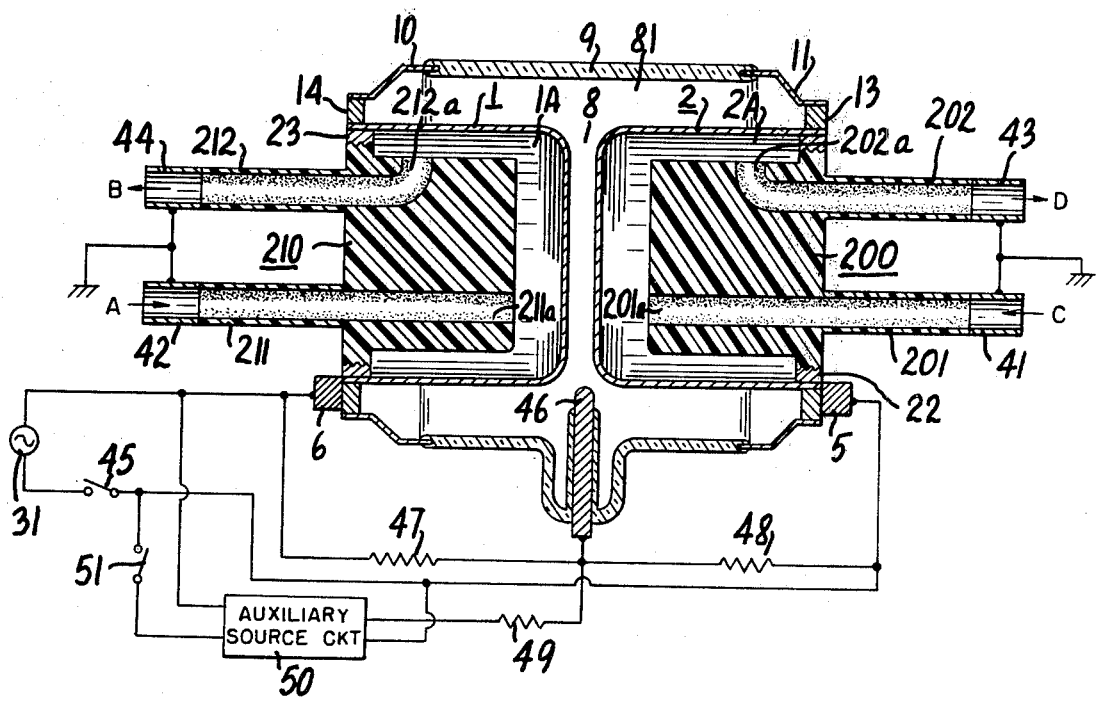
FIG. 38 is a longitudinal sectional view of modification of FIG. 34 along with an associated electric circuit.

In the arrangement shown in FIG. 38, a pair of flow confining blocks generally designated by the reference numeral 200 and 210 respectively are of the same construction and disposed in place within the main electrodes 2 and 1 to form heating spaces or flow paths 2A and 1A for a heated liquid therein respectively. The flow confining block 200 is formed of an electrically insulating material such as a synthetic resinous material and includes a feed water tube 201 and a drain tube 202 formed in parallel relationship on the exposed end surface thereof to be integral therewith and through openings 201a and 202a connected to the tubes 201 and 202 respectively. Then openings 201a and 202a open on that end surface thereof facing the inside of the gap forming surface of the main electrode 2 and a peripheral surface thereof respectively. The tube 201 and the opening 20a interconnected serves as a feed water tube opening in the flow path 2A while the tube 202 and the opening 202a interconnected serves as a drain tube also opening in the flow path 2A.

The flow confining block 210 includes a feed water and a drain tube identical to those as above described in conjunction with the flow confining block 200 and designated by like reference numeral identifying the corresponding components of the confining block 200 and added with the numeral 10. For example, the reference numeral 211 designates a feed water tube.

The flow confining blocks 200 and 210 have the exposed end portions screw threaded through the blind cover plate 22 and 23 fixed to the open end portions of the main electrodes 2 and 1 to be flush with the open ends thereof respectively.

In other respects, the arrangement is substantially identical to that shown in FIG. 34 except for the omission of the insulating tubes 37, 38, 39 and 40 shown in FIG. 34.

In the arrangement of FIG. 38, the flow confining blocks 200 and 210 can be removed from the blind cover plates 22 and 23 respectively for the purpose of inspecting or cleaning the internal surfaces of the main electrodes 2 and 1. Therefore the heating efficiency can be always maintained high.

Figure 39:
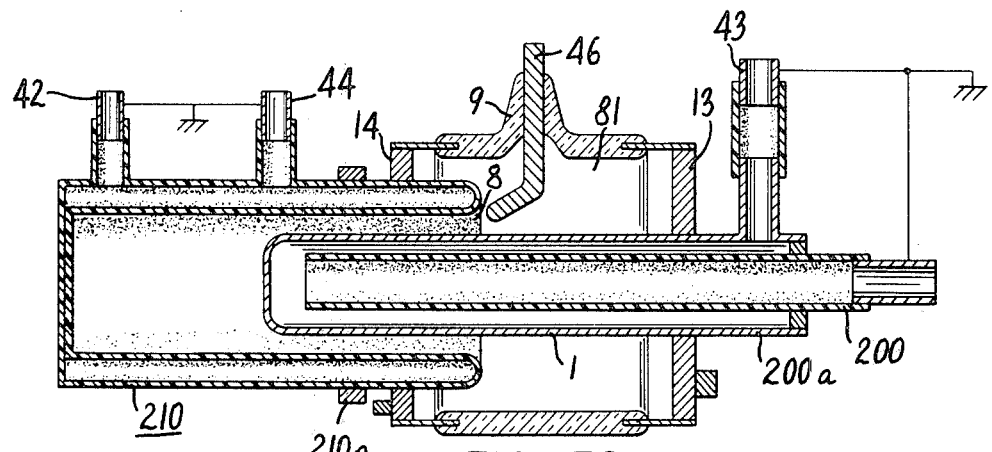
FIG. 39 is a longitudinal sectional view of another modification of the arrangement shown in FIG. 34.

FIG. 39 shows modification of the arrangement shown in FIG. 15 wherein the user has access to the heat transfer surfaces of the main electrodes as in the arrangement of FIG. 38 and an auxiliary electrode 46 is operatively associated with the discharge gap 8. As shown in FIG. 39 a flow confining tube 200 in the form of a hollow cylinder having both ends open is coaxially disposed within the main electrode 1 to form a flow path for a heated liquid therebetween. The cylindrical tube 200 is screw threaded through a screw member 200a rigidly fitted into the open end of the main electrode 1.

Similarly another flow confining tube 210 in the form of a hollow cylinder having one end closed is detachably connected to the main electrode 2 at the outwardly folded end through a screw member 210a formed internally with the tube 210 to form an annular flow path for the heated liquid therebetween.

The flow confining tubes 200 and 210 are of an electrically insulating material such as a synthetic resinous material.

As in the arrangement of FIG. 38, the flow confining blocks 200 and 210 can readily be removed from the main electrodes 1 and 2 respectively for purposes of inspection and cleaning.

In other respects, the arrangement is substantially similar to that shown in FIG. 15 except that electric shock preventing means such as above described in conjunction with FIG. 24 are provided on the feed water and drain tubes 41, 42 and 43, 44 and the auxiliary electrode 46 is operatively coupled to the gap 8 formed between the main opposite electrodes 1 and 2.

Figure 40:
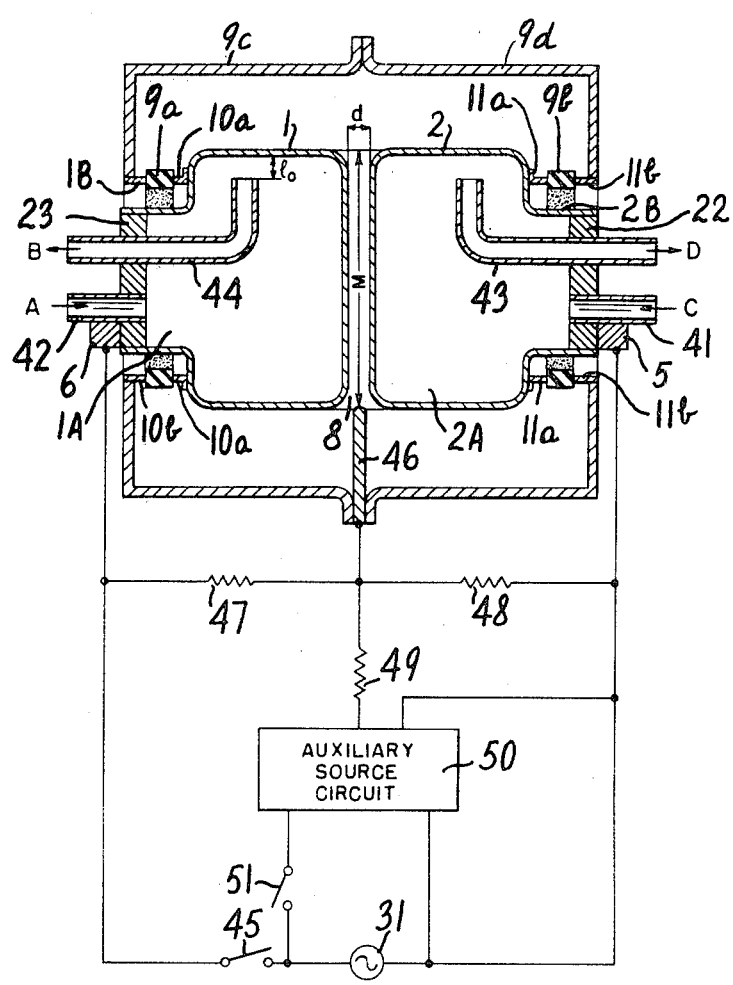
FIG. 40 is a view similar to FIG. 38 but illustrating still another modification of the arrangement shown in FIG. 34.

FIG. 40 shows a different modification of the present invention which enables decrease of the dimension of the electrically insulating enclosure and increase of the diameter of the main electrodes. In the arrangement illustrated a pair of main electrodes 1 and 2 identical to each other are horizontally disposed in opposite relationship to form a discharge gap 8 therebetween. Each of the main electrodes 1 or 2 is in the form of a hollow cylinder having one end closed and the other end portion 1B or 2B reduced in diameter. The closed flat ends of both main electrodes 1 and 2 form therebetween the gap 8 having a width or a gap length of d and a diameter of M.

Each electrode 1 or 2 includes a shoulder connected to an electrically insulating enclosure 9a or 9b in the form of a narrow annulus through a first annular seal fitting 10a or 11a. Thus the enclosure 9a or 9b encircles the reduced diameter end portion 1B or 2B of the main electrode 1 or 2. Then a cylindrical metallic shell 9c or 9d encircles in spaced relationship the adjacent main electrode 1 or 2 and includes a radially inward directed flange connected at one end to the enclosure 9a or 9b through a second annular seal fitting 10b or 11b. Both shells 9c and 9d have the other ends abutting and fixed together as by welding. Thus the shells 9c and 9d and the main electrodes 1 and 2 form therebetween an annular discharge space 81 including the gap 8 with the enclosures 9a and 9b, the seal fittings 10a, 10b, 11a and 11b.

The blind cover plate 22 or 23 is rigidly fitted into the open end of the main electrode 1 or 2. A feed water tube 41 or 42 is extended and sealed through the blind cover plate 22 or 23 and has an outlet opening substantially flush with the internal surface of the cover plate 22 or 23. Also a drain tube 43 or 44 is extended and sealed through the blind cover plate 22 or 23 and has an end portion bent into an L in order to fill a heating space 1A or 2A formed of the interior of the main electrode 1 or 2 with a liquid to be heated. The end of the L-shape tube 43 or 44 faces the uppermost portion of the internal surface of the main electrode 1 or 2 with a distance $l_o$ maintained therebetween.

Further, the auxiliary electrode 46 and an associated electric circuit are provided in the same manner as above described in conjunction with FIG. 34.

The main electrodes 1 and 2 may be of any desired shape other than the cylindrical shape as above described.

As the main electrodes 1 and 2 are of the same structure, the operation will now be described in conjunction of one of the electrodes, for example, the electrode 1.

A liquid to be heated enters the heating space 1A through the feed water tube 42 as shown at the arrow A in FIG. 40 until its liquid surface reaches a level at which the drain tube 44 opens while the liquid is heated by the main electrode 1. Thereafter the heated liquid is exhausted from the space 1A through the drain tube 44 as shown at the arrow B in FIG. 40. The outflow of the liquid causes a pressure loss across the drain tube 44 permitting the heated liquid charged in the heating space 1A to have a pressure higher than the atmospheric pressure. In keeping with this increase in pressure, the surface of the liquid within the heating space 1A is forced to be gradually raised beyond the open end of the drain tube 44 resulting in a decrease in volume of a cavity existing in the heating space 1A.

In this case, the smaller the diameter of the drain tube 44, the greater the speed of the liquid flowing through the drain tube 44. As a result, the open end of the drain tube 44 has a lower pressure than the cavity within the heating space 1A. This causes an increase in the rate at which the drain tube 44 sucks up air left within the heating space 1A.

It has been experimentally proved that the distance $l_o$ exceeding 10 millimeters causes the air phase in the heating space 1A to be too far spaced from that portion of the liquid just flowing through the open end of the drain tube 44. Therefore the heating space 1A has been difficult to be sufficiently deaerated. This means that the distance $l_o$ is preferably of at most 10 millimeters.

In other words, the distance $l_o$ is so dimensioned that, even though steam bubbles are evolved from the liquid being heated within either of the heating spaces 1A and 2A and reach the uppermost portion of the heating, spaces they can be rapidly exhausted through the drain tube 43 or 44.

After the air has been fully removed from either of the heating spaces 1A and 2A as above described, both spaces are entirely filled with the heated liquid without the steam bubbles accumulated to form a cavity therein. Otherwise a cavity not filled with the heated liquid is formed within either of the main electrodes 1 and 2 and therefore that portion thereof contacted by and located adjacent to the cavity excessively rises in temperature resulting in its failure.

The arrangement of FIG. 40 is further advantageous in that the insulating enclosures decrease in diameter and therefore are easily manufactured with low cost and mechanically strong because the enclosures surround the reduced diameter portions of the main electrodes which are encircled by the metallic shells interconnected into a unitary structure to permit a region occupied by the insulating enclosures to be extremely decreased. Further the main electrodes are insulated from the shells through the insulating enclosures respectively. Accordingly, the resulting apparatus is easy to be manufactured, inexpensive and robust while having a long useful life.

Figure 41:
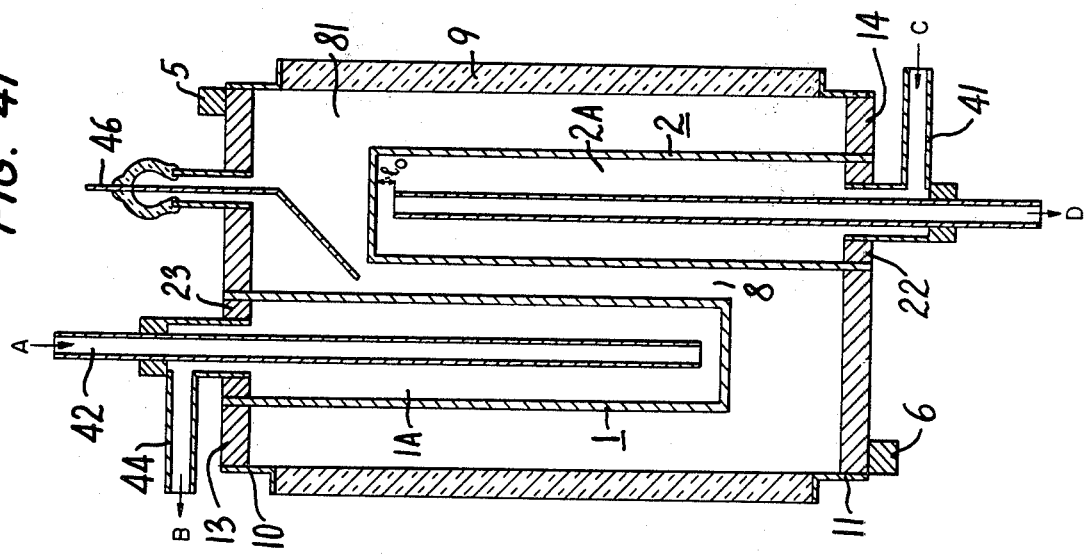
FIG. 41 is view similar to FIG. 39 but illustrating a different modification of the arrangement shown in FIG. 34.

In the arrangement shown in FIG. 41, the insulating enclosure 9 in the form of a hollow cylinder having both ends open includes a pair of upper and lower apertured cover plates 13 and 14 respectively connected to both open ends thereof through annular seal fittings 10 and 11 respectively. A pair of hollow main electrodes 1 and 2 having one end open are vertically disposed in opposite parallel relationship within the enclosure 9 to be staggered longitudinally of the enclosure and form a discharge gap 8 in a discharge space 81 defined by the enclosure 9, the seal fittings 10, 11 and the cover plates 13 and 14. The main electrodes 1 and 2 have the other open ends fixedly fitted into apertures on the upper and lower cover plates 13 and 14 to be flush with the outer surfaces thereof respectively.

The main electrodes 1 and 2 have the open ends closed with blind cover plates 23 and 22 having central openings respectively. Then a L-shaped tube 44 or 41 has one leg connected to the central opening on the blind cover plate 23 or 22 and the other leg horizontally extended to form an outflow or an inflow tube.

A feed water tube 42 extends in sealing relationship through the one leg of the outflow tube 44 and into a heating space 1A within the main electrode 1 from above the upper plate 13. Similarly, the drain tube 43 extends through the inflow tube 14 and into a heating space 2A within the main electrode 2 from below the lower plate 14.

As in the arrangement of FIG. 40, the drain tube 43 has its open end facing the inside of the closed end of the main electrode 2 through a spacing $l_o$ not greater than 10 millimeters.

As shown in FIG. 41, the inflow tube 41 has the end opening in the heating space 2A below the inlet of the drain tube 43 while the feed liquid tube 42 has the end opening in the heating space 1A below the inlet of the drain tube 44. Therefore the heating spaces 1A and 2A can be entirely filled with the heated liquid as in the arrangement of FIG. 40.

Further an auxiliary electrode 46 is operatively associated with the discharge gap 8 formed between the main opposite electrodes 1 and 2. If desired, both main electrodes may be concentrically disposed.

Figure 42:
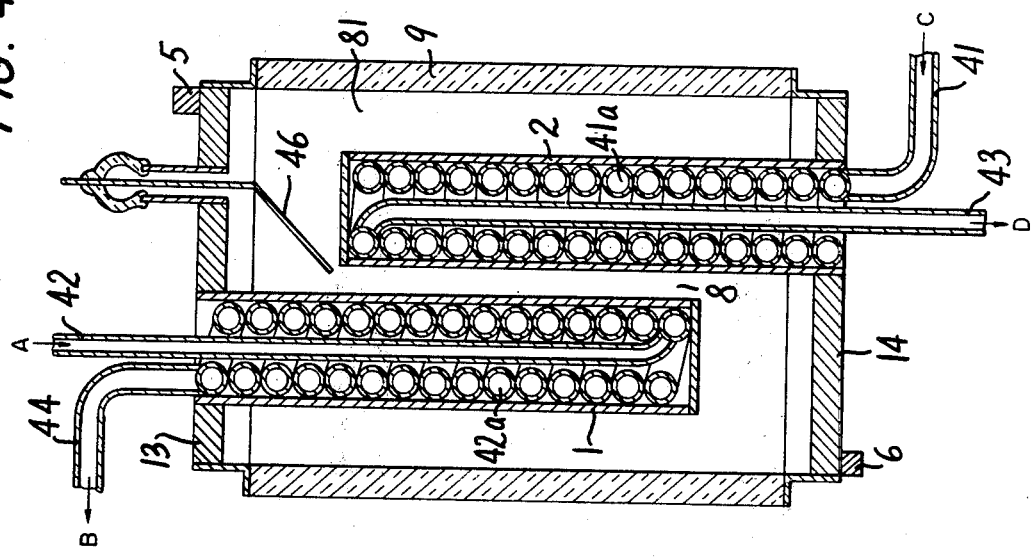
FIG. 42 is a view similar to FIG. 39 but illustrating a modification of the arrangement shown in FIG. 41.

In the arrangement shown in FIG. 42, a seamless metallic tube is closely wound into a helix 41a or 42a having the outside diameter substantially equal to the inside diameter of the main electrode 2 or 1. The helix 41a or 42a includes one end portion 43 or 42 extending through the central hollow portion thereof and the other end portion 41 or 44 bent into an L-shape. Both helices 41a and 42a are inserted into the main electrodes 2 and 1 to be brazed or welded to the internal surfaces thereof respectively for the purpose of improving the heat transfer from the mating main electrodes thereto. A liquid to be heated enters the helix 41a or 42a through the end portion 41 or 42 and leaves the end portion 43 or 44.

In other respects, the arrangement is identical to that shown in FIG. 41.

Each of the main electrodes 1 or 2 can be prevented from corroding starting with those portions thereof brazed or welded to the helix 42a or 41a because the brazed or welded portions are not directly contacted by the heated liquid flowing through the helix. Since the heated liquid flows at a high speed through the helix 41a or 42a, the nuclear ebullition can be prevented and also a pressure loss in the helix is increased to prevent steam bubbles from staying in the helix. This results in smooth heat transfer from the main electrode to the heated liquid flowing through the mating helix. Thus the main electrodes are prevented from excessively rising in surface temperature thereby to sustain stably the glow discharge.

Figure 43:
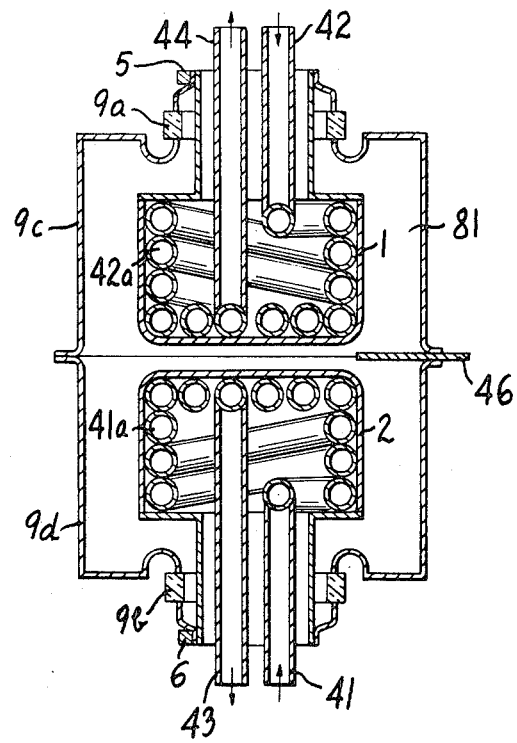
FIG. 43 is a view similar to FIG. 39 but illustrating a modification of the arrangement shown in FIG. 40.

The arrangement shown in FIG. 43 is substantially similar to that illustrated in FIG. 40 excepting that, in addition to disposing the main electrodes 1 and 2 vertically, they are in the form of square hollow prisms and a tube is closely wound in helix complementary in shape to the interior of the associated main electrode and fixed thereto.

Each of the arrangements shown in FIGS. 42 and 43 is characterized in that tube means formed of a good thermally conductive material contacts the internal surface of the mating main electrode to be thermally integral therewith and the heated liquid flows through the tube means. This results in the alleviation of limitations as to the configuration of the main electrode while facilitating the manufacturing of the apparatus and prolonging its useful life.

Figure 44:
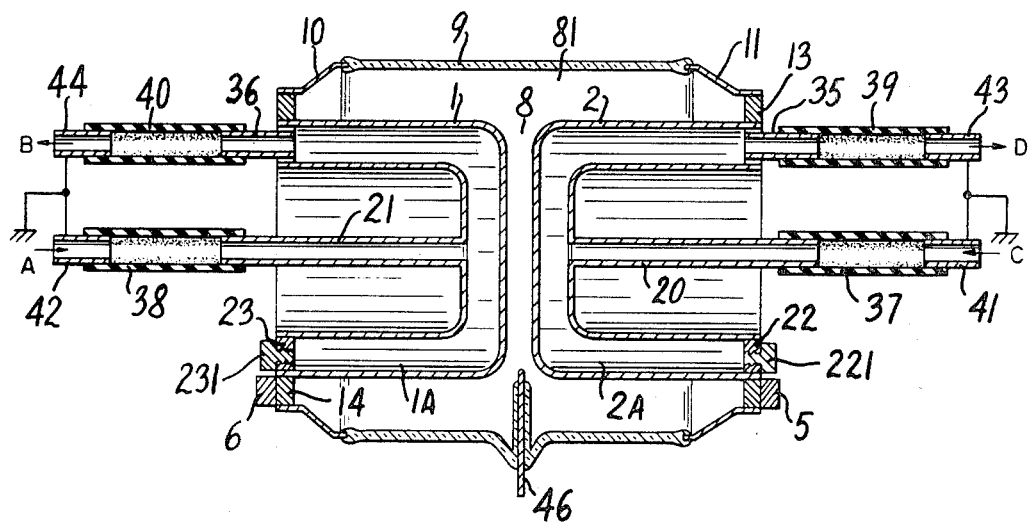
FIG. 44 is a view similar to FIG. 39 but illustrating another modification of the arrangement shown in FIG. 34.

In the arrangement shown in FIG. 44 either of the blind cover plates 22 and 23 is provided on that portion diametrically opposite to the normal outlet with an exhaust port that is, in turn, closed with a plug 221 or 231 for example through a screw mechanism. Further an auxiliary electrode 46 is operatively coupled to the gap formed between the main opposite electrodes 1 and 2 as above described in conjunction with FIG. 34.

In other respects, the arrangement is substantially identical to that shown in FIG. 24.

Figure 45:
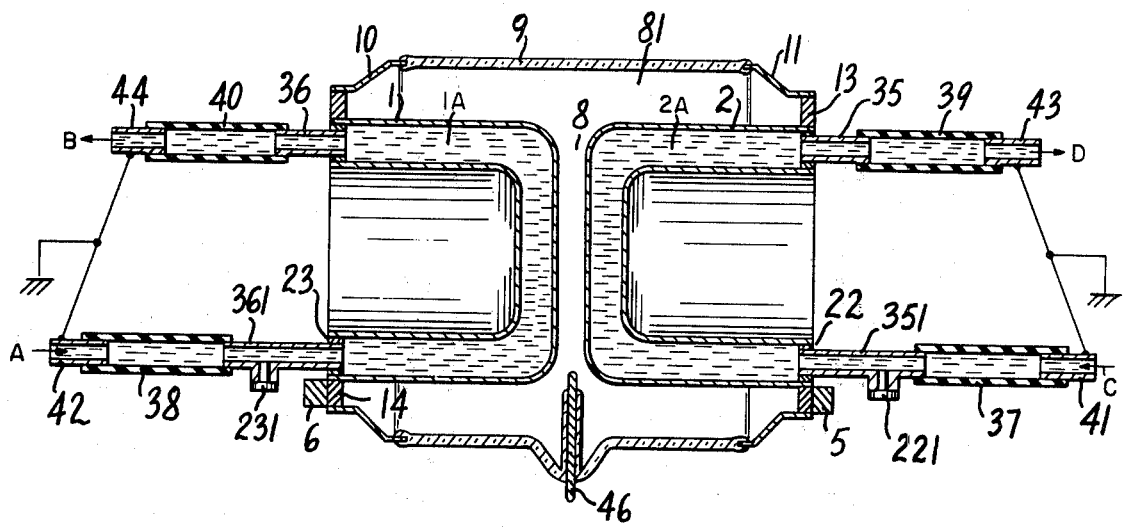
FIG. 45 is a view similar to FIG. 39 but illustrating a modification of the arrangement shown in FIG. 44.

The arrangement shown in FIG. 45 includes the U-shaped flow path or heating space 1A or 2A within the main electrode 1 or 2 and a connecting tube 361 or 351 connected to the heating space 1A or 1B on the inlet side. Then the connecting tube 361 or 351 is provided with an exhaust port closed with a detachable plug 231 or 221.

In other respects the arrangement is substantially identical to that shown in FIG. 44.

When each of the arrangements shown in FIGS. 44 and 45 is desired to be out of service for a long time, the plugs 221 and 231 can be removed from the associated exhaust ports to drain the liquid out from interior of the main electrodes for the purpose of preventing the liquid within the main electrode from spoiling or freezing. Also the useful life of the apparatus can be prolonged.

While the main electrodes have been described as being in the form of hollow cylinders having the same shape and disposed in opposite relationship it is to be understood that the main electrode may be of any other desired shape. For example, the main electrodes may be in the form of hollow cylinders disposed in coaxial relationship. It is essential that, in order to empty the interior of the main electrodes, the exhaust port must be provided on the lower portions thereof.

Figure 46:
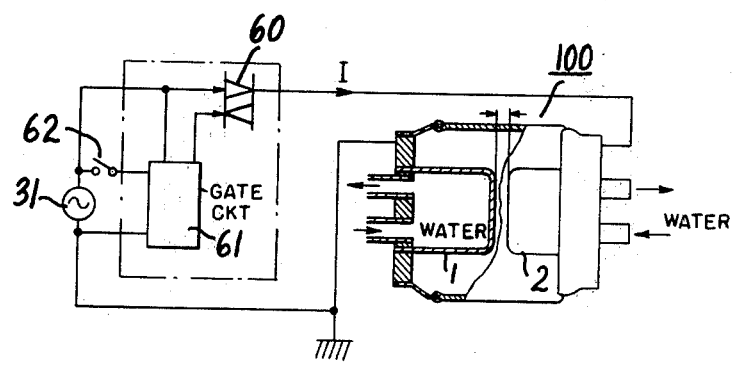
FIG. 46 is a diagram of the fundamental used with control circuit the present invention.

While some of the abovementioned Figures, for example, FIG. 34 illustrate the control circuit for controlling the glow discharges, FIG. 46 shows the fundamental circuit configuration of a control circuit for controlling any of the arrangements as above described including one with no auxiliary electrode. In FIG. 46, the arrangement generally designated by the reference numeral 100 comprises a pair of first and second electrodes 1 and 2 respectively disposed in opposite relationship to form therebetween a gap having a gap length or a width d and each including an inflow and an outflow tube. Water enters the interior of either electrodes 1 and 2 through the inflow tube to be heated and heated water leaves it through the outflow tube.

The source of AC voltage 31 is connected across the electrodes 1 and 2 through a bidirectional triode thyristor 60 with the first electrode 1 connected to ground. The bidirectional triode thyristor is called hereinafter a "Triac" (trade mark). The source 30 is also connected across a gate circuit 61 through a normally open switch 62. Then the gate circuit is connected across one electrode and a gate electrode of the Triac 60. The switch 62 is closed to fire a glow discharge between the electrodes 1 and 2 thereby to heat a liquid, for example, water flowing through the interior of each electrode.

Figure 47:
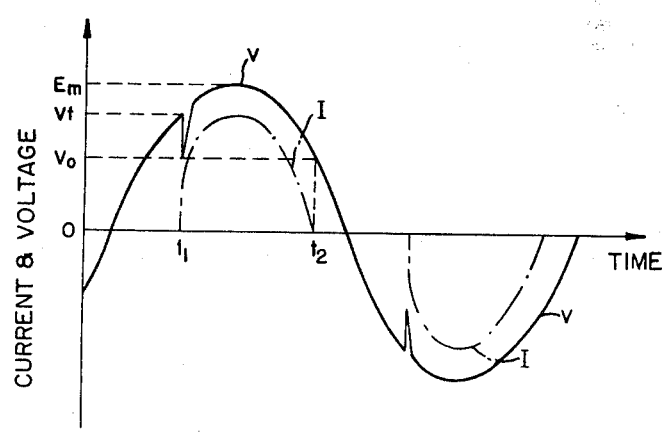
FIG. 47 is a graph illustrating a voltage and a current waveform developed in the arrangement shown in FIG. 46.

The operation of the control circuit shown in FIG. 46 will now be described with reference to FIG. 47 wherein there are illustrated a voltage waveform V supplied from the source 31 and having a peak value $E_m$ and a current waveform V of the glow discharge. As shown in FIG. 47, the voltage waveform V in the positive half-cycle of the source gradually increases from its null point until time point $t_1$ is reached. At that time voltage reaches a value of a discharge breakdown voltage $V_f$ to fire a glow discharge between the electrodes 1 and 2. At that time point $t_1$ a glow current I abruptly flows through the electrodes 1 and 2. The glow current I corresponds to a voltage drop expressed by $V_f$-$V_o$ where $V_o$ designates a glow hold minimum voltage and may be expressed by $I = (V_f - V_o)/R$ where R designates a discharge resistance corresponding to a slope of a current-to-voltage characteristic curve for a glow discharge as above described in conjunction with FIG. 8.

The at time point $t_2$ the voltage V is equal to the glow hold minimum voltage $V_o$ after which the glow discharge is extinguished because the voltage is less than the voltage $V_o$.

Thereafter the source 31 enters the next succeeding negative half-cycle of the source in which the process as above described is repeated to cause a glow discharge between the electrodes 1 and 2. In the arrangement shown in FIG. 46 the application of the AC voltage causes the electrodes 1 and 2 to act alternately as a cathode and an anode electrode respectively to be heated because the glow discharge heats that electrode acting as the cathode as above described.

From the foregoing it will be seen that, the firing of the glow discharge at time point $t_1$ causes an instantaneous increase in glow current so that the glow discharge can not spread following this increase in glow current. This results in the tendency to locally concentrate the glow current on the electrode to transit the glow discharge to an arc discharge. The arc charge has a fear that it melts the electrode which, in turn, reduces the useful life of the heating apparatus.

Also the glow current is initiated to flow through the electrodes 1 and 2 only upon the source voltage across both electrodes reaching the discharge breakdown voltage $V_f$ while $V_f > V_o$ holds. Therefore it is impossible to utilize a time interval during which the source voltage is not less than the glow hold minimum voltages $V_o$ as a conduction time resulting in a poor efficiency of utilization of the source voltage.

FIG. 48 shows a control circuit for controlling the glow discharge heating apparatus of the present invention constructed in accordance with the principles thereof. The arrangement illustrated comprises an auxiliary source circuit 61 connected across the source of AC voltage 31 that supplies AC voltage of 200 volts at the commercial frequency. The circuit 61 includes a normally open switch 62, a step-up transformer 63 having a primary winding connected across the source 31 through the switch 62 and a secondary winding having one end connected to the electrode 2 through a current limiting resistor 64 and the other end connected to the electrode 1 and also to ground.

As in the arrangement of FIG. 46, the source 31 is connected to the electrode 2 through the Triac 60. The resistor 64 is connected across a primary winding of an electrically insulating transformer 65 including a secondary winding connected across a pair of AC inputs of a rectifier bridge 66. The rectifier bridge 66 include a pair of DC outputs one of which is connected to the junction of the source 31 and the Triac 60 through a resistor 67 and the other of which is connected to the remaining terminal or a gate terminal of the Triac 60.

The step-up transformer 63 is designed and constructed so that the discharge breakdown voltage $V_f$ is applied across the electrodes 1 and 2 before a time point where an instantaneous voltage from the source 31 reaches the glow discharge minimum voltage $V_o$.

The operation of the arrangement shown in FIG. 48 will now be described with reference to FIG. 49 similar to FIG. 47. In FIG. 49 wherein like reference characters designates the components corresponding to those shown in FIG. 47, the switch 62 is closed at time point A to permit the source to apply the source voltage across the primary winding of the transformer 63. At a point B, a secondary or an output voltage from the transformer 63 reaches the discharge breakdown voltage $V_f$ whereupon the gap between the electrodes 1 and 2 is broken down to start an electric discharge therebetween. At that time the output voltage drops to the glow hold minimum voltage $V_o$ (see point C, FIG. 49) for a glow discharge by means of the current limiting resistor 64. This causes a current i on the order of 0.1 ampere to flow through the electrodes 1 and 2 resulting in a glow discharge occurring across the electrodes 1 and 2. That glow discharge is called a "pilot glow discharge".

The current for the pilot glow discharge causes a voltage drop across the current limiting resistor 64 that, in turn, induces a secondary voltage across the transformer 65. The secondary voltage from the transformer 65 is applied to the gate electrode of the Triac 60 after having been fullwave rectified by the rectifier bridge 67 to put the Triac 60 in its conducting state. Therefore the source voltage is applied across the electrodes 1 and 2. Under these circumstance, if the pilot glow discharge has not occurred across the electrodes 1 and 2 then the pilot glow current i does not flow through the electrodes 1 and 2 and no voltage is induced across the insulating transformer 65 with the result that the Triac 60 is maintained non-conducting. This ensures that the application of the high AC voltage across the electrodes 1 and 2 does not result in the occurrence of an arc discharge therebetween unless the pilot glow discharge preliminarily occurs across the electrodes 1 and 2.

When the source voltage is applied across the electrodes 1 and 2 through the now conducting Triac 60 and reaches the glow hold minimum voltage $V_o$, the principal glow discharge is fired across the electrodes 1 and 2. That is, a current I for the principal glow discharge flows through the electrodes 1 and 2. That principal glow discharge current I is extinguished after the source voltage V has again reached the glow hold minimum voltage $V_o$ at point E or time point $t_2$ and therefore the principal glow discharge is extinguished. However it is noted that at point E the voltage $V_o$ from the step-up transformer 63 is applied across the electrodes 1 and 2 through the resistor 64 with the result that the pilot glow discharge is still established.

Then at point F, the output voltage from the step-up transformer 63 also becomes less than the voltage $V_o$ to the pilot glow discharge ceases.

Then the source 31 enters the next succeeding negative half-cycle in which the process as above described is repeated.

The concept of the embodiment of the present invention as shown in FIG. 48 is to apply preliminarily a high voltage across the electrodes by means of the auxiliary source circuit to cause the preliminary or pilot glow discharge thereacross and to smoothly derive the principal glow discharge from the pilot glow discharge. Therefore the arrangement of FIG. 48 is effective for preventing the principal glow discharge current from abruptly increasing resulting in an arc discharge as in the arrangement of FIG. 46. Further the efficiency of utilization of the source is increased.

The arrangement shown in FIG. 50 comprises a reactor 68 connected between the source 31 and the electrode 2, and an AC pulse generator 69 connected across the source 31 through the normally open switch 62. The pulse generator 69 includes one output connected by the current limiting resistor 64 to the junction of the reactor 68 and the electrode 2 and the other output connected to the electrode 1 and therefore to ground.

The gap formed between the electrodes 1 and 2 is so dimensioned that the peak voltage $E_m$ from the source 31 is prevented from effecting the discharge breakdown of the gap.

As shown in FIG. 51 wherein a voltage and a current waveform V and I respectively and a pulse waveform P are illustrated, the AC pulse generator 69 generates an AC pulse voltage P sufficient to reach the discharge breakdown voltage $V_f$ at time point $t_1$ where the voltage from the source 31 approximately reaches the glow hold minimum voltage $V_o$. The pulse voltage P first effects the discharge breakdown of the gap between the electrodes 1 and 2 followed by a flow of the principal glow current I through the electrodes.

As in the arrangement of FIG. 46, the current I becomes null at time point $t_2$ to extinguish the glow discharge after which the process as above described is repeated in the next succeeding negative half-cycle.

It is noted that the reactor 68 is designed and constructed so that it presents a high impedance to the pulse waveform P but a low impedance to the commercial frequency of the source 31.

Thus the arrangement of FIG. 50 ensures that, when the source voltage V is close to the glow hold minimum voltage $V_o$, the principal glow discharge is initiated between the electrodes 1 and 2 and then the principal glow current I is smoothly increased without the transit to an arc discharge.

Figure 52:
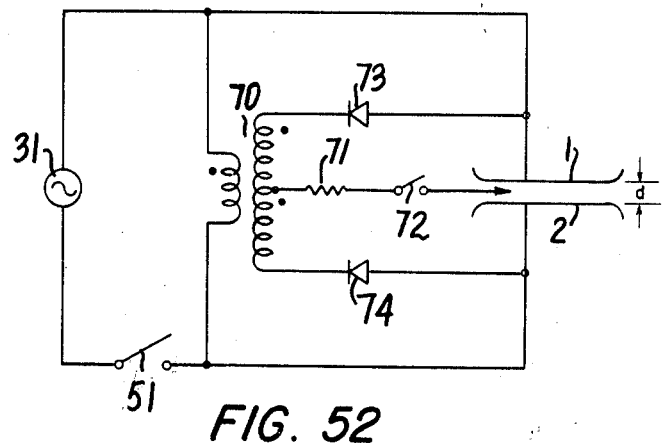
FIG. 52 is a diagram of another control circuit constructed in accordance with the principles of the present invention and suitable for use with an electrode structure including an auxiliary electrode.

FIG. 52 shows a modification of the present invention wherein the pilot glow discharge occurs between the auxiliary electrode and either of the main electrodes prior to the principal glow discharge as above described, for example, in conjunction with FIG. 34. In FIG. 52, the main and auxiliary electrodes 1, 2 and 46 respectively are schematically shown and may have any of their structures shown in FIG. 34 and FIGS. 38 through 45.

The arrangement illustrated comprises the AC source 31 and an auxiliary source shown as comprising a step-up transformer 70 including a primary winding connected across the source 31 through the normally open switch 51 and a center-tapped secondary winding. The dot convention is used to identify the polarity of the instantaneous voltage across the associated winding. The secondary winding includes a center tap connected to the auxiliary electrode 46 through a current limiting resistor 71 and a normally open switch 72, and a pair of end terminals connected to the main electrodes 1 and 2 through individual semiconductor rectifier diodes 73 and 74 with anode electrodes thereof connected to the main electrodes respectively. The gap formed between the electrodes 1 and 2 has a distance or a gap length d satisfying $V_f > E_m > V_o$, where $V_f$, $E_m$ and $V_o$ have been previously defined.

The switch 51 is closed to apply the AC voltage V from the AC source 31 across the electrodes 1 and 2 while the switch 72 is closed to apply a high voltage waveform from the step-up transformer 70 to the auxiliary electrode 46. Under these circumstances, when a potential at the main electrode 1 is higher than that at the main electrode 2, the diodes 73 and 74 are turned off and on respectively to cause a pilot glow discharge between the auxiliary electrode 46 acting as an anode and the main electrode 2 acting as a cathode. On the contrary, when the main electrode 2 is higher in potential than the main electrode 1, the diodes 73 and 74 are turned on and off respectively to cause a pilot glow discharge between the auxiliary electrode 46 acting as an anode and the main electrode 1 as the cathode.

In addition, as the auxiliary electrode 46 has applied thereto the voltage from the center tap on the secondary transformer 70 winding, the voltage applied across the auxiliary electrode 46 and the main electrode 1 to cause the pilot glow discharge therebetween is quite identical to that applied across the auxiliary electrode 46 and main electrode 2 to cause the pilot discharge therebetween. Therefore, the transit of the pilot glow discharge due to the auxiliary electrode to the principal glow discharge between the main electrodes 1 and 2 are equally effected between each of the positive half-cycle and the negative half-cycle of the source 31.

Further the occurrence of the pilot glow discharge completes a closed circuit including the diode 73 or 74, the associated half of the secondary transformer 70 winding, the resistor 71, the closed switch 72 and the pilot glow discharge between the auxiliary electrode 46 and the main electrode 1 or 2. This prevents the current for the pilot glow discharge from entering a circuit with the source 31.

The opening of the switch 72 ceases the pilot glow discharge from occurring between the auxiliary electrode 46 and either of the main electrodes 1 and 2. Thus the principal glow discharges are not fired in the next succeeding cycle of the source and the cycles following the latter with the result that the heating operation is not performed. In other words, the ON-OFF control of the principal glow discharge can be conducted by turning the pilot discharge on and off.

It is noted that the pilot glow discharge always occurs between the auxiliary electrode 46 acting as the anode and either of the main electrodes 1 and 2 acting as the cathode so that the auxiliary electrode 46 is not heated. This results in the elimination of the necessity of cooling the auxiliary electrode.

From the foregoing it is seen that the arrangement, when effecting the ON-OFF control of the heating apparatus proper of FIG. 52 ensures the transit of the glow discharge by turning the pilot glow discharge on and off.

Figure 53:
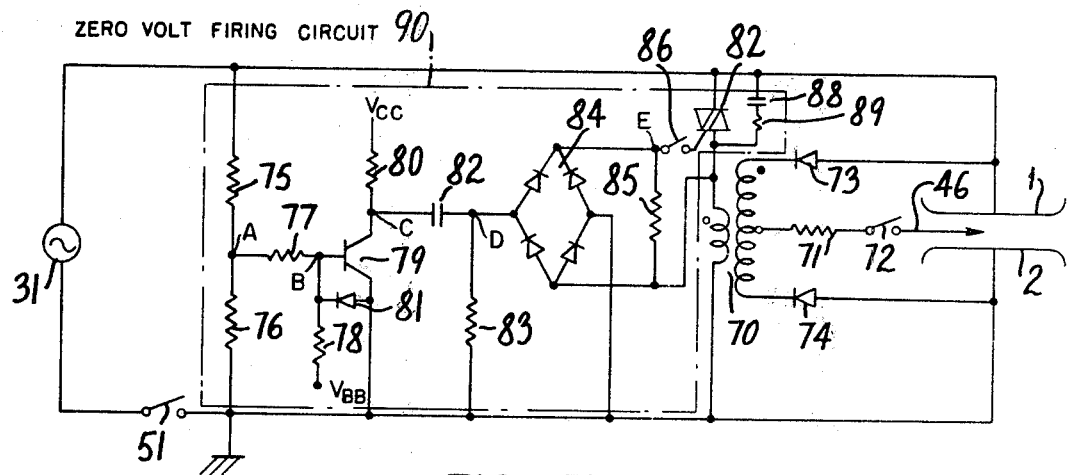
FIG. 53 is a circuit diagram similar to FIG. 52 but illustrating a modification of the arrangement shown in FIG. 52.

The arrangement illustrated in FIG. 53 is different from that shown in FIG. 52 only in that in FIG. 53 a zero-voltage firing circuit is provided to prevent the glow current from abruptly increasing. In FIG. 53 a pair of serially connected resistors 75 and 76 are connected across the AC source 31 through the normally open switch 51 to form a voltage divider, and the junction A of both resistors is connected to a resistor 77 subsequently connected to a base resistor 78 that is connected to a base source $V_{BB}$. The resistor 76 is connected to ground. The junction B of the resistors 77 and 78 is connected to a base electrode of an NPN transistor 79 including an emitter electrode connected to the resistor 76 and a collector electrode connected to a DC source $V_{cc}$ through a collector resistor 80. The transistor 79 has connected across the emitter and base electrodes a semiconductor diode 81 serving to prevent a high reverse voltage from being applied across those electrodes and also connected across the collector and emitter electrodes a differentiating circuit including a capacitor 82 and a resistor 83. The junction of that collector electrode and the capacitor is designated by the reference character C and the junction of the capacitor 82 and the resistor 78 is designated by the reference character D only for purposes of illustration.

The junction D is connected to one AC input of a rectifier bridge 84 including the other AC input connected to the resistor 83. The rectifier bridge 84 includes a pair of DC outputs connected across a resistor 85 that is connected at one end to a gate electrode of a Triac 87 through a normally open switch 86 and at the other end to the primary winding of the transformer 70. The Triac 87 is connected across AC source through the primary transformer 70 winding and the switch 51 and has connected thereacross a series combination of a capacitor 88 and a resistor 89 serving as an absorber.

The components 75 through 89 as above described form a zero-voltage firing circuit generally designated by the reference numeral 90.

With the switch 51 closed, an AC voltage developed at the point A is similar to the source voltage and sinusoidal as shown at waveform A in FIG. 54. The AC sinusoidal voltage passes through its zero voltage points at time points $t_o$, $t_1$ and $t_2$ in each cycle of the source 31. Assuming that the source $V_{BB}$ is at a null potential, a voltage developed at the point B is sinusoidal between time points $t_o$ and $t_1$ or in the positive half-cycle of the source and remains null between time point $t_1$ and $t_2$ or in the negative half-cycle thereof by means of the action of the diode 81 as shown at waveform B in FIG. 54. Since the transistor 79 is turned on only in response to a voltage applied to the base electrode to render the latter positive with respect to the emitter electrode, the same is in its ON state between time points $t_o$ and $t_1$ and in its OFF state between time points $t_1$ and $t_2$. Accordingly, a voltage developed at the point C is null when the transistor 79 is in its ON state and equal to a voltage across the source $V_{CC}$ also designated by $V_{CC}$ when it is in its OFF state as shown at waveform C in FIG. 54.

The voltage at the point C is differentiated by the differentiating circuit 82, 83 to produce alternately a negative and a positive pulse at the point D as shown at waveform D in FIG. 54. Those pulse are rectified by the rectifier bridge 84 to form positive pulses which appear at a point E connected to the switch 84 at time points $t_o$, $t_1$ and $t_2$ as shown at waveform E on FIG. 54.

With the switch 86 closed, the pulses shown at waveform E in FIG. 54 are successively applied to the gate electrode of the Triac 87. In other words, gate pulses are necessarily developed at the gate electrode of the Triac 87 at the zero passage points of the source voltage or at time points $t_o$, $t_1$ and $t_2$. Thus it is seen that, even though the switch 86 has been closed at any time point, the Triac 87 is brought into its ON state starting with the zero passage point of the source voltage. As a result, a pilot voltage from the transformer 70 is applied to the auxiliary electrode 46 starting with the zero passage point of the source voltage or time point $t_0$, $t_1$ or $t_2$ with the result that the principal glow current is prevented from sharply increasing. This means that a liquid flowing in heat transfer relationship along the internal surface of each electrode 1 or 2 is smoothly heated.

The arrangement of FIG. 53 is advantageous in that a principal glow current is prevented from sharply rising at a firing time point and the glow discharge is prevented from transiting to an arc discharge due to the local concentration of the current while efficiency of utilization of the source voltage is high.

If desired, the zero voltage firing circuit 90 may be formed of solid state relays.

In the arrangements shown in FIGS. 52 and 53 the auxiliary source circuit including the step-up transformer is formed of components having stray capacitances between one another and with respect to ground with the switch 72 put in its open position. This results in a fear that a potential at the auxiliary electrodes 46 would be raised due to those stray capacitances until a voltage across the auxiliary electrode 46 and either of the main electrodes 1 and 2 exceeds the discharge breakdown voltage across the associated gap. This results in the undesirable occurrence of a glow discharge between the main electrodes 1 and 2 which prevents the principal glow discharge from being controlled with the pilot glow discharge.

Figure 55:
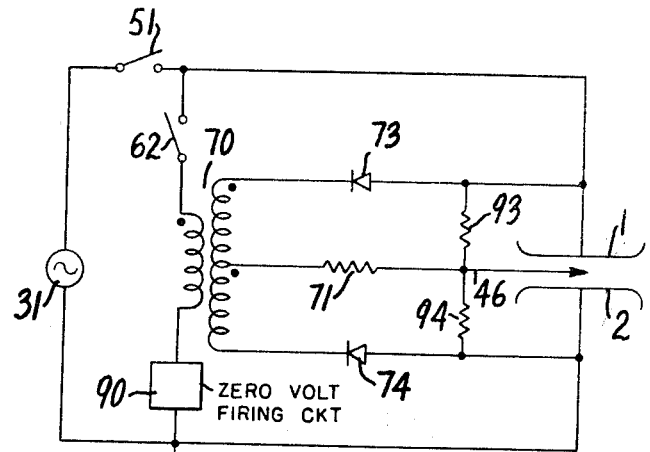

In order to avoid this objection, the arrangement illustrated in FIG. 55 includes a pair of dummy resistors 93 and 94 connected between the diode 73 and the resistor 71 and between the diode 74 and the resistor 71 respectively. The resistors 93 and 94 are effective for determining the potential at the auxiliary electrode 46 so as to prevent the voltage across the auxiliary electrodes 46 and either of the main electrodes 1 and 2 from exceeding the discharge breakdown voltage across the gap as above described.

In other respects, the arrangement is identical to that shown in FIG. 53 except for the omission of the switch 72.

The auxiliary electrode 46 is normally positioned to be equidistant from both main electrodes 1 and 2 and therefore the resistors 93 and 94 are equal in resistance value to each other in order to set the voltage across the auxiliary electrode 46 and the main electrode 1 equal to that across the electrodes 46 and 2 with the switch 62 put in its open position. Even under these circumstances, it is to be understood that the gap length between the auxiliary electrode 46 and either of the main electrodes 1 and 2, and the type and pressure of a dischargeable gas should be preliminarily determined so as to prevent the occurrence of a discharge breakdown between the auxiliary electrode 46 and either of the main electrodes 1 and 2 with the switch 62 put in its open position.

The arrangement illustrated in FIG. 56 is different from that shown in FIG. 55 only in that in FIG. 56 a Triac is substituted for the switch 62 in order to permit the ON-OFF operation to be repeatedly performed with a high frequency. As shown in FIG. 56, a Triac or a bidirectional triode thyristor 95 is located in place of the switch 62 shown in FIG. 55. The Triac 95 includes a gate circuit 95 connected to a gate electrode thereof to deliver trigger signals to the gate electrode to turn the Triac 95 on and off and a series combination of a capacitor 97 and a resistor 98 serving as an absorber.

If desired, the Triac 95 may be included in the zero voltage firing circuit 90.

When the pilot glow discharge has the discharge breakdown characteristic with a fairly long time delay, the pilot glow discharge may be fired at a time point where the source voltage approaches its peak value provided that the Triac 95 has flowing therethrough a current in excess of its holding current. This is attended with the occurrence of the principal glow discharge having a sharply rising current. A current for this glow discharge may sharply rise. In this case, a negative glow included in the principal discharge can not spread following an increase in current to locally concentrate the current resulting in a danger that the glow discharge transits to an arc discharge. In order to avoid this danger, it is necessary to determine magnitudes of resistances 93 and 94 and an impedance on the primary side of the step-up transformer 70 high enough to prevent a flow of current through the Triac 95 in excess of its holding current.

In the arrangement illustrated in FIG. 57 an electronic switch 98 such as a thyristor with a trigger circuit 99 is connected between the resistor 71 and the junction of dummy resistors 93 and 44 as shown in FIG. 57. When a voltage drop across the serially connected resistors 93 and 94 decreases to some extent, and when the electronic switch 98 is put in its ON state by the trigger circuit 99, a current flowing through the electronic switch 98 may exceed its holding current even in the absence of a pilot glow discharge. Under these circumstances, if the pilot glow discharge has the discharge breakdown characteristic with a long time delay, there is a danger that the resulting glow discharge transits to an arc discharge as above described. In order to avoid this danger, the resistors 93 and 94 are required to be somewhat high in resistance.

Figure 58:
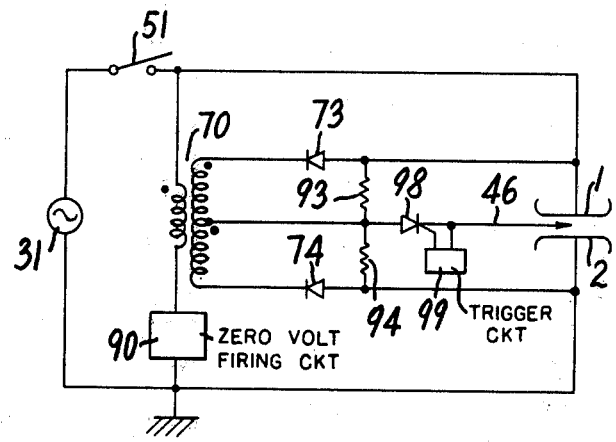

Alternatively the electronic switch 98 with its trigger circuit 99 may be connected between the junction of the dummy resistors 93 and 94 and the auxiliary electrode 46 as shown in FIG. 58. In this case, the resistors 93 and 94 are not particularly subjected to limitations as to their resistances unless a voltage across the auxiliary electrode 46 and either of the main electrodes 1 and 2 is reduced.

The arrangements shown in FIGS. 55 through 58 ensure that the principal glow discharge is controlled with the pilot glow discharge. This is because the dummy resistors prevent the potential at the auxiliary electrode from floating due to stray capacitances as above described in conjunction with FIGS. 52 and 53 and the like in the absence of the voltage applied to the auxiliary electrode.

Figure 59:
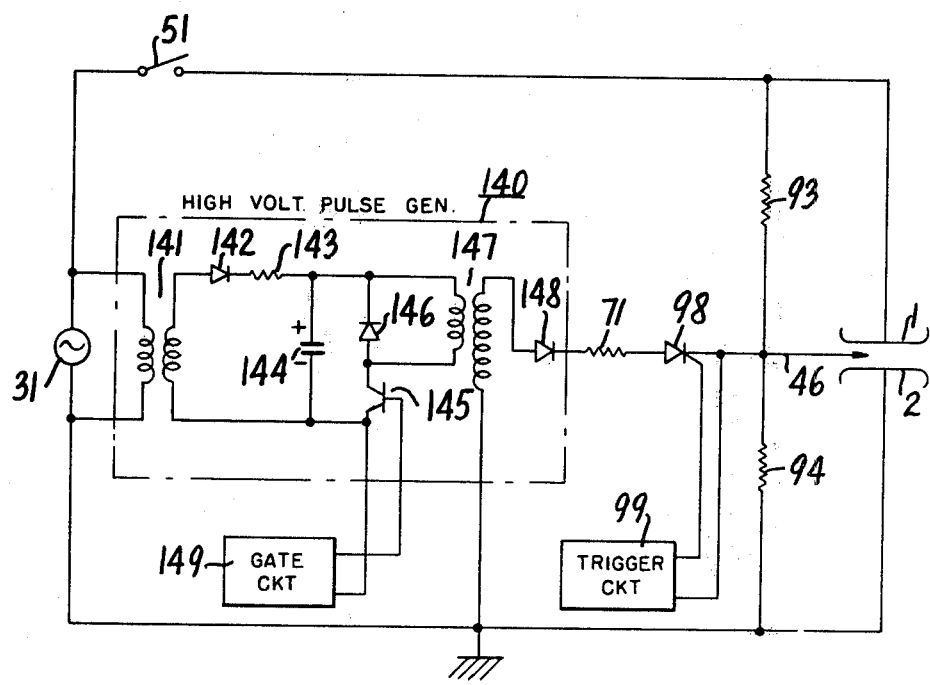
FIG. 59 is a diagram of still another control circuit constructed in accordance with the principles of the present invention.

The arrangement illustrated in FIG. 59 comprises an electrically isolating transformer 141 including a primary winding connected across the AC source 31 and a secondary winding connected across a series combination of a rectifying diode 142, a current limiting resistor 143 and capacitor 144, and an NPN transistor 145 including an emitter electrode connected to one side of the capacitor 144 and a collector electrode connected to the other side of the capacitor 144 through a semiconductor diode 146 for absorbing back pulses. The transistor 145 includes a base electrode connected to a gate circuit 149 which is also connected to the emitter electrode thereof to turn the transistor 145 on and off.

The components 141 through 146 form a high voltage pulse generator circuit generally designated by the reference numeral 140 with a step-up pulse transformer 147 which includes a primary winding connected across the diode 146 and a secondary winding connected to a semiconductor diode 148 for shaping a pulse waveform.

As in the arrangement of FIG. 57, the diode 148 is connected to the resistor 71 which is connected to the auxiliary electrode 46 through the thyristor 98 which is turned on and off by a trigger circuit 99. Further, the serially connected dummy resistors 93 and 94 are connected across the main electrodes 1 and 2 and also, through the switch 51, across the AC source with the junction of both resistors connected to the auxiliary electrode 46.

Figure 60:
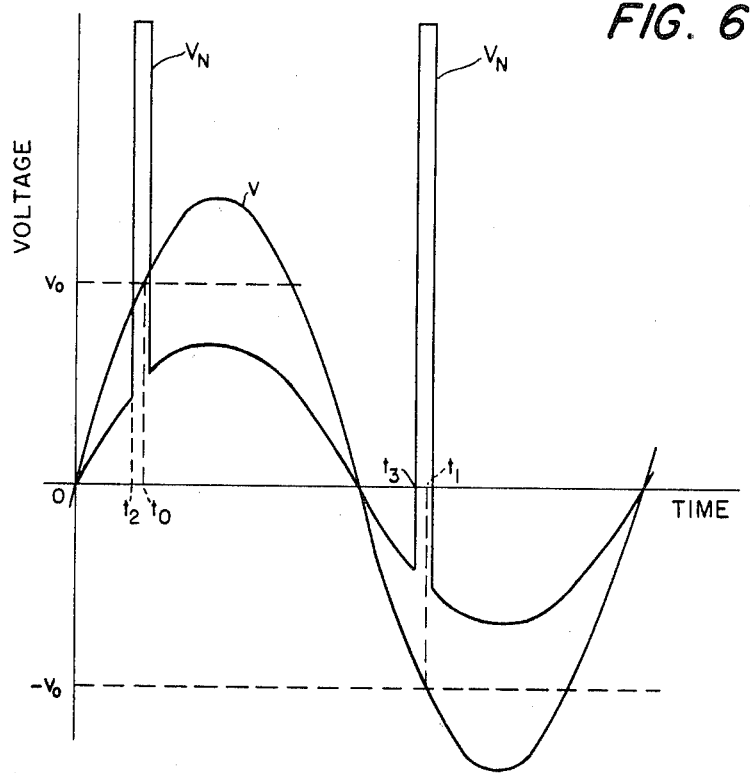
FIG. 60 is a graph illustrating voltage waveforms developed in the arrangement shown in FIG. 59.

The operation of the arrangement shown in FIG. 59 will now be described with reference to FIG. 60 wherein there are illustrated a voltage waveform V across the main electrodes 1 and 2 and a no-load voltage waveform $V_N$ at the auxiliary electrode 46. With the main electrode 1 disposed opposite to the main electrode 2 to form therebetween a predetermined gap fulfilling the relationship that the discharge breakdown voltage $V_f$ for the gap is higher than the peak value $E_m$ of the source voltage under the predetermined discharge conditions, the switch 51 is closed to apply the AC voltage across both electrodes 1 and from the source 31. Also, the source 31 charges the capacitor 144 with the polarity illustrated through the transformer 141, the diode 142 and the resistor 143. Then gate and trigger circuits 149 and 99 respectively apply simultaneously respective gate signals to the transistor 145 and the thyristor 99 to turn them on. The turn-on of the transistor 145 causes the charged capacitor 144 to discharge through the primary winding of the pulse transformer 147 and the now conducting transistor 145. As a result, a pulse voltage stepped up by the pulse transformer 147 is supplied from the secondary winding thereof through the diode 148, the resistor 71 and the now conducting thyristor 98 to the auxiliary electrode 46. It is noted that the circuits 149 and 99 generate the respective pulses before the voltage across the main electrodes 1 and 2 reaches the discharge breakdown voltage $V_o$. As shown in FIG. 60, the circuits 149 and 99 generate the pulses at time point $t_2$ before time point $t_o$ where the source voltage reaches the discharge breakdown voltage $V_o$ in each positive half cycle thereof and the pulses terminates shortly after time point $t_o$. That is, each pulse has a predetermined pulse width a little longer than a time interval between time points $t_2$ and $t_o$. Each pulse is shown at waveform $V_N$ in FIG. 60 as being superposed on that portion of the source voltage divided by the resistors 93 and 94, assuming that both resistors have resistance values equal to each other. In the next succeeding negative cycle of the source voltage the pulse is similarly developed at time point $t_3$ before time point $t_1$ where the voltage across the main electrodes 1 and 2 reaches the negative value $-V_o$ of the discharge breakdown voltage and terminates shortly after time point $t_1$ to have the same pulse width as that appearing in the positive half-cycle of the source voltage.

In the arrangement of FIG. 59 it is required to cause a pilot glow discharge before time point $t_o$ or $t_1$ by applying the pulse waveform $V_N$ to the auxiliary electrode 46 as above described. Also it is required to select the pulse width so as to reliably effect the discharge breakdown of the gap between the auxiliary electrode and either of the main electrodes 1 and 2 and within the duration of the associated pulse.

In general, a time delay is caused after the voltage has been applied across discharge gaps and until the discharge breakdown is accomplished therebetween. It is well known that this time delay is equal to the sum of a time interval between the application of the voltage across a discharge gap and the appearance of a first electron resulting in the initiation of development of the electron avalanche and another time interval between the initiation of development of an electron avalanche and the completion of a stead-state discharge. The first mentional time interval is called a statistic delay and the latter is called a formation delay. The statistic delay is overpoweringly long.

Assuming that a voltage applied across the particular discharge gap has the peak value higher that a voltage effecting the DC breakdown of the discharge gap, stepped voltages are applied across the discharge gap $n_o$ times. Assuming that, among them the n applications of the voltage has time delays not shorter than $\tau$ and $(n+\Delta n)$ applications thereof has time delays not shorter than $(\tau+\Delta\tau)$, $$\Delta n = -An\Delta\tau$$

holds where A designates a constant. Thus $$n = n_o e^{-A\tau}$$

is fulfilled by the statistic delay. The above expression may be plotted into a straight line with the axes of ordinates and abscissas representing the values of n and $\tau$ respectively on a semilogarithmic scale. A graphic representation thus plotted is called a Laue plot.

Figure 61:
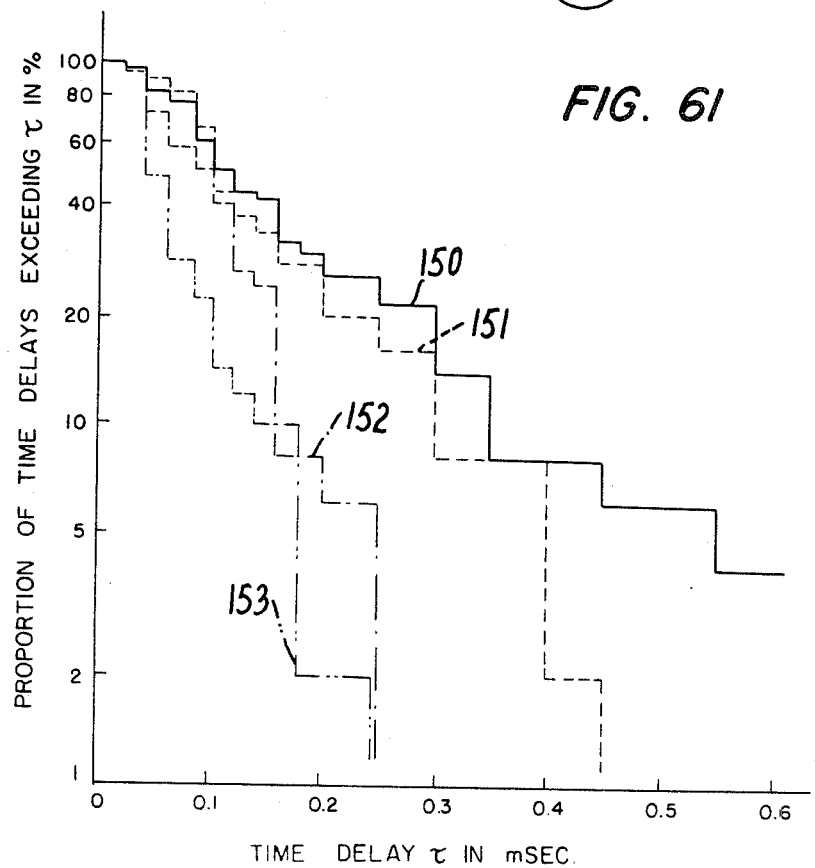
FIG. 61 is a graphical representation of a Laue plot.

FIG. 61 shows on example of the Laue plot. In FIG. 61 an extremity of an auxiliary electrode having a diameter of 3 millimeters is located at an edge of a gap of 3 millimeters formed between a pair of main opposite electrodes to form a spacing of about 1 millimeter between the extremity of the auxiliary electrode and either of the main electrodes. The gap was filled with a discharge gap formed of a mixture including 89% by volume of helium and 11% by volume of hydrogen under a pressure of 100 Torrs. In FIG. 61 the reference numerals 150, 151, 152 and 153 depict the source voltages having the peak values of 600, 800, 1000 and 1200 volts respectively. From a stepped curve 152, for example, it is seen that for the peak source value of 1000 volts the time interval between the $t_2$ and $t_o$ or between the $t_3$ and $t_1$ (see FIG. 60) must be of at least 250 microseconds. Also the auxiliary source for the pilot glow discharge should have a current capacity of at least about 10 milliamperes in order to transit smoothly from the pilot glow discharge to the principal glow discharge.

By taking account of a time delay with which the discharge gap is brown down with the pulse voltage of the voltage waveform $V_N$ shown in FIG. 60, the waveform $V_N$ is given a pulse width or a duration defined by the time intervals ranging from time point $t_2$ or $t_3$ to time point $t_o$ or $t_1$ respectively while the current capacity of the auxiliary source is determined as required for transiting the pilot glow discharge to the principal glow discharge and the pulse voltage delays rapidly at and after time point $t_o$ or $t_1$. This measure ensures that the pilot glow discharge is always caused prior to time point $t_o$ or $t_1$ and the principal discharge current surely rises at time point $t_o$ or $t_1$.

After the principal glow discharge has been caused between the main electrodes 1 and 2, discharge energy from the principal glow discharge as thermal energy alternately enters the main electrodes 1 and 2 with the result that a liquid flowing in contact through either of the main electrodes is instantaneously heated.

The arrangement of FIG. 59 is advantageous in that the principal discharge current smoothly rises to cause the development of a negative glow involved to satisfactorily follow up a change in discharge current thereby to prevent the local concentration of the current without the glow discharge transiting to an arc discharge while the source voltage is efficiently utilized. This is because the auxiliary electrode is adapted to be applied with a pulse voltage that rises before a time point where a voltage applied across the main electrodes reaches a glow hold minimum voltage across the main electrodes thereby to always fire the pilot glow discharge before that time point and rapidly falls to its null value at and after said time point. Also the use of the pulse waveform is effective for decreasing the power capacity of the auxiliary source and therefore reducing a dimension and a cost thereof.

Figure 62:
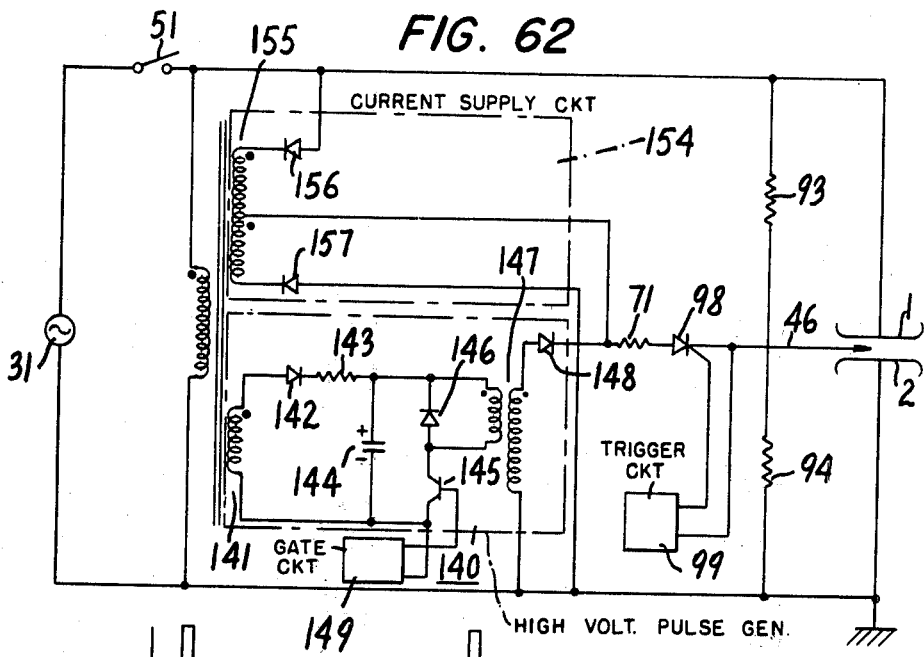
FIG. 62 is a circuit diagram similar to FIG. 59 but illustrating a modification of the arrangement shown in FIG. 59.

FIG. 62 shows a modification of the arrangement shown in FIG. 59. The arrangement illustrated comprises a pair of electrically isolating transformers 141 and 155 including a common iron core and a common primary winding connected across the AC source 31 through the normally open switch 51, the high voltage pulse generator circuit 140 as above described in conjunction with FIG. 59 connected to the transformer 141, and a current supply circuit generally designated by the reference numeral 154 and connected across the transformer 155.

The current supply circuit 154 includes a center-tapped secondary winding of the transformer 155, and a pair of semiconductor diodes 156 and 157. The diode 156 is connected at the anode electrode to one side of the source 31 through the switch 51 and therefore the main electrode 1 while diode 157 is connected at the anode electrode to the other side of the source 31 and therefore the main electrode 2 that is, in turn, connected to ground. The center tap on the secondary transformer 155 winding is connected to the output of the pulse generator circuit 140 or the junction of the diode 148 and the current limiting resistor 71.

In other respects, the arrangement is identical to that shown in FIG. 59. The dot convention is used to identify, the polarity of the instantaneous voltage developed across the associated transformer winding.

The current supply circuit 155 is operative to full-wave rectify an AC voltage induced across the secondary transformer 155 winding and supply a current due to the full-wave rectified voltage to the auxiliary electrode 46 through the resistor 71 and the thyristor 98 with the pulse voltage from the pulse generator circuit 140.

In the arrangement in FIG. 62, the discharge gap between the main electrodes 1 and 2 has been dimensioned as above described in conjunction with FIG. 59 and the switch 51 is closed to supply the source voltage across the main electrodes 1 and 2. The source voltage is a commercial AC voltage having a frequency of 60 hertzs as shown by dashed waveform V in FIG. 63 wherein its cycle has a duration of 16.7 milliseconds.

The pulse generator circuit 140 generates a high voltage pulse in each of the half-cycles of the source voltage in the same manner as above described in conjunction with FIG. 59. After having been shaped by the diode 148, the high voltage pulse is developed on the resistor 71 and superposed on the full-wave rectified voltage from the current supply circuit 154 also applied to the resistor 71 as shown at voltage waveform $V_N$ in FIG. 62. Then pulse voltage $V_N$ superposed on the voltage from the current supply circuit 154 is supplied to the auxiary electrode 46 through the conducting thyristor 98.

Figure 63:
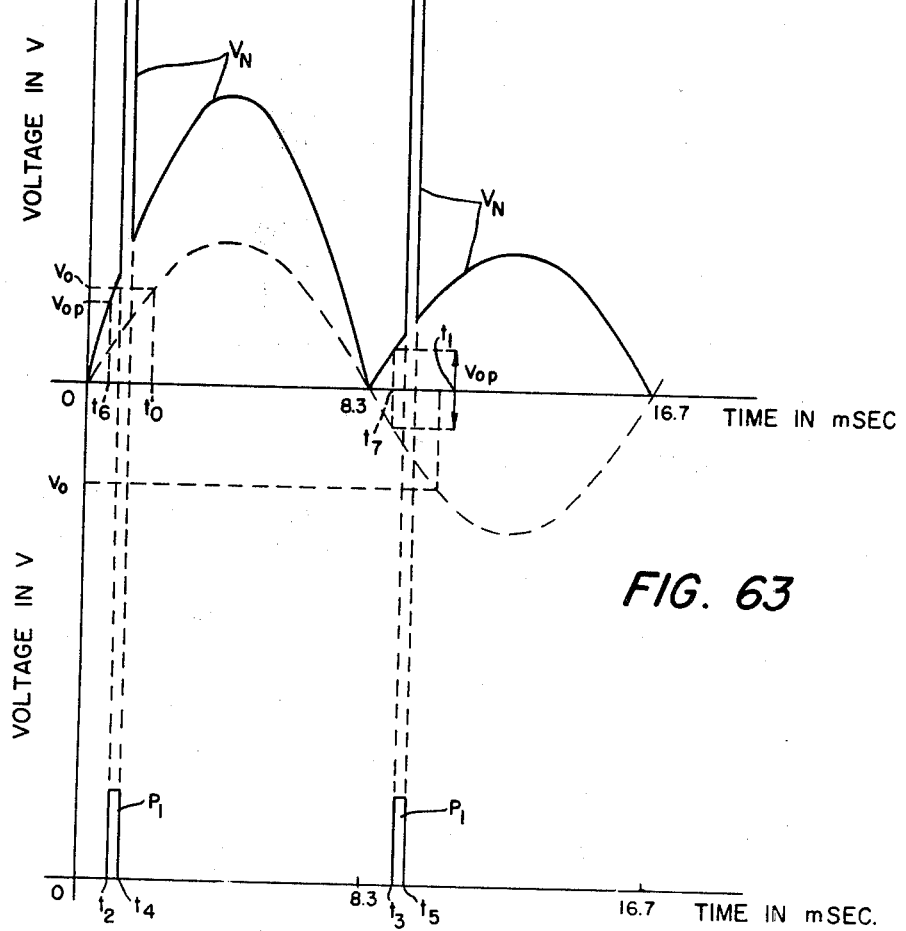
FIG. 63 is a graph similar to FIG. 60 but illustrating the arrangement shown in FIG. 62.

From FIG. 63 it is seen that the voltage waveform $V_N$ includes the full-wave rectified component having a voltage relative to the main electrode 2 equal to a voltage $V_{op}$ for the pilot glow discharge at a time point $t_6$ in the positive half-cycle of the source voltage, and also a voltage relative to the main electrode 1 equal to that voltage $V_{op}$ at time point $t_7$ in the negative half-cycle thereof. Time points $t_6$ and $t_7$ are ahead of time points $t_0$ and $t_1$ respectively where the source voltage is equal to the glow hold minimum voltage $V_O$.

With the main electrode 1 higher in potential than the main electrode 2, the diodes 156 is in its OFF state while the diode 157 is in its ON state tending to cause a pilot glow discharge between the auxiliary electrode 46 and the main electrode 2. On the contrary, with the main electrode 1 is lower in potential than the main electrode 2, the diodes 156 and 157 are turned on and off respectively. This tends to cause a pilot glow discharge between the auxiliary electrode 46 and the main electrode 1. In each case, the voltage across the auxiliary and main electrode 46 and 1 respectively is equal to that across the auxiliary and main electrode 46 and 2 respectively so that a current for the pilot glow discharge remain unchanged. With the auxiliary electrode 46 equidistant from the main electrodes 1 and 2, the transit of the pilot glow discharge to the principal glow discharge between the main electrodes 1 and 2 is accomplished in a similar manner in both cases.

The voltage waveform $V_N$ also includes a pulse waveform component from the pulse generator circuit 140 rising at time point $t_2$ or $t_3$ behind time point $t_6$ or $t_2$ and falling at time point $t_4$ or $t_5$ ahead of time point $t_0$ or $t_1$. The pulse waveform component results from a gate pulse $P_1$ from either of the gate and trigger circuits 149 and 99 rising and falling simultaneously with the rise and fall of the associated pulse component. The pulse waveform component is required to have a pulse width sufficient to effect the discharge breakdown of the gap between the auxiliary electrode 46 and either of the main electrodes 1 and 2. It is to be noted that it is not required to cause time point $t_4$ or $t_5$ to coincide with time point $t_2$ or $t_1$ respectively as in the arrangement of FIG. 59 and that the pulse width may be sufficiently shorter than that required for the latter. In addition, the discharge breakdown scarcely requires a current resulting in the pulse generator circuit 140 being substantially reduced in power capacity.

The gate pulse from each of the gate and trigger circuits 149 and 99 should have a rise time fulfilling the following requirements: The gate pulse $P_1$ should rise at time point $t_2$ or $t_3$ required to be behind $t_6$ or $t_7$ respectively while the pilot glow discharge should be caused not later than time point $t_0$ or $t_1$. Otherwise the principal discharge current is too sharply raised to cause the spread of the particular negative glow to follow this rise in current resulting in a danger that the current is locally concentrated on either of the main electrode to permit the glow discharge to transit to an arc discharge. Also the source voltage can be utilized only with a low efficiency. Thus time point $t_4$ or $t_5$ should be ahead of time point $t_0$ or $t_1$ respectively.

With the gate pulse $P_1$ generated to fulfill the requirements as above described, the pilot glow discharge is always caused ahead of time $t_0$ or $t_1$ in the positive or negative half-cycle of the source voltage and the glow discharge current through the main electrodes 1 and 2 smoothly rises at and after time point $t_0$ or $t_1$ in the positive or negative half-cycle of the source voltage. Accordingly, the principal glow discharge is established resulting in the instantaneous heating of the particular liquid contacted by either of the main electrodes 1 and 2.

Further it is required to make the peak voltage value of the sinusoidal component of the voltage waveform $V_N$ less than the discharge breakdown voltage for the gap between the auxiliary electrode 46 and either of the main electrodes 1 and 2 thereby to prevent the pilot glow discharge from firing with the sinusoidal component. Alternatively, it is required to impart a high value to each resistance 93 or 94 to prevent the voltage waveform $V_N$ from being applied to the auxiliary electrode 46 in the absence of the gate pulse $P_1$ and to prevent a current flowing through the thyristor 98 via the resistors 93 and 94 from exceeding the holding current thereof when the pilot glow discharge is not fired. Also the diodes 156 and 157 must have such reverse voltage withstanding characteristic that both diodes are not broken down with the high voltage pulses generated by the pulse generator circuit 140.

If desired, the pulse generator circuit may utilize a peak transformer.

The arrangement of FIG. 62 is advantageous in that the pulse generator circuit can be reduced in power capacity resulting in the provision of an auxiliary source circuit easy to be manufactured and inexpensive. This is because the pulse generator circuit for effecting the discharge breakdown of the pilot glow discharge gap is separated from the circuit for supplying current to the main electrodes after this discharge breakdown.

Figure 64:
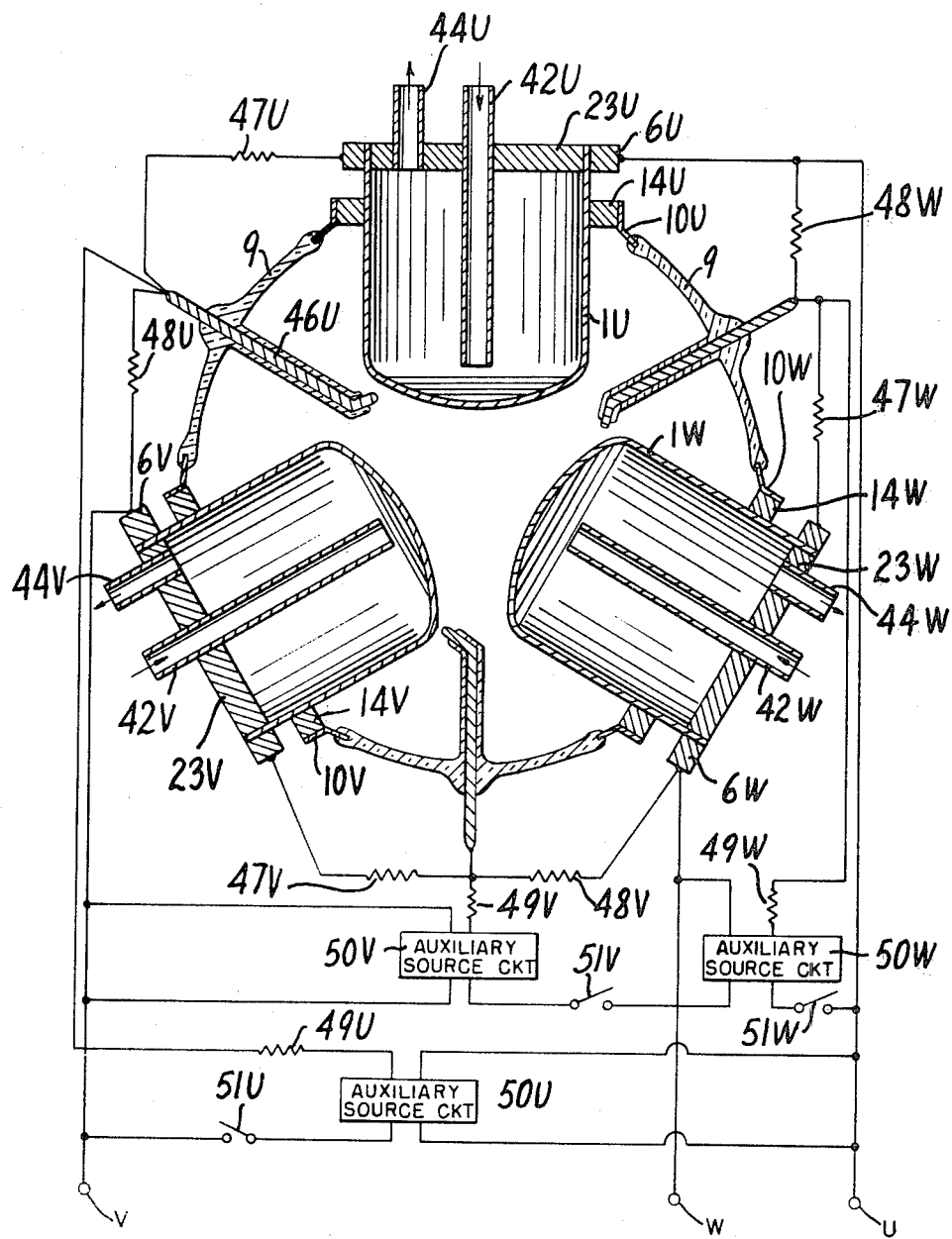
FIG. 64 is a sectional view of an embodiment according to the three-phase glow discharge heating apparatus of the present invention and a diagram of a control circuit therefor.

FIG. 64 shows a different modification of the present invention driven by a three-phase AC source. The arrangement illustrated comprises three main electrodes 1U, 1V and 1W radially disposed by having their longitudinal axes arranged at equal angular intervals of 120 degrees. The main electrodes are in the form of hollow cylinders having one end closed into a crown shape that, in turn, faces the remaining closed ends of the same shape. The main electrode 1U, 1V and 1W include the other end portions rigidly fitted into respective annular supporting members 14U, 14V and 14W interconnected through enclosure portions 9 formed of an electrically insulating material such as glass porcelain or the like and seal fittings 10U, 10V and 10W connected to both adjacent supporting members and the adjacent edges of the enclosure portions 9 to define a hermetic discharge space. The other end of each electrode 1U, 1V or 1W is closed with a blind cover plate 23U, 23V or 23W having an inflow tube 42U, 42V or 42W and an outflow tube 44U, 44V or 44W extended and sealed therethrough.

Three auxiliary electrodes 46U, 46V and 46W are radially extended and sealed through the enclosure portions 9 respectively to be equidistant from the adjacent main electrodes and each includes an end portion bent toward the associated main electrodes to form very narrow gaps therebetween. For example, the auxiliary electrode 46U is radially extended and sealed through the enclosure portion 9 disposed between the main electrodes 1U and 1V and includes the end portion bent toward the main electrode 1U so as to cause a pilot glow discharge. Each of the auxiliary electrodes is coated with the same electrically insulating material as the enclosure portion 9 except for both the end facing the associated main electrode and that portion externally protruding from the mating enclosure portion 9.

A three-phase source is represented by source terminals U, V and W which are connected to annular electrode terminals 6U, 6V and 6W fitted onto those portions of the main electrodes, 1U, 1V and 1W disposed externally of the enclosure portions 9 respectively. Each of the auxiliary electrodes is connected to the electrode terminals disposed on the adjacent main electrodes through individual dummy resistors. For example, the auxiliary electrode 46U is connected to the electrode terminal 6U of the main cylinder 1U through the dummy resistor 47U on the one hand and to the electrode terminal 6V of the main electrode 1V through the dummy resistor 48U.

The auxiliary electrode 46U is also connected by a current limiting resistor 49U to an auxiliary source circuit 50 also connected to the electrode terminal 6U. The auxiliary source circuit 50 is further connected across the source terminals U and V through a normally open switch 51U connected to the source terminal V.

A circuit identical to that above described is provided for each of the remaining main electrodes and the auxiliary electrode operatively associated therewith and includes the components identical to those above described. Therefore the identical components are designated by like reference numerals suffixed with the reference character U, V or W identifying the mating source terminal or the phase of the three-phase source.

The operation of the arrangement shown in FIG. 64 will now be described with reference to FIG. 65 wherein there are illustrated voltage and current waveforms developed at various points in the arrangement of FIG. 64 with a voltage $V_U$ applied to the main electrode 1U being selected as a reference.

While a liquid to be heated is flowing through the interior of each main electrode via the associated inflow tube and leaves the mating outflow tube a three phase voltage is applied to the main electrodes 1U, 1V and 1W through the source terminals U, V and W and all the switches 51U, 51V and 51W are put in their closed position. At time point $t_1$ shortly before a voltage (see waveform $V_V$, FIG. 65) applied across the main electrodes 1U and 1V reaches a glow hold minimum voltage $V_O$, a high voltage pulse (see waveform $P_{Uo}$, FIG. 65) from the auxiliary source circuit 50U is applied to the auxiliary electrode 46U to cause a pilot glow discharge across the narrow gap between the auxiliary electrode and main electrodes 46U and 1U respectively with the main electrode 1U acting as a cathode. This pilot glow discharge is caused with a low current, and upon time point D being reached, it instantaneously induces a glow discharge between the main electrodes 1U and 1V with the electrode 1U acting as a cathode. The latter discharge spreads through the surface of both main electrodes 1U and 1V and is sustained after time point D.

Then when a voltage (see waveform $V_W$, FIG. 65) applied across the main electrodes 1U and 1W exceeds the glow hold minimum voltage $V_O$ at time point E, the glow discharge developed between the main electrodes 1U and 1V plays a role of the pilot glow discharge to cause a glow discharge between the main electrodes 1U and 1W at and after that time point with the main electrode 1U acting as a cathode.

At time point F a voltage across the main electrodes 1V and 1W is equal to the voltage $V_O$ but no discharge is caused between those main electrodes because of the absence of a pilot glow discharge with the main electrode 1V acting as a cathode. Therefore a high voltage pulse (see waveform $P_{Vo}$, FIG. 65) from the auxiliary source circuit 50V is applied to the auxiliary electrode 46V at time point $t_2$ shortly ahead of time point F to cause a pilot glow discharge between the auxiliary and main electrodes 46V and 1V respectively. That pilot glow discharge similarly causes a glow discharge between the main electrodes 1V and 1W at and after time point F with the main electrode 1V acting as a cathode.

When time point G is reached, the voltage $V_V$ across the main electrodes 1U and 1V is equal to the voltage $V_O$ and the glow discharge caused between the main electrode 1V acting as the cathode and the main electrode 1W plays a role of a pilot glow discharge. This causes a glow discharge between the main electrode IV acting as a cathode and the main electrode 1W at and after time point G.

Similarly, since the voltage $V_W$ across the main electrodes 1W and 1U exceeds the voltage $V_o$ at time point H, a high voltage pulse (see waveform $P_{Wo}$, FIG. 65) from the auxiliary source circuit 50W has been preliminarily applied to the auxiliary electrode 46W at time point $t_3$ shortly ahead of time point H to cause a pilot glow discharge between the auxiliary electrode 46W and the main electrode acting as a cathode. The pilot glow discharge between the auxiliary and main electrode 46W and 1W respectively transits to a glow discharge caused between the main electrode 1W acting as a cathode and the main electrode 1U at and after time point H.

Then at time point I the voltage $V_W$ across the main electrodes 1V and 1W exceeds the voltage $V_O$ so that the glow discharge between the main electrodes 1W and 1U serves as a pilot glow discharge to cause a glow discharge between the main electrode 1W acting as a cathode and the main electrode 1U until one cycle of the source voltage is completed.

Therafter the process as above described is repeated to cause repeatedly glow discharge between pairs of the main electrodes. When acting as the cathode, the main electrodes successively heat the liquid therein.

From the foregoing it will readily be understood that the gate pulses are repeatedly applied to the auxiliary electrodes 46U, 46V and 46W at time points t defined by $$t=t_1+nT, \ t=t_2+nT \text{ and } T=t_3+nT$$

respectively where T designates a period of the three-phase source voltage and n indicate any positive integer including zero.

Figure 65:
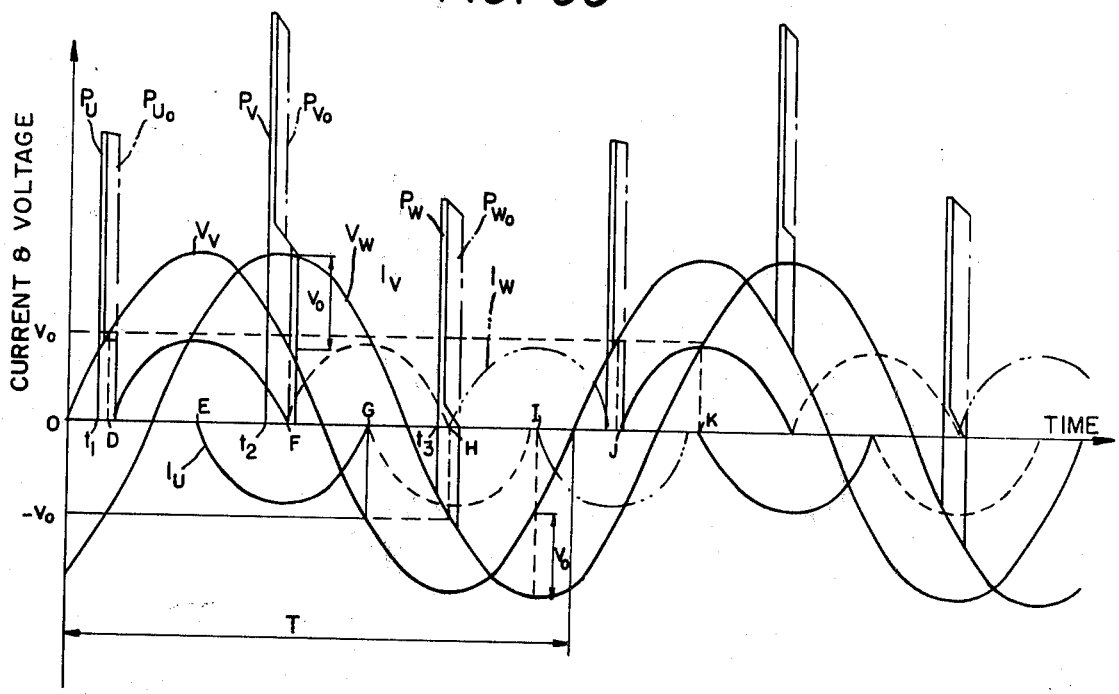
FIG. 65 is a graph illustrating various waveforms developed in the arrangement shown in FIG. 64.

In FIG. 65 solid current waveform $I_U$ designates a glow discharge current with the main electrode 1U acting as the cathode, dotted current waveform $I_V$ designates the glow discharge current with the main electrode 1V acting as the cathode and broken current waveform 1W designates the glow discharge current with the main electrode 1W acting as the cathode. The reference characters $P_{Uo}$, $P_{Vo}$ and $P_{Wo}$ designate no-load pulse waveforms which change to the actual pulse waveforms $P_U$, $P_V$ and $P_W$ respectively after the associated pilot glow discharges have been fired.

Also it is noted that FIG. 65 illustrates the waveforms developed during a time interval equal to twice the period T of the source voltage $V_V$ applied across the main electrodes 1U and 1V and that the polarity of the current waveforms have not been considered.

From the foregoing it will readily be understood that the glow discharge has a time period equal to three times that provided by a single-phase system and therefore the three-phase apparatus triple in power capacity over a single-phase apparatus.

In the arrangement of FIG. 63 the auxiliary electrode is disposed between each pair of adjacent main electrodes for the purpose of controlling thermal energy entering each of the main electrodes. However it is included in the scope of the present invention to replace the auxiliary electrode by a bidirectional triode thyristor serially connected to each main electrode to control thermal energy entering thereinto through the ON-OFF operations of the thyristors.

Figure 66:
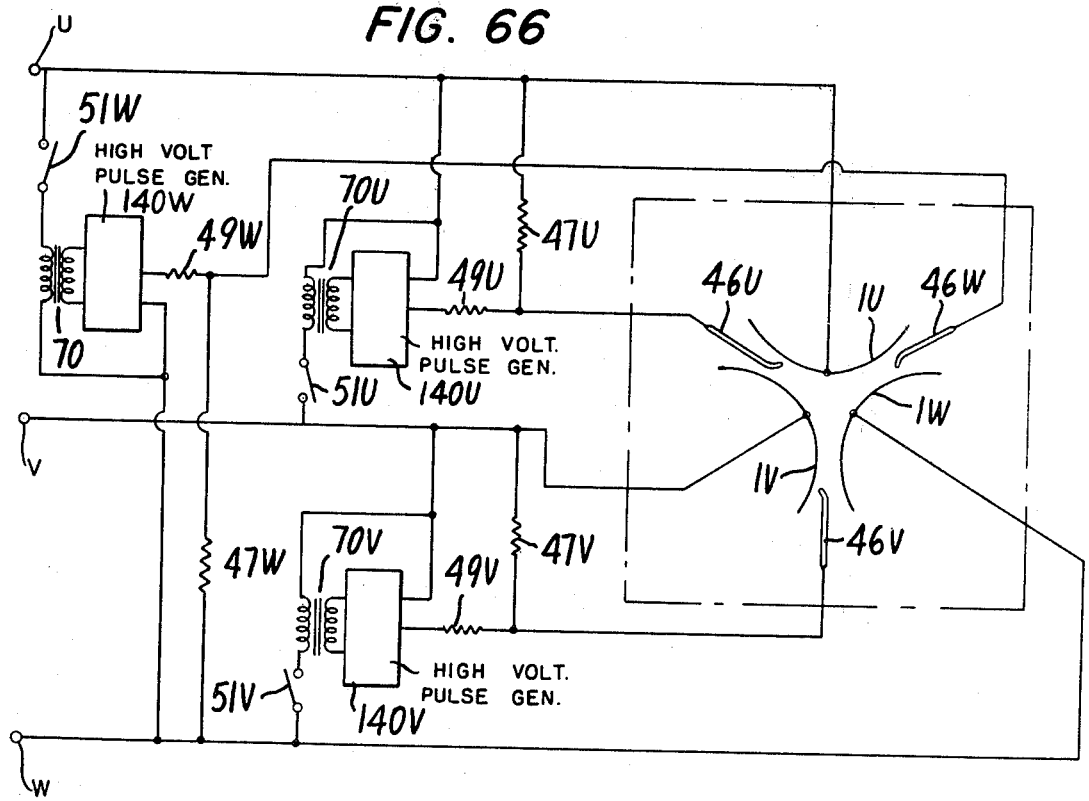
FIG. 66 is a diagram of the detailes of the control circuit shown in FIG. 64.

The arrangement illustrated in FIG. 66 is different from that shown in FIG. 64 only in that in FIG. 66 a combination of a pulse transformer 70U, 70V or 70W and a high voltage pulse generator circuit 140U, 140V or 140W is substituted for each auxiliary source circuit. The combination of the pulse transformer and pulse generator circuit may be identical to the pulse generator circuit 140 shown in FIG. 59.

Also the main and auxiliary electrodes are schematically illustrated in FIG. 66 and may be similar to those shown in FIG. 64 and the resistors 48U, 48V and 48W are omitted.

Figure 67:
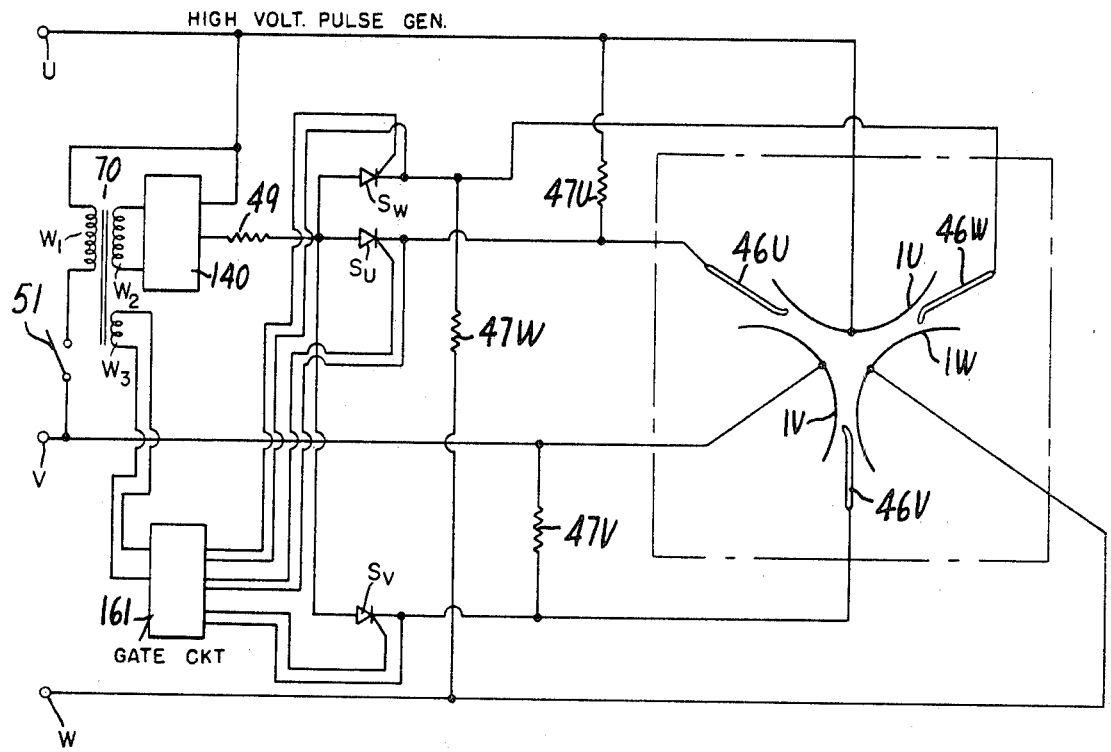
FIG. 67 is a wiring diagram of a modification of the arrangement shown in FIG. 66.

FIG. 67 shows another modification of the arrangement shown in FIG. 66. In the arrangement illustrated, the electrically isolating transformer 70 includes a primary winding $W_1$ connected across the source terminals U and V through the switches 51 and a pair of secondary windings $W_2$ and $W_3$ connected respectively across a high voltage pulse generator circuit 140 such as above described in conjunction with FIG. 59 and a gate circuit 161. The pulse generator circuit 140 includes one output connected to the source terminal U and the other output connected to anode electrodes of thyristors $S_U$, $S_V$ and $S_W$ through the common current limiting resistor 49. The thyristors $S_U$, $S_V$ and $S_W$ include cathode electrodes connected to the auxiliary electrodes 46U, 46V and 46W respectively. The gate circuit 161 is connected to the thyristors $S_U$, $S_V$ and $S_W$ to control the firing thereof.

In other respects, the arrangement is substantially identical to that shown in FIG. 66.

FIGS. 68A–68D illustrate voltage and current waveforms developed at various points in the arrangement shown in FIG. 67. From the comparison of FIG. 68A with FIG. 65 it is seen that voltage and current waveforms shown on the are substantially similar to those illustrated in FIG. 65 and pulse waveforms Po are substituted for the pulse waveforms $P_U$-$P_{Uo}$, $P_V$-$P_{Vo}$ and $P_W$-$P_{Wo}$ shown in FIG. 65. Thus like reference characters have been employed to identify the waveforms corresponding to those illustrated in FIG. 65. Thus the arrangement is substantially identical in operation to that shown in FIG. 66.

As seen in FIG. 68B, the gate circuit 161 applies a gate pulse (see waveform $G_U$) across the gate and cathode electrodes of the thyristor $S_U$ shortly before the high voltage pulse (see waveform Po from the pulse generator 140 is supplied to the auxiliary electrode 46U to bring it in its conducting state and then the pulse Po is supplied to the auxiliary electrode 46U through the resistor 49 and the now conducting thyristor $S_U$. This is true in the case of the remaining pulses P passing through the respective thyristors $S_V$ and $S_W$.

Each of the gate pulses shown at waveforms $G_U$, $G_V$ and $G_W$ in FIGS. 68B–68D should have a pulse width sufficient to ensure that a pilot glow discharge is fired between the associated auxiliary and main electrodes such as shown by 46U and 1U and transits to the principal glow discharge caused between the mating main electrodes such as shown by 1U and 1V. That is, the gate pulse should be at least sustained until a time point is reached where the associated source voltage, for example, the voltage $V_V$ exceeds the glow minimum voltage $V_o$. If the pilot glow discharge causes a current flowing through the associated thyristor to exceed its holding current then the gate pulse may continue until the pilot glow discharge is fired.

The arrangement of FIG. 67 is advantageous over that shown in FIG. 66 in that the resulting circuit is simple, small-sized and inexpensive because of the provision of a single high voltage pulse generator circuit.

In the preferred embodiments of the present invention, the main electrodes and associated components, such as the flow confining tubes, the connecting tubes, the inflow and outflow tube, the blind cover plates shown, for example, in FIG. 24 are formed of metallic material and put in contact with a heated liquid that is electrolytic. This may result in a fear that those metallic components are corroded with the heated liquid and reduced in useful life. Particularly the main electrodes and those tubes directly connected thereto have high probabilities of electrolytic corrosion because the source voltage is directly applied across the main electrodes while the inflow and outflow tubes are connected to ground thereby permitting currents to flow in to the main electrodes and those tubes through the heated electrolytic liquid.

Figure 69:
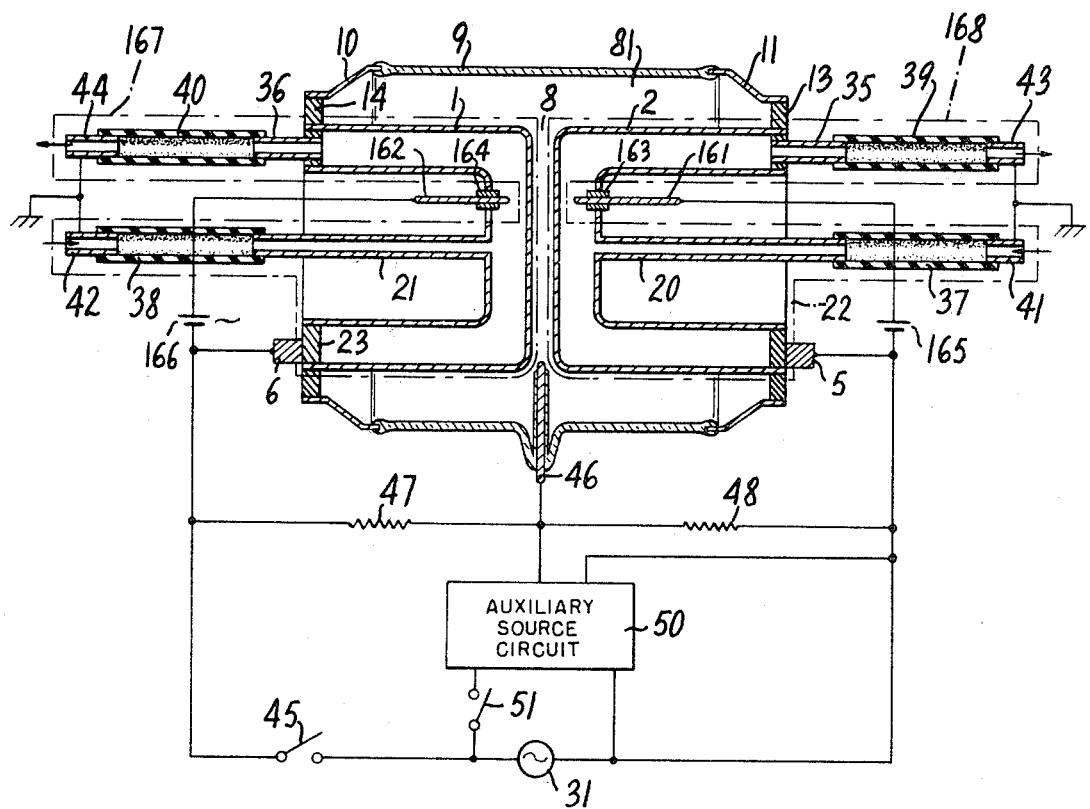
FIG. 69 is a longitudinal sectional view of a modification of the arrangement shown in FIG. 44 and a diagram of a control circuit therefor.

The arrangement shown in FIG. 69 includes corrosion preventing electrodes for preventing metallic components from corroding as above described. In the arrangement illustrated a corrosion preventing electrode 161 or 162 is electrically insulatingly extended and sealed through that wall portion of the flow confining tube 20 or 21 facing the inside of the gap forming surface of the main electrode 2 or 1, that is, each of the opposite surfaces of both main electrodes have an electrically insulating holder 163 or 164 hermetically interposed therebetween. The electrode protrudes into the flow path for the heated liquid. The anticorrosive electrode may be formed of platinum, carbon, triiron tetroxide ($Fe_3O_4$) or the like. The DC source 165 or 166 is connected across the corrosion preventing electrode 161 or 162 and the electrode terminal 5 or 6 thereby to supply to the electrode 161 or 162 a voltage higher than the voltage across the main electrodes. To this end each of the DC source 165 or 166 includes a negative side connected to the associated electrode terminal 5 or 6.

Then the electrode terminals 5 and 6 are connected to a control circuit identical to that shown in FIG. 34.

In other respects, the arrangement is identical to that shown in FIG. 24 except for the provision of the auxiliary electrode 46 but the main electrode 1, in this case, is made of stainless steel or the like, the flow confining tube 21, the blind cover plate 23, the connecting tube 36, the insulating tubes 38 and 40, the inflow tube 42 and the outflow tube 44 form an assembly prevented from corroding and generally designated by the reference numeral 167. Also, the similar components 2, 20, 22, 35, 37, 39, 41 and 43 form another assembly prevented from corroding and generally designated by the reference numeral 168. The main electrode 2 is also made of stainless steel.

The corrosion of the main electrodes and others is called electrolytic corrosion resulting from a flow of current therethrough via a heated electrolytic liquid that is caused from the dissolution of materials forming the main electrode and others into an electrolyte such as water. In the arrangement of FIG. 69, the DC sources 165 and 166 are adapted to apply to the respective corrosion preventing electrodes 161 and 162 voltages higher that the voltage applied across the associated main electrodes. Thus the corrosion preventing electrodes 161 and 162 provide the so-called scapegoat electrodes. That is, the material or materials forming the scapegoat electrode is or are dissolved into an electrolyte such as water thereby to prevent the materials forming the assemblies 167 and 168 from dissolving into the heated liquid resulting in no corrosion occurring.

The DC sources 165 and 166 may be omitted by forming the corrosion preventing electrode of a metallic material lower in corrosion potential and more easily ionized than the material of the main electrode. For example, with the main electrodes 1 and 2 formed of stainless steel, magnesium, zinc, aluminum, etc. are optimum for forming the corrosion preventing electrode.

Also the DC source may be replaced by any suitable source for supplying a DC voltage.

Figure 70:
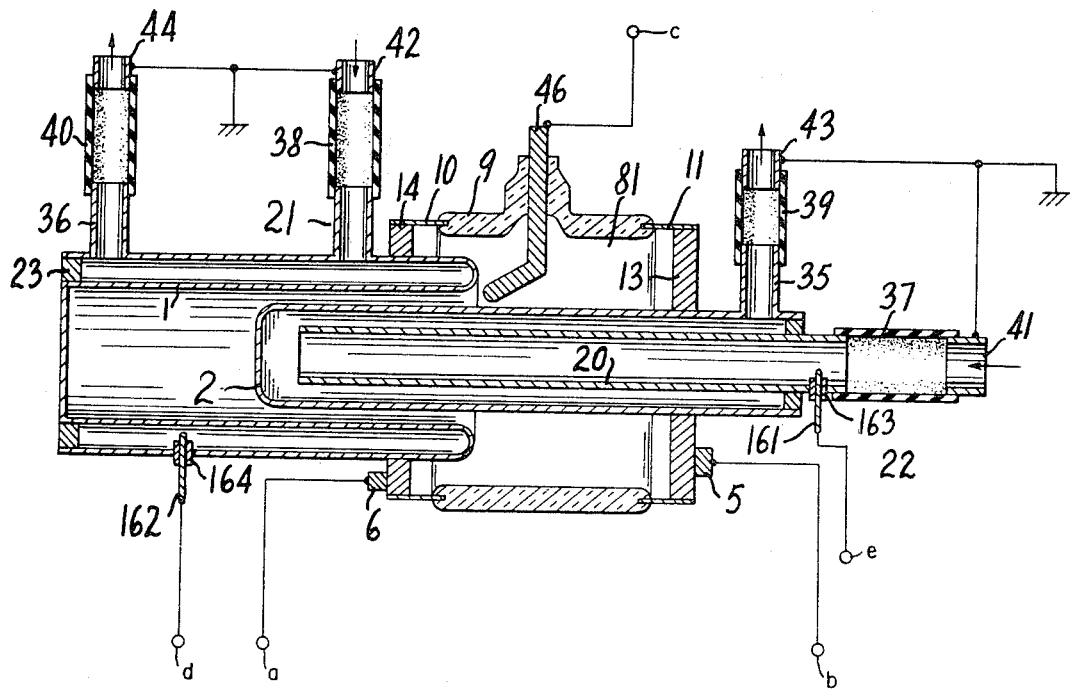
FIG. 70 is a longitudinal sectional view of a modification of the arrangement shown in FIG. 69.

FIG. 70 shows corrosion preventing electrodes provided on the arrangement shown in FIG. 39. In FIG. 70 the corrosion preventing electrodes 161 and 162 are provided on the exposed portion of the feed water tube 20 disposed within the main electrode 2 and on the outer wall of the main electrode 1 respectively in the same manner as above described in conjunction with FIG. 69.

Then the corrosion preventing electrodes 161 and 162 are connected to terminals d and e which are subsequently connected, for example, to the DC sources 165 and 166 (see FIG. 69) respectively. Also terminals a and b connected to the electrode terminals 5 and 6 respectively are connected across the AC source 31 shown in FIG. 69 while a terminal C connected to the auxiliary electrode 46 is connected to the auxiliary source circuit 50 also shown in FIG. 69.

FIG. 71 shows anticorrosive electrodes provided on the arrangement illustrated in FIG. 64. As shown, an anticorrosive electrode 161U, 161V or 161W is electrically insulatingly extended and sealed through the feed water tube 42U, 42V or 42W operatively coupled with each main electrode 1U, 1V or 1W with an electrically insulating holder 164U, 164V or 164W interposed therebetween.

FIG. 72 shows a separate modification of the present invention wherein a temperature of a heated liquid is measured. In the arrangement illustrated, a temperature sensor 169 such as a thermistor is electrically insulatingly extended and sealed through that portion of a flow confining tube 20 facing the peripheral wall of the main electrode 2 with an electrically insulating holder 170 interposed therebetween.

The temperature sensor 169 may be entirely covered with a electrically insulating material in accordance with the particular electric field established in the vicinity thereof.

In other respects, the arrangement is substantially identical to that shown in FIG. 24 except for the provision of the auxiliary electrode 46.

The electrode terminals 5 and 6 and the auxiliary electrode 46 are connected to a control circuit identical to that shown in FIG. 57 except for the omission of the zero volt firing circuit 90. The temperature sensor 169 includes an output connected to the trigger circuit 99 for the thyristor 98.

In operation the temperature sensor 169 senses the temperature of the heated liquid and feeds a measured temperature signal to the trigger circuit 99. More specifically, with the temperature sensor 169 formed of a thermistor or a temperature measuring resistor, a resistance thereof is changed with a temperature so that a signal representative of a change in resistance is applied to the trigger circuit 99. Alternatively, with the temperature sensor 169 formed of a thermocouple, it responds to the temperature of the heated liquid to change in thermoelectromotive force thereof. This change in thermoelectromotive force is signalled to the trigger circuit 99.

If it is desired to control the heated liquid to a predetermined fixed temperature then the actual temperature measured by the temperature sensor 169 is compared with an output therefrom at a predetermined temperature as the reference. With the actual temperature is higher than the predetermined temperature, the trigger circuit 99 applies no trigger signal to the thyristor 98. Otherwise, the trigger circuit 99 delivers the trigger signal to the thyristor 98. Then the thyristor 98 is correspondingly turned on and off to fire and extinguish a pilot glow discharge thereby to effect the ON-OFF control of a glow discharge between the main electrodes 1 and 2.

Under these circumstances, some time goes until heat from either of the main electrodes 1 and 2 acting as the heating surface is transferred to the heated liquid. This results in a time delay with which the temperature of the heated liquid is controlled. Therefore, the temperature sensor 169 has preferably a sensor end located as near to the heating surface of the associated main electrode as possible.

With the temperature of the heated temperature controlled according to a predetermined program, the function of effecting such control may be incorporated into the trigger circuit 99 and the thyristor 98 is operated in the ON-OFF control mode and in accordance with the output signal from the temperature sensor 169.

The temperature sensor 169 may be used with the control of the glow discharge effected by a control such as a thyristor connected in series to the particular glow discharge heating apparatus in a circuit with an electric source circuit for the apparatus.

Figure 73:
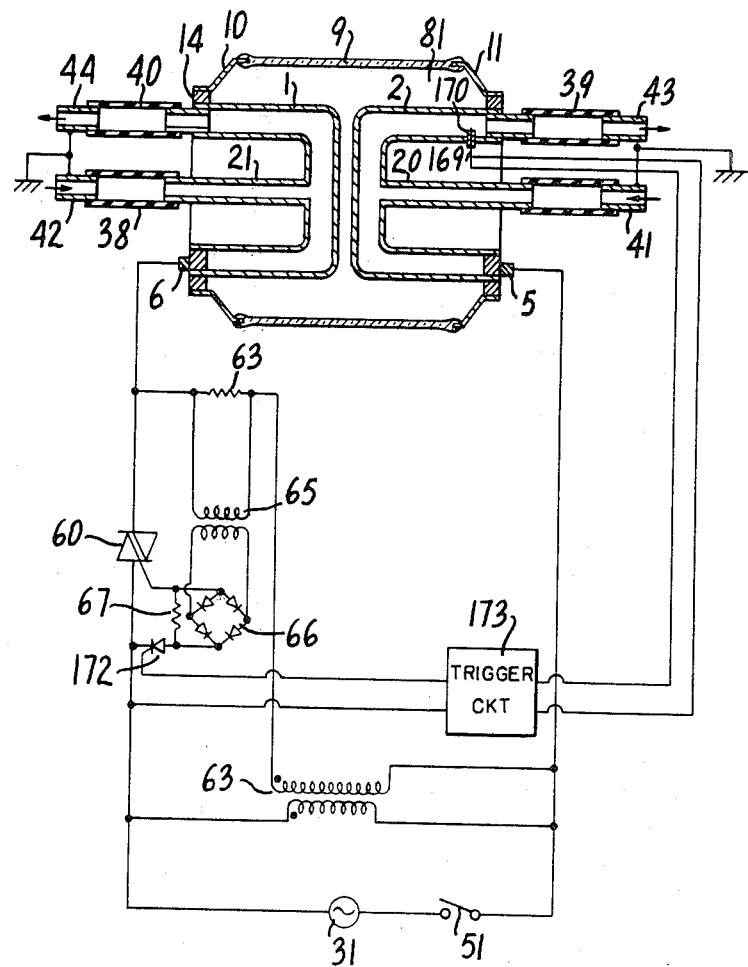
FIG. 73 is a longitudinal sectional view of another modification of the arrangement shown in FIG. 69.

The arrangement illustrated in FIG. 73 is different from that shown in FIG. 72 only in that in FIG. 73 a bidirectional triode thyristor or a Triac is provided to control the glow discharge as in the arrangement of FIG. 48. In FIG. 73 a thyristor 172 is connected at the anode electrode to one of the DC output terminals of the rectifier bridge 66 and at the cathode electrode to the Triac 60. The resistor 67 is connected to the Triac 60 at the gate electrode but not to one main electrode thereof. Then the thyristor 172 has the cathode and gate electrodes connected across a trigger circuit 173 subsequently connected to the temperature sensor 172.

In other respects, the control circuit is substantially identical to that shown in FIG. 48. However the dot convention is used to identify the polarity of the instantaneous voltage across the associated transformer winding.

The electrically isolating transformer 65 is operative to adapt a potential difference developed across the resistor 64 to a voltage required for the Triac 60 to be fired.

With the switch 51 put in its closed position, the step-up transformer 70 applies a high AC voltage across the electrodes 1 and 2 resulting in the discharge breakdown occurring therebetween. This cause a potential difference across the current limiting resistor 64 whereby a potential difference appears across the resistor 67 through the transformer 65 and the rectifier bridge 66. At that time, the trigger circuit 173 is actuated to put the thyristor 172 in its ON state to cause a trigger signal to be applied to the gate electrode of the Triac 60 to turn it on. Therefore the AC source across the source 31 is supplied across the main electrodes 1 and 2 through the now conducting thyristor 60 to cause a glow discharge therebetween.

Under these circumstances, the temperature sensor 169 senses a temperature of a heated liquid involved and feeds a signal for the sensed temperature to the trigger circuit to control the glow discharge between the electrodes 1 and 2.

From the foregoing it is seen that in the arrangements shown in FIGS. 72 and 73 the temperature of the heated liquid sensed by the temperature sensor is fed to the auxiliary source circuit for controlling the glow discharge caused between the main electrodes resulting in the easy, reliable temperature control of the heated liquid.

While the present invention has been illustrated and described in conjunction with various preferred embodiments thereof it is to be understood that numerous changes and modifications may be resorted to without departing from the spirit and scope of the present invention. For example, the embodiments of the present invention illustrated and described in conjunction with the single-phase source may readily be modified to be driven by the three-phase source. Similarly, the embodiments illustrated and described in conjunction with the three-phase source may readily be suited for use with polyphase sources having m phases where m is greater than three (3). In the latter case, an m-phase AC voltages is applied to m main electrodes to cause successively glow discharges between the pairs thereof. The resulting power capacity is equal to m times that provided by a single-phase apparatus leading to inexpensive structures.

What we claim is:

1. An electric shock preventing device for a glow discharge heating apparatus for heating a heated liquid with the generation of heat attendant upon a glow discharge caused between a pair of discharge electrodes through which a heated liquid such as water flows, characterized in that an electrically insulating pipe is provided on each of an inflow port and an outflow port for the heated liquid of one of said electrodes, a metallic pipe is connected to an extremity of each electrically insulating pipe remote from said electrodes, and the metallic pipes are connected to ground.

2. A glow discharge heating apparatus as claimed in claim 1 wherein said discharge electrodes are provided on portions thereof opposite to each other with concave and convex areas.

3. A glow discharge heating apparatus as claimed in claim 2 wherein said concave and convex area is arranged into a plurality of annuli, said annuli being in the form of concentric circles.

4. A glow discharge heating apparatus as claimed in claim 2 wherein said concave and convex area is in the form of straight line running substantially in parallel relationship.

5. A glow discharge heating apparatus as claimed in claim 2 wherein said concave and convex area includes a plurality of depressions extending into said discharge electrode.

6. A glow discharge heating apparatus as claimed in claim 1 wherein a tubular member is disposed in each of said discharge electrodes to abut against an internal wall surface of each of said discharge electrodes and said liquid flows through said tubular member.

7. A glow discharge heating apparatus as claimed in claim 6 wherein said tubular member comprises a seamless copper tube brazed to the internal wall surface of the associated discharge electrodes.

8. A glow discharge heating apparatus as claimed in claim 1, wherein a heating space is formed within said discharge electrodes to cause said liquid to flow through said heating space while contacting directly the internal surface of each of said discharge electrodes thereby to be heated by said discharge electrodes, and wherein said heating space includes a normally closed exhaust port capable of being opened to permit the liquid to be exhausted in said heating space.

9. A glow discharge heating apparatus as claimed in claim 1, wherein a heating space is formed within said discharge electrodes to cause said liquid to flow through said heating space while contacting directly the internal surface of each of said discharge electrodes thereby to be heated by said discharge electrodes, and wherein a corrosion preventing electrode is disposed on each of said discharge electrodes to be electrically insulated from the associated discharge electrode and contacted by said liquid.

10. A glow discharge heating apparatus as claimed in claim 9 wherein said corrosion preventing electrode has applied thereto a voltage higher than a voltage applied across said discharge electrodes.

11. A glow discharge heating apparatus as claimed in claim 9 wherein said corrosion preventing electrode is formed of a metallic material less in corrosion potential and more easily ionized than a metallic material forming said discharge electrodes.

12. A glow discharge heating apparatus, comprising:
a pair of metallic discharge electrodes electrically biased in use to develop a glow discharge therebetween, one of said discharge electrodes operating as a cathode and defining a fluid conduit having an inlet and an outlet for flowing a fluid therethrough and for heating the fluid when said pair of discharge electrodes are electrically biased to develop a glow discharge therebetween;
a pair of electrically insulative fluid conduit sections each connected to a respective one of the cathode discharge electrode inlet and outlet for defining electrically insulative extensions of the fluid conduit through said cathode discharge electrode;
metallic fluid conduit sections connected to respective end portions of said electrically insulative fluid conduit sections remote from said cathode discharge electrode for defining electrically conductive extension of the fluid conduit through said cathode electrode and said electrically insulative fluid conduit sections;
means for grounding said metallic fluid conduit sections to prevent electrical shock upon contact with said metallic fluid conduit sections; and
wherein said pair of electrically insulative fluid conduit sections are sufficiently long to reduce a leakage current from said discharge electrodes through said electrically insulative fluid conduit sections to ground to a value less than a certain predetermined current value.

13. A glow discharge heating apparatus according to claim 9, wherein said pair of metallic discharge electrodes each comprise a fluid conduit to permit fluid heating by both of said pair of metallic discharge electrodes when said pair of metallic discharge electrodes are biased by an A.C. voltage sufficient to develop a glow discharge.

14. A glow discharge heating apparatus according to claim 13, wherein respective portions of said pair of discharge electrodes face each other and define a gap therebetween wherein a glow discharge is formed, in use; and wherein the respective facing portions of said pair of discharge electrodes are corrugated to increase the surface areas of the respective facing portions of said pair of discharge electrodes.

15. A glow discharge heating apparatus according to claim 12, 13 or 14, further comprising: a respective corrosion preventing electrode disposed extending into each discharge electrode defining a fluid conduit for contacting fluid therein; and insulating means electrically insulating each corrosion preventing electrode from the respective discharge electrode into which it extends.

* * * * *